US009887329B2

(12) United States Patent
Yamada

(10) Patent No.: US 9,887,329 B2
(45) Date of Patent: Feb. 6, 2018

(54) LIGHT EMITTING DEVICE AND METHOD FOR MANUFACTURING LIGHT EMITTING DEVICE

(71) Applicant: Nichia Corporation, Tokushima (JP)

(72) Inventor: Motokazu Yamada, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 14/884,718

(22) Filed: Oct. 15, 2015

(65) Prior Publication Data
US 2016/0035952 A1 Feb. 4, 2016

Related U.S. Application Data

(63) Continuation of application No. 13/577,491, filed as application No. PCT/JP2011/051742 on Jan. 28, 2011, now Pat. No. 9,196,805.

(30) Foreign Application Priority Data

Feb. 9, 2010 (JP) .................................. 2010-026607
Mar. 1, 2010 (JP) .................................. 2010-044771
(Continued)

(51) Int. Cl.
H01L 33/60 (2010.01)
H01L 23/00 (2006.01)
(Continued)

(52) U.S. Cl.
CPC ............. H01L 33/60 (2013.01); H01L 24/48 (2013.01); H01L 33/005 (2013.01);
(Continued)

(58) Field of Classification Search
CPC .................................. H01L 33/50; H01L 33/60
(Continued)

(56) References Cited

U.S. PATENT DOCUMENTS 6,051,778 A 4/2000 Ichinose et al.
7,445,354 B2 11/2008 Aoki et al.
(Continued)

FOREIGN PATENT DOCUMENTS

CN 1185040 A 6/1998
EP 1 603 170 A1 12/2005
(Continued)

OTHER PUBLICATIONS

Extended European Search Report issued in Application No. 11742130.5 dated Mar. 18, 2015.
(Continued)

Primary Examiner — Marc Armand
Assistant Examiner — Warren H Kilpatrick
(74) Attorney, Agent, or Firm — Foley & Lardner LLP

(57) ABSTRACT

A light emitting device (100) includes a base member (101), electrically conductive members (102a, 102b) disposed on the base member (101), a light emitting element (104) mounted on the electrically conductive members (102a, 102b), an insulating filler (114) covering at least a portion of surfaces of the electrically conductive members (102a, 102b) where the light emitting element (104) is not mounted, and a light transmissive member (108) covering the light emitting element (104).

16 Claims, 28 Drawing Sheets

(30) Foreign Application Priority Data

Jul. 14, 2010 (JP) .................................. 2010-159434
Aug. 23, 2010 (JP) .................................. 2010-186504

(51) Int. Cl.

| | | |
|---|---|---|
| *H01L 33/62* | (2010.01) | |
| *H01L 33/00* | (2010.01) | |
| *H01L 33/50* | (2010.01) | |
| *H01L 25/16* | (2006.01) | |
| *H01L 33/52* | (2010.01) | |
| *H01L 25/075* | (2006.01) | |
| *H01L 33/48* | (2010.01) | |
| *H01L 33/54* | (2010.01) | |

(52) U.S. Cl.
CPC ............ *H01L 33/483* (2013.01); *H01L 33/50* (2013.01); *H01L 33/62* (2013.01); *H01L 24/45* (2013.01); *H01L 25/0753* (2013.01); *H01L 25/167* (2013.01); *H01L 33/486* (2013.01); *H01L 33/52* (2013.01); *H01L 33/54* (2013.01); *H01L 2224/45015* (2013.01); *H01L 2224/45124* (2013.01); *H01L 2224/45144* (2013.01); *H01L 2224/45147* (2013.01); *H01L 2224/45169* (2013.01); *H01L 2224/48137* (2013.01); *H01L 2224/48139* (2013.01); *H01L 2224/48227* (2013.01); *H01L 2224/48228* (2013.01); *H01L 2224/49175* (2013.01); *H01L 2224/73204* (2013.01); *H01L 2224/73265* (2013.01); *H01L 2224/83192* (2013.01); *H01L 2224/8592* (2013.01); *H01L 2224/92247* (2013.01); *H01L 2924/00014* (2013.01); *H01L 2924/0103* (2013.01); *H01L 2924/014* (2013.01); *H01L 2924/01004* (2013.01); *H01L 2924/01005* (2013.01); *H01L 2924/0105* (2013.01); *H01L 2924/01006* (2013.01); *H01L 2924/01012* (2013.01); *H01L 2924/01013* (2013.01); *H01L 2924/01014* (2013.01); *H01L 2924/01024* (2013.01); *H01L 2924/01025* (2013.01); *H01L 2924/01028* (2013.01); *H01L 2924/01029* (2013.01); *H01L 2924/01032* (2013.01); *H01L 2924/01033* (2013.01); *H01L 2924/01038* (2013.01); *H01L 2924/01042* (2013.01); *H01L 2924/01045* (2013.01); *H01L 2924/01047* (2013.01); *H01L 2924/01058* (2013.01); *H01L 2924/01063* (2013.01); *H01L 2924/01065* (2013.01); *H01L 2924/01074* (2013.01); *H01L 2924/01077* (2013.01); *H01L 2924/01078* (2013.01); *H01L 2924/01079* (2013.01); *H01L 2924/01082* (2013.01); *H01L 2924/01322* (2013.01); *H01L 2924/09701* (2013.01); *H01L 2924/12035* (2013.01); *H01L 2924/12041* (2013.01); *H01L 2924/12042* (2013.01); *H01L 2924/12044* (2013.01); *H01L 2924/181* (2013.01); *H01L 2924/3025* (2013.01); *H01L 2933/005* (2013.01)

(58) Field of Classification Search
USPC ......................................................... 257/98
See application file for complete search history.

(56) References Cited

U.S. PATENT DOCUMENTS

| | | |
|---|---|---|
| 9,196,805 B2 | 11/2015 | Yamada et al. |
| 2004/0121502 A1 | 6/2004 | Summers et al. |
| 2005/0023550 A1 | 2/2005 | Eliashevich et al. |
| 2005/0045897 A1* | 3/2005 | Chou .................. H01L 25/0753 257/98 |
| 2005/0156185 A1 | 7/2005 | Kim et al. |
| 2006/0261364 A1 | 11/2006 | Suehiro et al. |
| 2006/0267040 A1 | 11/2006 | Baek et al. |
| 2008/0054287 A1 | 3/2008 | Oshio et al. |
| 2008/0108159 A1 | 5/2008 | Ajiki et al. |
| 2009/0026480 A1 | 1/2009 | Hayashi et al. |
| 2010/0059782 A1 | 3/2010 | Fujitomo et al. |
| 2010/0320479 A1 | 12/2010 | Minato et al. |
| 2012/0061709 A1* | 3/2012 | Pachler .................. H01L 33/60 257/98 |
| 2015/0287896 A1 | 10/2015 | Minato et al. |

FOREIGN PATENT DOCUMENTS

| | | |
|---|---|---|
| EP | 1 768 193 A2 | 3/2007 |
| JP | 10-215001 A | 8/1998 |
| JP | 11-168235 A | 6/1999 |
| JP | 2000-150969 A | 5/2000 |
| JP | 2004-158843 A | 6/2004 |
| JP | 2004-172160 A | 6/2004 |
| JP | 2005-051255 A | 2/2005 |
| JP | 2005-150484 A | 6/2005 |
| JP | 2005-210051 A | 8/2005 |
| JP | 2006-156603 A | 6/2006 |
| JP | 2006-351964 A | 12/2006 |
| JP | 2007-019096 A | 1/2007 |
| JP | 2007-035748 A | 2/2007 |
| JP | 2007-109948 A | 4/2007 |
| JP | 2007-134378 A | 5/2007 |
| JP | 2007-173408 A | 7/2007 |
| JP | 2007-281260 A | 10/2007 |
| JP | 2008-072013 A | 3/2008 |
| JP | 2008-085361 A | 4/2008 |
| JP | 2008-112959 A | 5/2008 |
| JP | 2008-164528 A | 7/2008 |
| JP | 2008-300580 A | 12/2008 |
| JP | 2009-055006 A | 3/2009 |
| JP | 2009-076666 A | 4/2009 |
| JP | 2009-099926 A | 5/2009 |
| JP | 2009-130237 A | 6/2009 |
| JP | 2009-135485 A | 6/2009 |
| JP | 2009-212134 A | 9/2009 |
| JP | 2010-016292 A | 1/2010 |
| JP | 2010-027937 A | 2/2010 |
| JP | 2010-238846 A | 10/2010 |
| KR | 10-2007-0063976 A | 6/2007 |
| TW | 200824154 A | 6/2008 |
| TW | 200947755 A | 11/2009 |
| WO | WO-2009/069671 A1 | 6/2009 |

OTHER PUBLICATIONS

International Preliminary Report on Patentability for PCT/JP2011/051742 dated Apr. 19, 2011.
International Search Report for PCT/JP2011/051742 dated Apr. 19, 2011.
Office Action issued in Japanese Application No. 2011-553802 dated May 12, 2015.

* cited by examiner

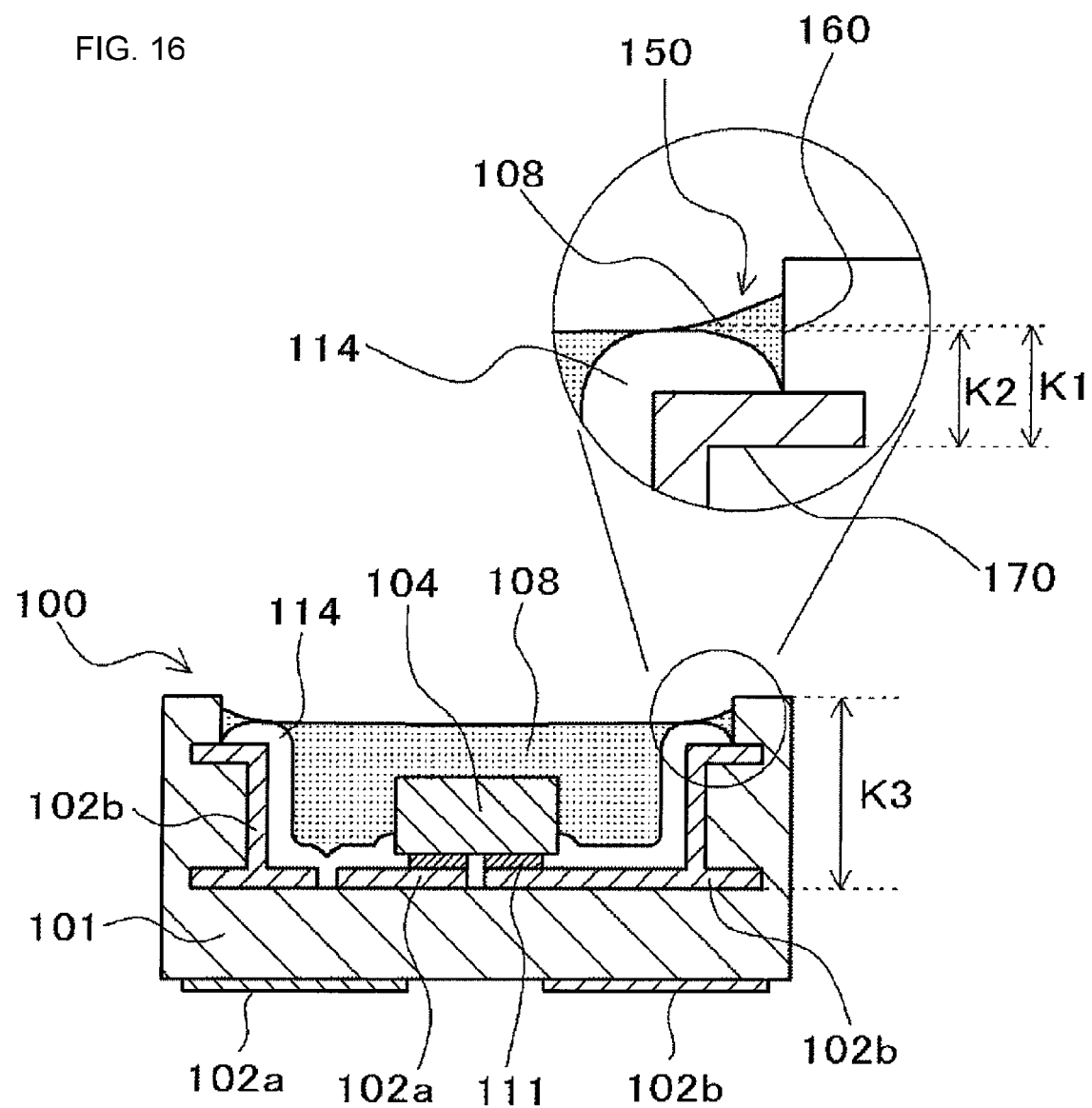

LIGHT EMITTING DEVICE AND METHOD FOR MANUFACTURING LIGHT EMITTING DEVICE

CROSS-REFERENCE TO RELATED APPLICATIONS

This application is a continuation of U.S. patent application Ser. No. 13/577,491, filed Oct. 29, 2012, now U.S. Pat. No. 9,196,805, which is a National Stage Entry of PCT/JP2011/051742, filed Jan. 28, 2011, which claims priority from Japanese Patent Application No. 2010-026607, filed Feb. 9, 2010; from Japanese Patent Application No. 2010-044771, filed Mar. 1, 2010; from Japanese Patent Application No. 2010-159434, filed Jul. 14, 2010; and from Japanese Patent Application No. 2010-186504, filed Aug. 23, 2010. The contents of each of the above-referenced applications are hereby incorporated by reference in their entireties.

BACKGROUND OF THE INVENTION

Technical Field

The present invention relates to a light emitting device applicable to purposes such as an indicator, a lighting apparatus, a display, a backlight light source for liquid crystal display, and a method of manufacturing the light emitting device.

Description of Background Art

In recent years, various semiconductor devices have been proposed and are put in practical use, and the demand for high performance is ever increasing. In particular, electric components are required to have high reliability to maintain performance for a long period of time, in other words, to maintain stable operation for a long period of time, even under severe environment. The same applies for light emitting diodes (LEDs) and other light emitting devices. Requirements for higher performance in the area of general lighting, in-vehicle lighting, and the like, is growing daily, and further higher output (higher luminance) and higher reliability are demanded. A further demand is to supply such a device at a low price while fulfilling those requirements.

In order to achieve higher output power, it is efficient to improve optical output efficiency of the light emitting element (semiconductor light emitting element) which is to be used. For a method to improve the optical output power of the light emitting element, for example, a method using a small chip dice (light emitting element) is employed (for example, see Patent Literature 1). Particularly, in the case where a gallium nitride-based LED is used for the light emitting element, the light emitted from the light emitting element propagates in the semiconductor layer, and therefore is absorbed when it is reflected at the electrode or the like (for example, see Patent Literature 2). For this reason, the dice is made as a small chip to allow the emitted light to be extracted to outside. Thus, absorbtion loss of light can be decreased. In the case where a small chip dice is used, a limited amount of electric current is allowed to flow through. Thus, employing a multi-dice structure having a plurality of small chips enables to obtain a desired optical output efficiently.

In addition, for a structure of the light emitting element, a flip-chip type may be employed in which the electrode surface to be electrically connected to an external electrode is arranged downward (hereinafter may be referred to as a face-down element or FD element). (see Patent Literatures 1, 3). This structure does not have an electrode and/or wire etc., on the principal light extracting surface of the light emitted from the light emitting element. Thus, it is said to be able to further improve the optical output efficiency (extracting efficiency).

Also, in order to improve the optical output power of the light emitting element, a silver plating which has a high reflectance is typically applied on the electrically conductive member used for the base member. On the other hand, as the material of the base member, in the fields of general lighting, in-vehicle lighting, and back light light source, ceramic materials which are resistant to deterioration under high temperature and high optical density are typically used (for example, see Patent Literature 1).

Futher, gold (Au) is typically used as a conductive wire used for a protective element or a face-up element (hereinafter may be referred to as a FU element) having an electrode surface arranged over the light emitting element. Au wire is very soft and a ball bonding technique can be used, so that very thin wires of ·100 μm or less, for example (diameter) of several tens of micrometers can be used. Thus, in the case where a plurality of light emitting elements are mounted, a plurality of conductive wires can be used.

Typically, a light emitting device has a base member (a package, i.e. a mount substrate having a wiring pattern etc.) on which electrical components such as a light emitting element and a protective element are mounted, and electrically conductive members which supply electric current (electric power) to such electric components. The light emitting device further has a sealing member protecting the electric components from external environment. However, loss due to absorption of light (absorption loss of light) occurs depending on the materials of the base member, electrically conductive members, sealing member, etc. Particularly, the surface area of the electrically conductive members is relatively large, absorption loss of light by the electrically conductive members may reduce light extraction efficiency. For higher output power, the light extraction efficiency to be improved, and for this, improvement in the optical output efficiency of the light emitting element (semiconductor light emitting element), and also reduction of absorption loss of light by the materials of base member (including the package), electrically conductive members, and sealing member are effective.

In order to improve the light extracting efficiency, for example, application of a plating of a metal member having high reflectance on the inner surface of the package to suppress absorption of light by the base member and to efficiently extract light to the outside is proposed (see Patent Literature 4).

Disposing of a member having high reflectance in the light emitting device is viewed as a way to suppress optical absorption by the members used in the light emitting device, but among those materials having high reflectance (such as silver), some materials are subjected to sulfuration or halogenation and may cause longterm reliability concerns. That is, there has been a problem in which, discoloration due to sulfuration or halogenation of the material by the sulfur component etc., contained in the atmosphere causes reduction of the reflectance of the material, which results in reduction of the light extracting efficiency.

In order to solve such a problem, Patent Literature 5 discloses forming of titanium dioxide ($TiO_2$) etc., as a protective film on the surface of a metal reflection film by using sputtering or vapor deposition to improve its gass barrier property. Also, Patent Literature 6 discloses a reduction of the problems caused by heat, by a reflector free of discoloration formed by covering the reflecting surface of the reflector with a high-reflecting resin layer made of a powder material having high reflectance mixed with a resin, and by employing a material having excellent heat dissipating property for the reflector.

Also, known is a light emitting device in which, other than that as described above, a light emitting element is mounted in a flip-chip mounting manner as described in Patent Literature 7. The light emitting element includes a transparent substrate such as sapphire, and a semiconductor layer stacked thereon. In the light emitting element, each electrode is bonded on the lead pattern through a respective conductive bump. With this arrangement, the transparent substrate side of the light emitting element can be utilized as the light extracting side. Further, a light emitting device in which a lower portion and a side surface are covered with a resin containing a filler (Patent Literatures 8 to 11), and a technique of electrodeposition of titanium dioxide on the light emitting element (Patent Literature 12).

Patent Literature 1: JP 2009-135485A
Patent Literature 2: JP 2008-112959A
Patent Literature 3: JP 2005-150484A
Patent Literature 4: JP 2006-156603A
Patent Literature 5: JP 2006-351964A
Patent Literature 6: JP 2007-281260A
Patent Literature 7: JP 2005-210051A
Patent Literature 8: JP 2004-172160A
Patent Literature 9: JP 2007-109948A
Patent Literature 10: JP 2007-19096A
Patent Literature 11: JP 2009-130237A
Patent Literature 12: JP 2004-158843A

DISCLOSURE OF INVENTION

Problems to be Solved by the Invention

However, these conventional technologies have problems with regard to light extraction in light emitting devices as described below. Even the surface of the metal reflecting film is coated with titanium dioxide ($TiO_2$) etc., absorption loss of light by such as the base member and the conductive portion occurs depending on the location of the coating, and sufficient improvement in the light extracting efficiency cannot be obtained.

In order to secure the insulation between the positive electrode member and the negative electrode member, an insulating region (hereinafter may be referred to as a slit (groove) in conductive portion) of, for example about several hundred microns is needed to be arranged in the light emitting element mounting surface of the base member and the bottom surface and its adjacent portion of the dice of FD element, which results in exposure of the base member at the insulating region. Leakage of light occurs at the exposed portion (wet portion) and the direction of the leaking light is opposite to the direction of extracting light, resulting in optical loss.

In the case where a material such as Au having a high optical absorption property in the blue region is used for the wires to electrically connect the protective element and the light emitting element, a problem may also arise due to the close proximity of the wires to the light emitting element, absorption loss of light occurs which results in reduction of the light extracting efficiency. Further, in Patent Literatures 4 to 6, there is no description of the solution to those problems. Also described is that the highly-reflective resin layer proposed in Patent Literature 6 is a mixture of a resin and a powder material, so that there is a problem in moldability, and there is a tendency of a decrease in moldability particularly in the case where a great amount of the highly-reflective powder material is contained (paragraph [0022] etc).

In Patent Literature 7, light irradiated from the light emitting element is absorbed by the conductive bumps and leads. Accordingly, reduction of absorption of light by the conductive bump and leads to improve the light extracting efficiency is demanded. In the field of lighting, the demand for uniform color distribution of the light is increasing.

In the case of applying a reflective member on the light emitting element, in the transparent substrate and the semiconductor layer which constitute the light emitting element, if all of the side surfaces and the upper surface of the transparent substrate are covered with the light-reflective member such as $TiO_2$, the light extraction efficiency decreases due to the absorption of light by the reflective member. Also, if a resin is applied to coat the electrically conductive member etc., the resin rises to the side surfaces of the transparent substrate and eventually all of the side surfaces of the transparent substrate are covered with the resin. When the viscosity of the resin is adjusted so as not to rise up, the content of the light-reflective material is needed to be increased for a higher viscosity, so that it makes difficult to cover the entire surfaces of the electrically conductive members. Further, in the case where the reflective member is disposed so as not to cover the side surfaces of the semiconductor layer and in the case where the light transmissive member includes a fluorescent material, the fluorescent material settles and the semiconductor is berried in the fluorescent material. Accordingly, the ratio of excitation and emission at the lower portion of the fluorescent material layer increases, so that the light is absorbed by the fluorescent material while travelling through the thick layer of the fluorescent material, resulting in a decrease in the light extracting efficiency.

The present invention is devised to solve the problems as described above, and is aimed to provide a light emitting device capable of efficiently extracting light from the light emitting element to outside, and a method of manufacturing the same. Also, the present invention is aimed to provide a light emitting device with high reliability and a method of manufacturing the same, in which the electrically conductive members etc., over the base member is covered with a reflective member, for example, an insulating filler, which enables to suppress the deterioration of the members which constitute the light emitting device and the absorption of light by such members, and a portion of the side surfaces and the upper surface of the transparent substrate of the light emitting element are exposed. Thus, light from the light emitting element can be extracted to outside efficiently.

Means to Solve the Problems

In order to solve the above problems, a light emitting device according to the present invention includes a light emitting element having a semiconductor layer and a transparent substrate, a reflective member exposing at least a part of side surfaces and a top surface of the transparent substrate and covering side surfaces of the semiconductor layer; and a light transmissive member covering a portion of the transparent substrate exposed from the reflective member.

With such a construction, at least a portion of the side surfaces and the upper surface of the transparent substrate are exposed, which enables to suppress the absorption of light by the reflective member and thus enables to prevent the reduction in the light extracting efficiency.

A light emitting device according to the present invention may further have a base member and electrically conductive members disposed on the base member. The light emitting element is mounted on the electrically conductive members, and at the surface of the electrically conductive members, at least a portion which does not have the light emitting element mounted thereon is covered with an insulating filler which is the reflective member, and the light transmissive member covers the light emitting element. In the specification, the term "a portion where no light emitting element is mounted" refers to a portion outside of the outline of light emitting element in the view from the top surface side of the light emitting device. That is, in the view from the top surface side, the portion behind the light emitting element is not necessarily covered with the insulating filler. But, the portion behind the light emitting element may be covered with the insulating filler.

According to the construction as described above, the surface of the electrically conductive members formed on the base member are covered with the insulating filler. Thus, the reflection efficiency of light at the electrically conductive member is improved. Also, the surface of the electrically conductive members are covered with the insulating filler. Therefore, a specific member having a high reflectance is not necessarily used for the electrically conductive member and a stable member resistant to deterioration and corrosion can be employed. In addition, the surface of the electrically conductive members are covered with the filler, so that even a portion of the electrically conductive members become deteriorated or corroded, reduction of the light extracting efficiency of the light emitting device can be prevented.

A light emitting device according to the present invention may have a construction in which, the base member has a recess, the electrically conductive members are disposed on the bottom surface and the side surface of the recess, and the light emitting element is mounted on the bottom surface of the recess. In addition, at the side surfaces of the recess at a portion abutting on the top edge surface of the recess preferably have a region where an electrically conductive member is not formed, and the side surfaces of the recess at a portion abutting on the bottom surface of the recess preferably have a region where an electrically conductive member is not formed.

In addition, it is preferable that at the top edge surface side of the recess, the side surfaces of the recess have a step, and a side surface of the step has a region where an electrically conductive member is not formed. Further, the shortest distance between a highest surface of bottom surfaces of the step to a surface of the light transmissive member is preferably ⅓ or less with respect to the height of the recess, and the surface of the light transmissive member preferably has a recessed shape. In addition, the filler is preferably applied to a thickness of 5 μm or greater.

In the light emitting device, the reflectance of the filler is preferably 50% or greater to light of an emission wavelength. With the construction as described above, the light extracting efficiency of the light emitting device is improved.

It is preferable that in the light emitting device, the filler covers the surface of the light emitting element, and the surface area of a single light emitting element which is covered with the filler is less than 50% of the entire surface area of the single light emitting element.

With the construction as described above, the proportion of the emission from the light emitting element which is blocked by the filler is low, so that the decline in the optical output power of the light emitting element can be prevented.

Further, it is preferable that in the light emitting device, the electrically conductive members respectively have a positive electrode and a negative electrode, the electrodes are disposed spaced apart from each other on the base member, and the filler is applied covering at least a portion between the electrodes.

With the construction as described above, the filler is applied to the slit (groove) in the conductive portion created between the electrodes, so that leakage of the light from the bottom of the base member through the slit (groove) in the conductive portion can be prevented. With this arrangement, the light extracting efficiency can be further improved.

The distance between the electrodes, that is the width of the slit (groove) in the electrically conductive portion is preferably 200 μm or less. The width of the slit (groove) in the conductive portion 200 μm or less facilitates covering of the groove portion with the filler.

In the light emitting device, the light emitting element is preferably mounted in flip-chip mounting manner. With the construction as described above, a wireless light emitting element can be employed, so that optical absorption by the conductive wires can be eliminated and the emission can be extracted efficiently from the light extracting surface side. Also, the periphery and the bottom of the light emitting element which is mounted in a flip-chip manner are covered with the filler, so that light from the light emitting surface side of the light emitting element can be extracted to outside efficiently.

It is preferable that a protective element is mounted in the light emitting device and 50% or greater area of the surface of the protective element is covered with the filler. With the construction as described above, optical absorption by the protective element can be prevented.

At least a portion of the filler is preferably covered with a light blocking member. With this arrangement, light from the light emitting element is reflected by the filler and the light blocking member, so that the light extracting efficiency can be improved.

The light blocking member preferably covers the side walls of the base member. With the construction as described above, light from the light emitting element is reflected by the light blocking member and the light extracting efficiency can be improved.

The light transmissive member preferably covers the filler in addition to the light emitting element. With the construction as described above, the surface of the filler can be protected.

A light emitting device according to an aspect of the present invention includes a base member, electrically conductive members disposed on the base member, a light emitting element mounted on the electrically conductive members, a wire electrically connecting each electrode portion of the electrically conductive members with respective electrode terminals of the light emitting element, an insulating filler covering the electrically conductive portion which does not have the light emitting element mounted thereon and the lower surface of the wires, and a light transmissive member covering the light emitting element and the filler.

According to the construction as described above, the lower surface of the wires are covered with the filler, so that the amout the light which is emitted from the light emitting element directly on the wires and absorbed by the wires can be reduced. Particularly, the lower surfaces of the wires are at positions directly irradiated with the light from the light emitting element, so that forming of the filler on the lower surfaces of the wires allows to prevent the absorption of the light by the wires efficiently.

The gaps among the filler are preferably impregnated with a light transmissive member. With the construction as described above, adhesion between the filler and the light transmissive member can be improved. The light transmissive member is configured such that light from the light emitting element transmits through it and is extracted to outside, and also that it seals the light emitting element, thus it may be called a sealing member. In the case where the light emitting device has a light blocking member, the gaps among the filler are impregnated with the light blocking member, so that adhesion between the filler and the light blocking member can be improved.

Further, in the region covered with the filler, the filler is preferably contained more than 50 volume percent with respect to the volume of the impregnated light transmissive member.

A light emitting device according to an aspect of the present invention includes a light emitting element which has a semiconductor layer and a positive electrode and a negative electrode respectively disposed on the respective surfaces of the semiconductor layer, electrically conductive members each bonded to the positive electrode and negative electrode respectively, a reflective member which covers the side surfaces of the positive electrode and negative electrode and the side surfaces of the electrically conductive members, and a light transmissive member covering an upper surface opposite to the respective surfaces having the electrodes disposed thereon and side surfaces of the light emitting element.

With the construction as described above, the reflective member is formed around the electrodes of the light emitting element, so that a structure which allows little leakage of light in the downward direction can be obtained. Thus, optical loss due to the light entering under the light emitting element can be reduced. Also, the reflective member reflects light which enters under the light emitting element, so that the light extracting efficiency can be improved.

In a light emitting device according to the present invention, the reflective member is preferably exposed at the side surfaces of the light emitting device. With the structure as described above, the absorption of the light under the light emitting element can be prevented.

In a light emitting device according to the present invention, the interface between the light transmissive member and the reflective member is located at the side surface side of the light emitting element. With the construction as described above, light can be extracted from the upper surface and the side surfaces of the light emitting element.

It is preferable that in a light emitting device according to the present invention, the thickness from the upper surface of the light emitting element to the upper surface of the light transmissive member is approximately the same as the thickness from a side surface of the light emitting element to a side surface of the light transmissive member. With the construction as described above, a preferable optical distribution can be obtained in the near-field. On the other hand, forming the thickness from a side surface of the light emitting element to a side surface of the light transmissive member smaller than the thickness of the upper surface of the light emitting element to the upper surface of the light transmissive member, a preferable optical distribution can be obtained in the far-field. Thus, such a construction may also be employed.

In the light emitting device according to the present invention, the light transmissive member preferably contains a wavelength converting member. According to the construction as described above, the light emitting device capable of emitting light having a desired wavelength can be obtained. Also, the structure as described above allows selection of color before disposing on the mounting substrate, so that the yield ratio after mounting the light emitting element is improved.

A method of manufacturing a light emitting device according to the present invention includes a step of bonding the electrodes of a plurality of light emitting elements on a support substrate, a step of forming a reflective member at least around the electrodes of the light emitting elements by using an electrolytic plating technique, an electrodeposition coating technique, or an electrostatic coating technique.

According to the procedure as described above, a reflective member is formed around the electrodes of the light emitting elements so that optical loss due to light propagates downward of the light emitting elements can be reduced. In addition, the reflective member is easily formed to the electrically conductive portions which are exposed just before the step of forming the reflective member.

A method of manufacturing a light emitting device according to the present invention includes a step of forming electrically conductive members on a base member which is a support substrate, a step of mounting a light emitting element on the electrically conductive members by die-bonding, applying an insulating filler, which is a reflective member, to cover a portion of a surface of the electrically conductive members where the light emitting element is not disposed, by using an electrolytic plating technique, an electrodeposition technique, or an electrostatic coating technique, and a step of covering the light emitting element with a light transmissive member.

According to the method of manufacturing a light emitting device, a light emitting device capable of exerting predetermined effect as described above can be provided.

It is preferable that the base member has a recess, electrically conductive members are formed on the bottom surface and a side surface of the recess, and a light emitting element is mounted on the bottom surface of the recess. In addition, the filler is preferably applied to a thickness of 5 μm or greater.

It is preferable that after the die-bonding the method further includes a step of wire-bonding of electrically connecting a portion of the conductive member, which serves as an electrode, and an electrode terminal of the light emitting element by using a wire, and in the step of applying a filler, the filler is applied to cover a lower portion of the wires. Also, a step of covering the filler with a light blocking member is preferably included.

A method of manufacturing a light emitting device according to another aspect of the present invention may include a step of disposing a light transmissive member on the reflective member to cover a side surface and an upper surface of the light emitting element, and a step of dividing the light emitting element into individual units which includes removing the support substrate and dividing the reflective member and light transmissive member.

Also, in a method of manufacturing a light emitting device according to an aspect of the present invention, it is preferable that, in the step of disposing the light transmissive member, the light transmissive member is impregnated in the reflective member. With the arrangement as described above, the reflective member can be fixed efficiently.

In a method of manufacturing a light emitting device according to an aspect of the present invention, the light transmissive member preferably contains a wavelength converting member. With the arrangement described above, at the time of individually separating the light emitting elements, the thickness of the light transmissive member which contains a wavelength-converting member can be adjusted, so that a light emitting device which have less color unevenness can be obtained.

Effects of the Invention

With the light emitting device according to the present invention, absorption of light due to the conductive portions such as the electrically conductive member can be suppressed, so that light from the light emitting element can be extracted efficiently, which allows obtaining higher output. Further, according to the light emitting device according to the present invention, leakage of light from the bottom surface of the base member can be prevented by coating the slit in the conductive portion with the filler, so that light from the light emitting element can be extracted more efficiently and thus higher optical output power can be achieved.

In the light emitting device described above, insulating filler capable of reflecting light is applied so that the light extracting efficiency can be improved without using a specific material which has a high reflectance for the electrically conductive member. Further, the insulating filler is formed with a greater thickness, so that discoloration and corrosion of the electrically conductive member can be suppressed. With such an arrangement as described above, reliability can be improved.

Further, with the light emitting device according to the present invention, the reflective member is formed around the electrodes of the light emitting element, so that a structure which allows little leakage of light in the downward direction can be obtained. Thus, optical loss due to the light entering under the light emitting element can be reduced. Also, the reflective member reflects light which enters under the light emitting element, so that the light extracting efficiency can be improved.

According to a method of manufacturing a light emitting device according to the present invention, a light emitting device of high optical output and high reliability can be manufactured. According to a method of manufacturing a light emitting device according to the present invention, a reflective member is formed around the electrodes of the light emitting elements so that optical loss due to light propagates downward of the light emitting elements can be reduced. Also, the reflective member reflects light which enters under the light emitting element, so that the light extracting efficiency can be improved.

BRIEF DESCRIPTION OF THE DRAWINGS

FIG. 4(a) corresponds to the cross-sectional view of the light emitting device, taken along arrow line X2-X2 in FIG. 1(b) and FIG. 4(b) corresponds to the cross-sectional view of the light emitting device, taken along arrow line X1-X1 in FIG. 1(b).

FIG. 5(a) corresponds to the cross-sectional view of the light emitting device, taken along arrow line X2-X2 in FIG. 1(b) and FIG. 5(b) corresponds to the cross-sectional view of the light emitting device, taken along arrow line X3-X3 in FIG. 1(b).

FIG. 6(a) corresponds to the cross-sectional view of the light emitting device, taken along arrow line X1-X1 in FIG. 1(b) and FIG. 6(b) corresponds to the cross-sectional view of the light emitting device, taken along arrow line X2-X2 in FIG. 1(b).

FIG. 16 is a schematic perspective view of another example of a light emitting device according to the third embodiment of the present invention.

DETAILED DESCRIPTION OF EMBODIMENTS

Figure 1A:
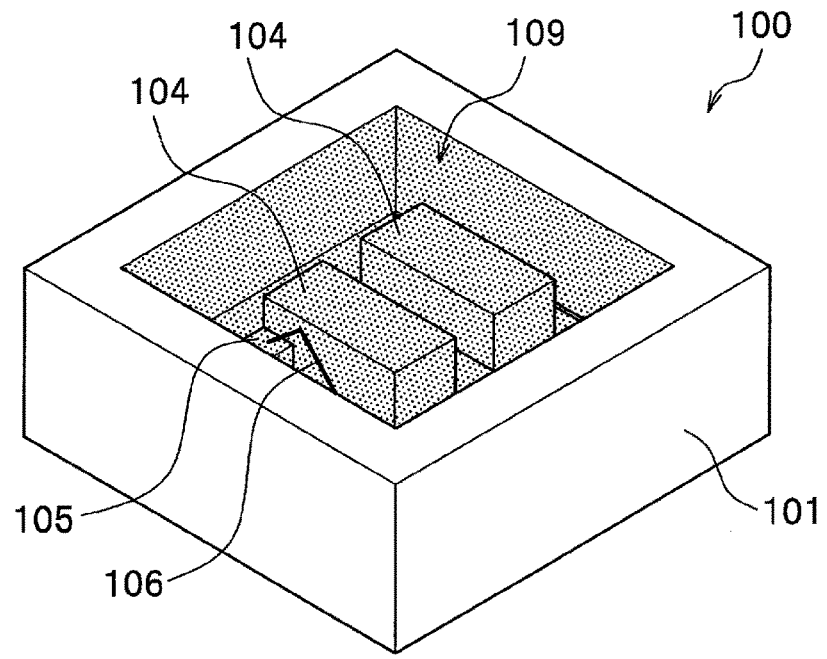
FIG. 1(a) is a perspective, part transmissive view of an example of a light emitting device according to a first embodiment of the present invention.

Preferred embodiments of the supporting member and the light emitting device according to the present invention will be described below with reference to the drawings. The sizes and the arrangement relationships of the members in each of drawings are occasionally shown exaggerated for ease of explanation. In the description below, the same designations or the same reference numerals denote the same or like members and duplicative descriptions will be appropriately omitted. In the fifth and sixth embodiments and the variant examples thereof, different reference numerals may be used for the sake of expedience.

First, arrangements which include a base member will be described in the first to fourth embodiments. In the first to fourth embodiments, a light emitting device having a FD element is indicated by reference numeral 100 (first and third embodiments) and a light emitting device having a FU element is indicated by reference numeral 200 (the second and fourth embodiments).

First Embodiment

In a first embodiment, a light emitting device which uses a FD element will be described. First, a general construction of a light emitting device will be described with description of each component, then, the material or the like of each member will be described.

<General Construction>

As shown in FIG. 1 and FIG. 2, the light emitting device 100 includes a light emitting element 104 having a semiconductor layer 11 and a transparent substrate (hereinafter may be referred to as a substrate) 10, a reflective member 114 applied so that at least a portion of a side surface and the upper surface of the transparent substrate 10 are exposed and a side surface of the semiconductor layer 11 is covered therewith, and the light transmissive member 108 which covers the portions exposed from the reflective member 114.

In the present embodiment, as shown in FIG. 1 and FIG. 2, the light emitting device 100 is a light emitting device 100 having at least one light emitting element 104 (two are shown in the figures) mounted thereon, and primarily has a base member 101, electrically conductive members 102a, 102b disposed on the base member 101, a light emitting element 104 mounted on the electrically conductive members 102a, 102b, a reflective member (in the embodiment, an insulating filler 114 is used) which covers at least a portion of the surfaces of the electrically conductive members 102a, 102b which do not have the light emitting element mounted thereon, and a light transmissive member 108 which covers the light emitting element 104. Further in the embodiment, a metal member 103 which is disposed on the electrically conductive members 102a and 102b on the base member 101, a protective member 105, and wires 106 are disposed.

(Base Member)

The base member 101 is to house and protect the electric components such as the light emitting element 104 and the protective element 105.

Figure 2A:
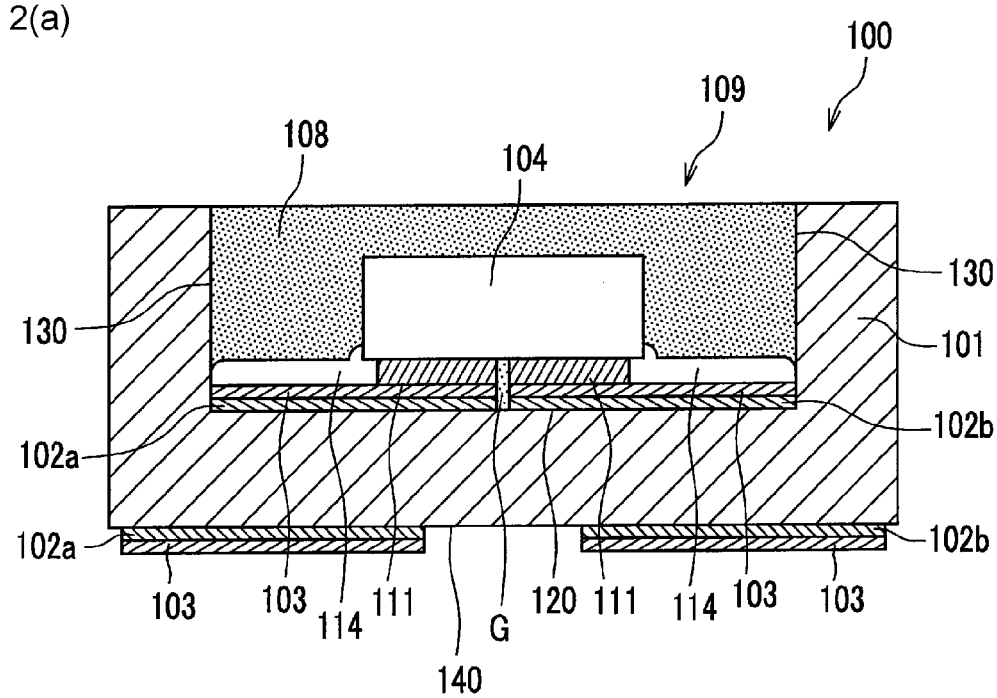
FIG. 2(a) is a cross-sectional view of the light emitting device, taken along arrow line X2-X2 in FIG. 1(b)

As shown in FIG. 2(a), the base member 101 has a recess 109 which opens upward, and with the recess 209a, the bottom surface 220a and the side surface 230a are formed. The electrically conductive members 102a, 102b are disposed on the bottom surface 120 of the recess 109.

For the material of the base member 101, an insulating member is preferable and a member which allows little light emitted from the light emitting element 104 and outside light to pass through is preferable. Also, a material which has a certain degree of mechanical strength is preferable. Specific examples thereof include ceramics ($Al_2O_3$, AlN etc.,) and a resin such as a phenol resin, an epoxy resin, a polyimide resin, a BT resin (bismaleimide triazine resin), and a polyphthalamide (PPA). In the case where a resin is used for the material of the base member 101, inorganic filler such as glass fiber, $SiO_2$, $TiO_2$, $Al_2O_3$ may be mixed into the resin to improve mechanical strength, decrease the coefficient of thermal expansion, and improve the optical reflectance.

(Electrically Conductive Member)

The electrically electrically conductive members 102a, 102b are to electrically connect outside and the electronic components such as the light emitting element 104 and the protective element 105, and to supply current (power) from an outside supply to those electronic components, and also the surfaces thereof are to be covered with the insulating filler. That is, the electrically electrically conductive members serve as the electrodes or a portion thereof to supply electricity from outside.

As shown in FIG. 2(a), the electrically electrically conductive members 102a, 102b are disposed also on the back surface 140 of the base member 101 so as to be respectively electrically connected to the electrically conductive members 102a, 102b (respectively to be an electrically single member) in the base member 101. With such a structure as described above, the electrically electrically conductive members 102a, 102b are used as the electrode material for supplying electricity and also are to serve as heat dissipation members. The electrically electrically conductive members 102a, 102b may also be respectively disposed extended to a side surface (side wall) 130 in the recess 109 of the base member 101.

Further, in the present embodiment, the electrically conductive members 102a, 102b have a positive electrode or a negative electrode respectively, which are disposed on the base member 101 spaced apart from each other, and at least a portion between the electrodes is covered with the filler 114. That is, the electrically electrically conductive members 102a, 102b are separately disposed on the base member 101 in a horizontal manner (laterally) with respect to the base member 101, so that the electrically conductive member 102a serves as a positive electrode (anode) and the electrically conductive member 102b serves as a negative electrode (cathode). With the arrangement as described above, a slit (groove) G is formed between the electrodes (between the electrically conductive members 102a and 102b). Then, the light emitting element 104 is disposed to straddle the electrically conductive members 102a and 102b.

At least a portion between the electrodes (electrically conductive members 102a, 102b), i.e., the silt (groove) G in the conductive portion is preferably covered with the filler 114 as to be described later (see FIG. 5(b)). With this arrangement, light can be prevented from leaking through the groove G. In the case where the groove G is completely covered with the filler 114, downward leakage of light through the groove G can be more effectively prevented. It is further preferable that the groove G is completely covered with the filler and 80% or greater portion of the area in the light emitting device irradiated with the light which is other than the light emitting element 104 is covered with the filler. The width of the groove G is preferably 200 μm or less. The width of the groove G of 200 μm or less facilitates covering of the groove portion with the filler 114. It is more preferable that the width of the groove G of 100 μm or less more facilitates covering of the groove portion with the filler. It is further preferable that the groove G is completely covered with the filler.

The lower limit is not limited but in terms of preventing contact between the electrodes, 30 μm or greater is preferable. The filler 114 may extend and cover the groove G located under (below) the light emitting element 104. The groove G located under (beneath) the light emitting element 104 and the area between the bonding member 111 are covered with a light transmissive member 108 in addition to by the filler 114. The groove G may not be covered with the filler 114 and not be filled with the light transmissive member 108. Moreover, in the case where the groove G is not covered with the filler 114, the groove G may be covered by applying a coating of a light blocking resin.

The materials of the electrically conductive members 102a, 102b can be appropriately selected based on the material used for the base member 101 and on the method of manufacturing the light emitting device 100. For example, in the case where ceramics is used for the material of the base member 101, the materials of the electrically conductive members 102a, 102b preferably have a high melting point so as to be able to endure the firing temperature of the ceramics sheet, and for example, a metal having a high melting point such as tungsten and molybdenum is preferably used.

In the case where a glass epoxy resin or the like is used for the material of the base member 101, it is preferable that the electrically conductive members 102a, 102b are respectively made of a material that is easy to process. In the case where an injection-molded epoxy resin is used for the material of the base member 101, the electrically conductive members 102a, 102b are respectively made of a material that is easy to process by way of punching, etching, bending, or the like, and also that has relatively high mechanical strength. Examples thereof include a metal such as copper, aluminum, gold, silver, tungsten, iron, and nickel oran iron-nickel alloy, a phosphor bronze, an iron containing copper and molybdenum.

(Metal Member)

A metal member may be disposed to cover the surface of the electrically conductive member. In the present specification, the term "filler that covers the surface of the electrically conductive members" includes the state in which the electrically conductive members are covered with a filler material which is disposed on a metal member disposed on the respective electrically conductive members. The metal member can be omitted.

The metal member 103 is used to cover the surfaces of the electrically conductive members 102a, 102b to improve the efficiency of light reflection at the electrically conductive members 102a, 102b. The metal member 103 can be omitted. The metal member 103 is not necessarily made of a material which has high reflectance and may be disposed integrally to the respective electrically conductive members 102a, 102b.

As shown in FIG. 2(a), above the base member 101, that is, the metal member 103 is disposed on the respective electrically conductive members 102a, 102b at the bottom surface 120 of the recess 109. Also, as shown in FIG. 2(a), the surfaces of the electrically conductive members 102a, 102b exposed at the back surface 140 of the base member 101 may be respectively covered with the metal member 103. The metal member 103 is not necessarily disosed on the electrically conductive members 102a, 102b which are embedded in the base member 101.

The material of the metal member 103 is not specifically limited as long as the material can be plated, and for example, singly silver, or an alloy of silver and a metal having high reflectance such as copper, gold, aluminum, or rhodium, or a multilayer film made with silver and the above-described alloys can be used. It is preferable to singly use gold which has excellent thermal conductivity. The metal member 103 is preferably a thin metal foil with a thickness of about 0.05·m to 50·m, and in the case where the metal member 103 is formed with a multilayer, the total thickness is preferably in this range. For the method of forming the metal member 103, a sputtering method, a vapor-deposition method or the like can be employed, as well as a plating method. Even without a use of silver which has excellent reflectance for the metal member 103, the insulating filler 114 with light reflectivity is used for the covering, so that deterioration in the light extraction efficiency can be prevented.

(Light Emitting Element)

The light emitting element 104 is a FD element which has patterned electrodes on one principal surface, and is bonded by the bonding member 111, mounted (in a flip-chip mounting manner) on the bottom surface 120 of the recess 109, and connected to the electrically conductive members 102a, 102b through the bonding member 111 and the metal member 103.

Figure 2B:
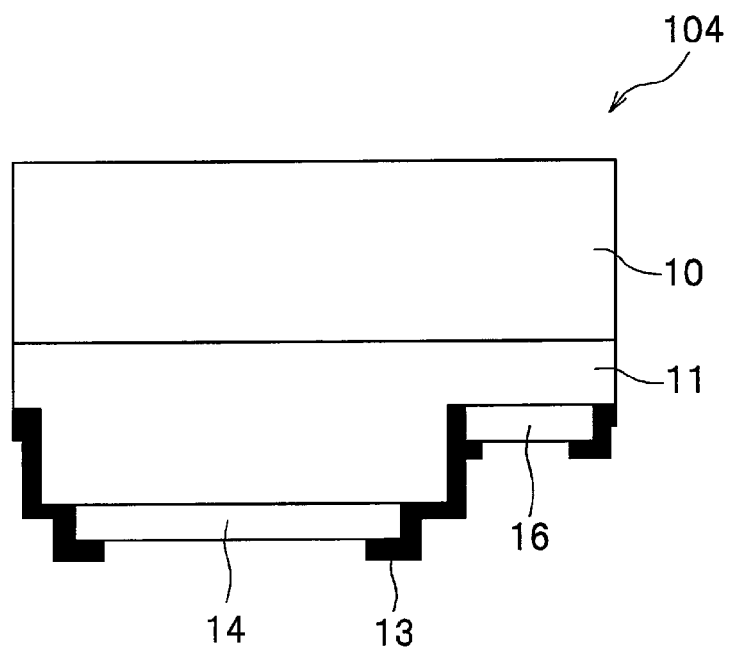
FIG. 2(b) is a schematic diagram of a light emitting element of the light emitting device shown in FIG. 1.
Figure 4A:
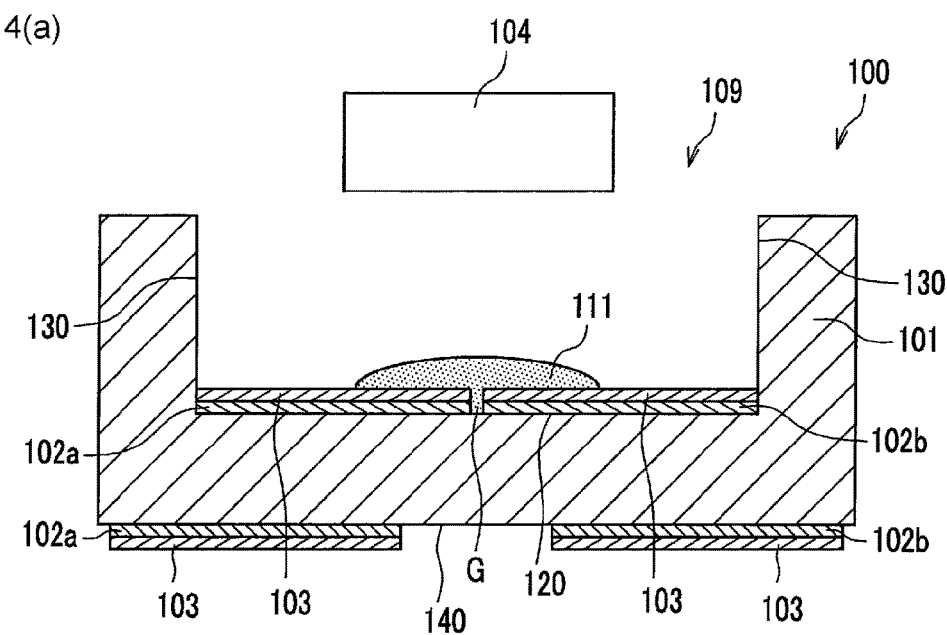
FIGS. 4(a) and 4(b) are cross sectional views illustrating manufacturing steps of a light emitting device according to the first embodiment of the present invention.

The light emitting element 104 has, as shown in FIG. 2(b), a base member 10 and a semiconductor layer 11 stacked on the base member 10. The semiconductor layer 11 includes an n-type semiconductor layer, an active layer, and a p-type semiconductor layer stacked in this order. An n-type electrode 16 is formed on the n-type semiconductor layer and a p-type electrode 14 is formed on the p-type semiconductor layer. In the case of a FD element which is mounted in a face-down mounting manner, the electrodes formed on the semiconductor layer 11 are fixed on the electrically conductive members 102a, 102b. For the method of mounting the light emitting element 104, mounting with a use of a solder paste as the bonding member 111 as shown in FIG. 4(a) or with a use of a bump made of a solder or the like is employed. The semiconductor layer 11 of the light emitting element 104 is, as shown in FIG. 2(b), preferably covered with an insulating protective film 13. The light emitting element 104, which is a FD element shown in FIG. 2(b), is further simplified in other figures.

For the light emitting element 104, a light emitting diode is preferably used, and of an appropriate wavelength can be selected. For example, for the light emitting element 104 of blue color (light of wavelength range 430 nm to 490 nm) or green color (light of wavelength range 490 nm to 570 nm), ZnSe, a nitride-based semiconductor ($In_XAl_YGa_{1-X-Y}N$, $0·X$, $0·Y$, $X+Y·1$), GaP or the like, can be used. For the light emitting element 104 of red color (light of wavelength range 620 nm to 750 nm), GaAlAs, AlInGaP, or the like, can be used. Further, a semiconductor light emitting element made of a material other than described above can also be used.

In the case where the light emitting device 100 employs a fluorescent material, a nitride semiconductor ($In_XAl_YGa_{1-X-Y}N$, $0·X$, $0·Y$, $X+Y·1$) capable of emitting light of a short wavelength that can efficiently excite the fluorescent material is suitably used. The emission wavelength of the light emitting element can be variously selected by adjusting the materials and their mixed crystal of the semiconductor layer 11. The structure of the light emitting element 104 can be selected from a structure in which both the electrodes are disposed on the semiconductor layer 11 which is disposed on the base member 10, or a structure in which the electrodes are disposed in a up and down direction, on the upper surface of the semiconductor layer 11 and the surface of the base member 10 respectively. A light emitting element 104 made of a material other than the above may also be used. The composition, emission color, size, number, or the like, of the light emitting element 104 can be selected appropriately according to the purpose. Moreover, a light emitting element 104 capable of emitting ultraviolet light or infrared light can also be employed as well as a light emitting element 104 capable of emitting visible light.

(Filler (Reflective Member))

The filler 114 is insulating and is used to cover the conductive portions of the light emitting device 100, and serves to prevent deterioration of the light extraction efficiency. The reflective member 114 is preferably a white filler, and preferably primarily made of an inorganic compound.

As shown in FIG. 2(a), among the surfaces of the metal member 103 on the electrically conductive members 102a, 102b formed on the bottom surface 120 of the recess 109, the portions which do not have the light emitting element 104 and the protective member 106 mounted thereon are covered with the filler 114. The region around the light emitting element 104, the side surfaces of the bonding member 111, and the exposed portion in the slit in the electrically conductive portion are covered with the filler 114.

As described above, covering the electrically conductive members with the filler 114 enables to suppress the absorption of the light. The regions which is covered with the filler 114 is, at the light extracting surface side of the light emitting device 100, mainly the regions where the electrically conductive portion (electrically conductive body) is exposed. It is preferable to cover at least 50% of the exposed portion of the electrically conductive body. Further, it is preferable that substantially entire area of the exposed surface of the conductive body is covered. The portions covered with the insulating member do not allow treatments such as an electrodeposition coating which to be described later, so that the filler 114 is hardly applied thereon.

Moreover, it is preferable that with the filler 114, the protective element 105 and the electrically conductive wires 106 are covered. The electrically conductive members 102a, 102b which are exposed on the back surface of the base member 101 are not covered with the filler 114.

In the light emitting element 104, the semiconductor layer 11 is covered with the protective film (insulating film) 13. In the present invention, at least a portion of the side surfaces and the upper surface of the transparent substrate 10 are exposed, and the side surfaces of the semiconductor layer 11 are covered with the filler 114. That is, in this specification, all of the side surfaces of the semiconductor layer 11 is covered with the filler 114 and a portion of the side surfaces of the base member 10 are covered with the filler 114, and other portion of the side surfaces and the upper surface of the base member 10 are exposed from the filler 114.

At least a portion of the side surfaces and the upper surface of the base member 10 are exposed, so that the absorption of the light by the filler (reflective member) 114 can be suppressed, and accordingly, deterioration of the light extraction efficiency can be prevented. That is, at least a portion of the side surfaces and the upper surface are exposed from the filler 114, so that emission from the light emitting element 104 is not blocked by the filler 114, and thus deterioration of output power of the light from the light emitting element 104 can be prevented.

Also, if a resin is applied to coat the electrically conductive members 102a, 102b etc., the resin rises to the side surfaces of the base member 10 and eventually all of the side surfaces of the base member are covered with the resin. In the case where the viscosity of the resin is adjusted to prevent the resin from rising up, the contained amount of the light-reflective material is increased to increase the viscosity, which makes it difficult to thinly cover the entire surfaces of the electrically conductive members. In the present invention, such a resin is not employed. Thus, the filler 114 can be applied on the electrically conductive members 102a, 102b, or the like, without covering all portions of the side surfaces of the base member 10. The side surfaces of the semiconductor layer 11 are covered with the filler 114, and thus light extraction efficiency can be improved. Moreover, in the case where the light transmissive member 108 contains a fluorescent material, the semiconductor layer 11 can be prevented from being embedded in the precipitated fluorescent material. Therefore, the absorption of the light by the fluorescent material can be prevented and deterioration of the light extraction efficiency can be prevented. Conversion of light by the fluorescent material can be carried out at the light extracting side as much as possible, and this can also contribute to suppression of deterioration of the light extraction efficiency.

Electrodeposition coating and the like to be described later is not applicable to an insulating substrate such as a sapphire substrate. Therefore, the base member 10 is not generally covered with the filler 114 by way of electrodeposition coating and the like, but according to the coating amount or the thickness of the filler 114, the surfaces (a portion of the side surfaces of the base member 10 (lower portion of the base member 10)) may be covered with the filler 114. The semiconductor layer 11 which has not covered with the protective film 13 is covered with the filler 114. As shown in FIG. 8(*b*), in the case where a FU element is used for the light emitting element 204 and where a joining layer 123, which is an electric conductor is disposed at a lower portion (back surface) of the base member 20, a portion of the filler 114 also adheres to the joining layer 123 at the back surface of the substrate 20.

For the filler 114, a filler of white color further facilitates to reflect light, so that the light extracting efficiency can be improved. Also, for the filler 114, an inorganic compound is preferably used. The term "white color", as used here, refers to that the filler itself has a white color, or even in the case where the filler is transparent, the filler appears white when there is a difference in the refractive index between the filler and the materials around the filler.

Here, the reflectance of the filler 114 is preferably 50% or greater, more preferably 70% or greater with respect to the light of emission wavelength. With the construction as described above, the light extracting efficiency of the light emitting device 100 can be improved.

Moreover, the surface area of a single light emitting element 104 which is covered with the filler 114 is preferably less than 50% of the entire surface area of the single light emitting element 104. With this arrangement, the ratio of the emission from the light emitting element 104 which is blocked by the filler 114 can be low, so that deterioration of optical output power of the light from the light emitting element 104 can be prevented. In the case where a plurality of light emitting elements 104 are mounted, each of all the light emitting elements has a surface area covered with the filler 114 which is less than 50% of the entire surface area of a single light emitting element 104. Also, the filler 114 preferably covers 50% or greater surface (exposed portion) of the protective element 105. With this arrangement, absorption loss of light by the protective element 105 can be prevented.

Examples of the material contained in the filler 114 made of an inorganic compound includes an oxide such as $SiO_2$, $Al_2O_3$, $Al(OH)_3$, $MgCO_3$, $TiO_2$, $ZrO_2$, $ZnO_2$, $Nb_2O_b$, $MgO$, $Mg(OH)_2$, $SrO$, $In_2O_3$, $TaO_2$. $HfO$, $SeO$, and $YnO_3$, a nitride such as $SiN$, $AlN$, and $AlON$, and a fluoride such as $MgF_2$. Those may be used singly or as a mixture. Those may be used in a stacked configuration.

The particle diameter of the filler 114 is preferably about φ1 nm to 10 μm. Adjusting the particle diameter of the filler 114 in this range, which is suitable particle diameter for covering, facilitates applying of the filler 114. The particle diameter of the filler 114 is preferably φ100 nm to 5 μm, further preferably φ200 nm to 2 μm. The shape of the filler particles may be spherical shape or a scale shape.

Figure 29A:
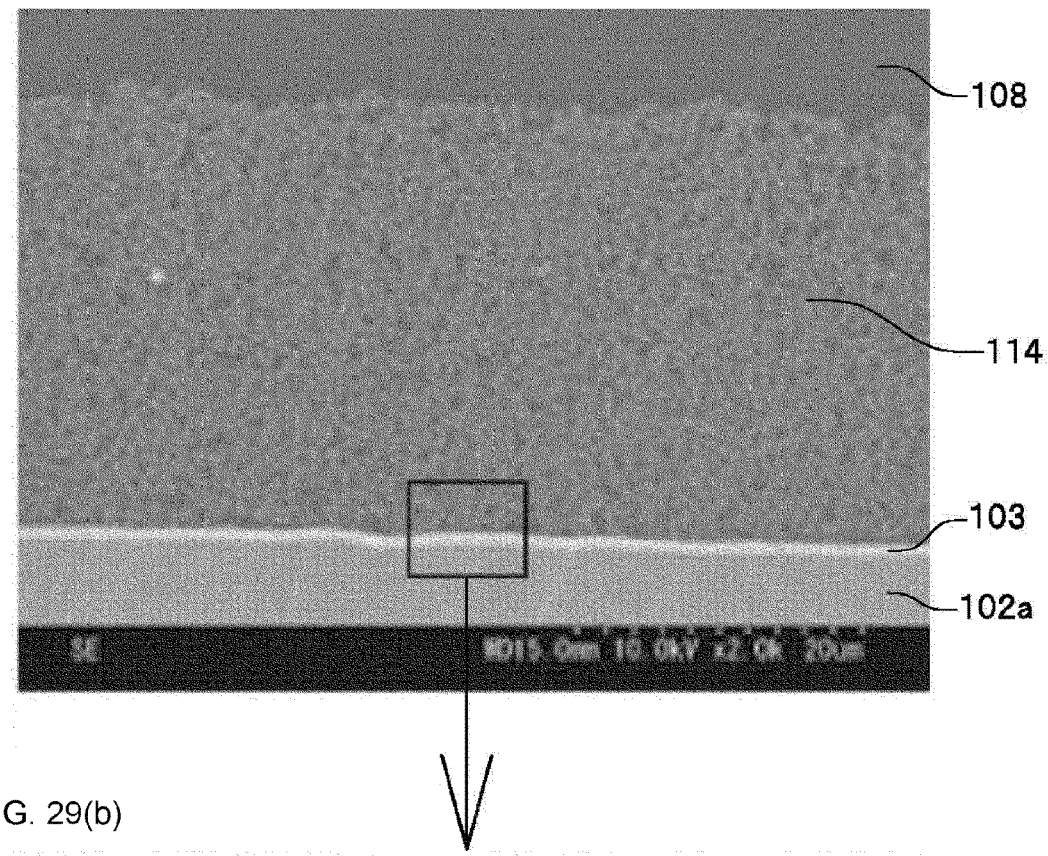
FIGS. 29(a) and 29(b) are SEM (Scanning Electron Microscope) images each showing an example of deposition of the filler, cross-section partially enlarged image near the bottom surface of the recess of the light emitting device.
Figure 29B:
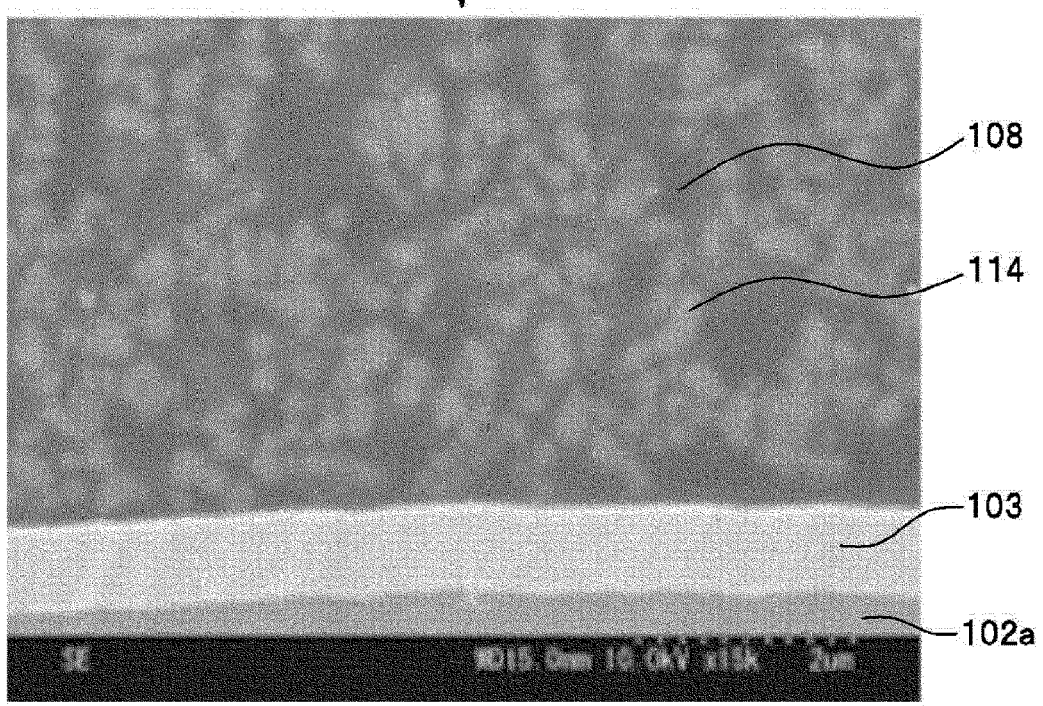

Here, in FIGS. 29(*a*), (*b*), as an example of the state where the filler is deposited, a partially enlarged SEM image of a cross section near the bottom surface 120 of the recess 109 of the light emitting device 100 is shown. In FIG. 29(*a*), one scale is 2 μm, and in FIG. 29(*b*), one scale is 0.2 μm.

In the images, the filler 114 (including a spherical shape and a scale shape) with a particle diameter of about φ250 nm are deposited on the electrically conductive member 102*a* (here, on the metal member 103, because the metal member 103 is formed) by using electrophoresis, and the light transmissive member 108 is impregnated in the filler 114. At this time, the filler 114 is preferably contained greater than 50 volume %, further preferably greater than 65 volume % with respect to the light transmissive member 108 which is impregnated in the filler 114. From another viewpoint, when observing the cross section at a portion where the filler 114 having the light transmissive member 108 impregnated therein, the filler 114 is preferably exposed at 50% or greater, more preferably 65% or greater, at the cross sectional area.

Here, in the case where the filler 114 is contained in a resin material and is applied for coating, if greater than 65 volume % of the filler 114 with respect to the resin material is contained, moldability decreases. Even in the case of 65 volume % or less, the resin amount is difficult to control, and further, appropriately disposing a predetermined amount of resin to a predetermined position is also difficult. However, according to the method of manufacturing according to the present embodiment which to be described later, the filler 114 can be applied with high density while reducing the thickness.

(Light Transmissive Member)

The light transmissive member 108 is for protecting the light emitting element 104, the protective element 105, the wire 106, the filler 114, and the like, from dust, moisture, external force, or the like. As shown in FIG. 2(*a*), the inner portion of the recess 109 of the base member 101 is covered (enclosed) with the light transmissive member 108. Also, in order to improve the adhesion between the filler 114 and the light transmissive member 108, the light transmissive member 108 is preferably impregnated between the filler particle 114 and the filler particle 114, that is, the gaps among the filler 114. In the case where the light emitting element 104 is a FD element, and the periphery of the light emitting element 104 is covered with a light blocking member, the light transmissive member 108 can be omitted.

The material of the light transmissive member 108 preferably has transparent property capable of allowing light from the light emitting element 104 to pass through it. Examples of such material include a silicone resin, an epoxy resin, and a urea resin. In addition to these materials, a coloring agent, a light diffusing agent, a filler, a fluorescent material or the like may also be contained as needed. The light transmissive member 108 can be made of a single member, or made with two or more of plurality of layers. The filling amount of the light transmissive member 108 is sufficient to cover the light emitting element 104 mounted on the recess of the base member 101, the protective element 105, the wires 106, or the like. In the case where the light transmissive member 108 functions as a lens, the surface of the light transmissive member 108 may be formed with a protrusion to form a shell shape, a convex lens shape, or the like.

(Wire)

The wires 106, 206 (see FIG. 8) are used to electrically connect the electrode terminals of the FU elements or the protective element 105 to the respective portions which serves as the electrodes of the electrically conductive members 102a, 102b disposed in the recess 109 of the base member 101. Examples of the material of the wires 106, 206 include a metal such as gold, copper, platinum, and aluminum, and an alloy of those, but particularly, gold which has excellent thermal conductivity is preferably used.

(Protective Element)

Figure 4B:
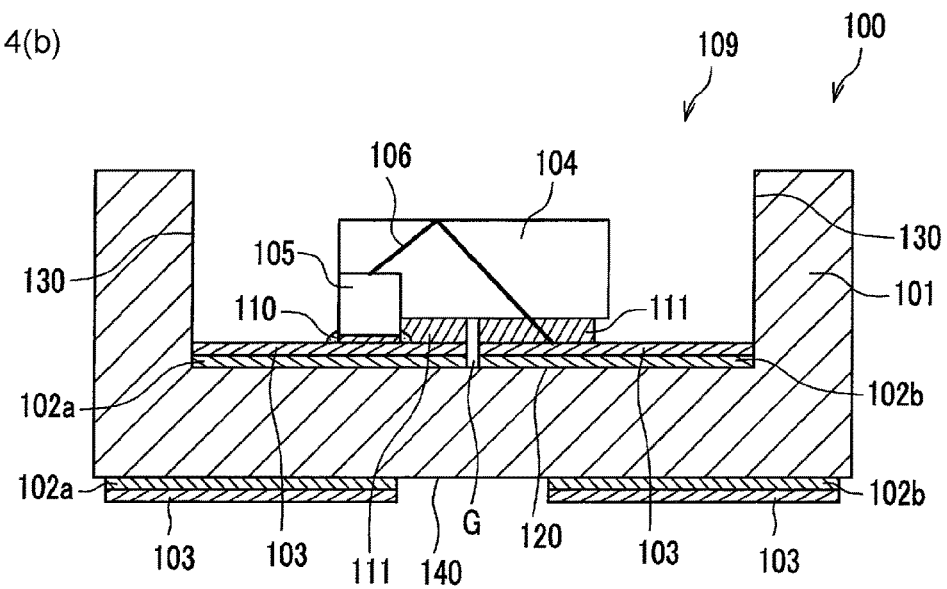

The protective element 105 serves as, for example, a Zener diode, and is disposed when needed. As shown in FIG. 4(b), the protective element 105 is mounted at the bottom surface 120 of the recess 109 through a bonding member 110, for example an Ag paste, and connected to the electrically conductive member 102a through the metal layer (not shown) and the metal member 103 which are disposed at the bottom surface of the protective element 105. In addition, a wire 106 is connected to the upper surface of the protective element 105. The wire 106 is connected to the electrically conductive member 102b through the metal member 103, and thus, the protective element 105 and the electrically conductive member 102b are electrically connected.

(Bonding Member)

The bonding member (die-bonding member) 111 is for electrically connecting the electrodes of the light emitting element 104 and the electrically conductive members 102a, 102b respectively, and also for bonding the light emitting element 104 to the base member 101. For the bonding member 111, an electrically conductive member is used. Examples of the material include an alloy containing Au, an alloy containing Ag, an alloy containing Pd, an alloy containing In, a alloy containing Pb—Pb, an alloy containing Au—Ga, an alloy containing Au—Sn, an alloy containing Sn, an alloy containing Au—Ge, an alloy containing Au—Sr, an alloy containing Al, an alloy containing Cu—In, and a mixture of a metal and a flux.

In the case where the light emitting device is mounted in a face-up mounting manner, an electrically conductive member is not necessarily used for the bonding member 111, and an insulating resin (a resin composition such as an epoxy resin, a silicone resin, or the like, can be used.

Also, the bonding member 111 in a form of liquid, paste or solid (in a sheet shape, a brick shape, or a powder form) can be used, which can be appropriately selected according to the composition, the shape of the base member 101, or the like. The bonding member 111 described above may be made of a single member or a combination of several kinds of members. Further, in the case where a light transmissive bonding member, in particular, is used, a fluorescent member capable of absorbing the light from the semiconductor light emitting element and emitting light of different wavelength can be contained in the bonding member.

(Wavelength Converting Member)

Figure 8A:
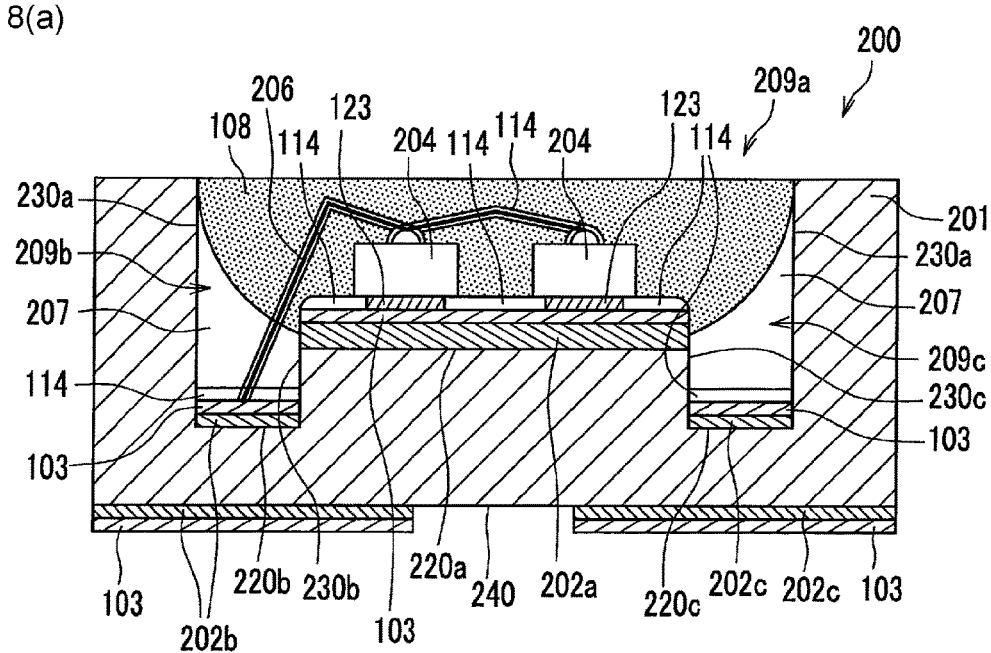
FIG. 8(a) is a cross-sectional view of the light emitting device, taken along arrow line Y-Y in FIG. 7(b)

The light transmissive member 108 and/or a light blocking member 207 (see FIG. 8(a)) may include a fluorescent member as the wavelength converting member that absorbs at least a part of the light emitted from the light emitting element 104 and emits light of different wavelength.

A fluorescent member capable of converting light from a light emitting element 104 into light of a longer wavelength has a higher efficiency. The fluorescent member may be formed of a single layer of one kind of fluorescent material etc., or a single layer of a mixture of two or more kinds of fluorescent materials etc. Or, a stacked layer of two or more single layers containing one kind of fluorescent material, or a stacked layer of two or more single layers each containing a mixture of two or more kinds of fluorescent materials etc., can be employed.

It is sufficient that the fluorescent member is capable of absorbing the light from the semiconductor light emitting element which has a nitride-based semiconductor as its semiconductor layer and emitting light of different wavelength. For example, a nitride-based fluorescent material or oxynitride-based fluorescent material, activated mainly with a lanthanoid element such as Eu, Ce can be used. More specifically, the fluorescent member is preferably at least one selected from the broadly grouped into (1) to (3) described below.

(1) Fluorescent materials such as an alkaline-earth halogen apatite fluorescent material, an alkaline-earth metal borate halogen fluorescent material, an alkaline-earth metal aluminate fluorescent material, an alkaline-earth sulfide fluorescent material, an alkaline-earth thiogallate fluorescent material, an alkaline-earth silicon nitride fluorescent material, and a germinate each activated mainly with a lanthanoid element such as Eu and/or a transition-metal element such as Mn;

(2) Fluorescent materials such as a rare-earth aluminate, a rare-earth silicate, an alkaline-earth metal rare-earth silicate, each activated mainly with a lanthanoid element such as Ce; and (3) Fluorescent materials such as an organic compound or an organic complex each activated mainly with a lanthanoid element such as Eu.

Among those, as in (2), a YAG (Yttrium Aluminum Garnet)-based fluorescent material which is a rare-earth aluminate fluorescent material activated with a lanthanoid element such as Ce is preferable. YAG-based fluorescent materials are represented by the composition formulas such as in (21) to (24) shown below.

$$Y_3Al_5O_{12}:Ce \tag{21}$$

$$(Y_{0.8}Gd_{0.2})_3Al_5O_{12}:Ce \tag{22}$$

$$Y_3(Al_{0.8}Ga_{0.2})_5Al_5O_{12}:Ce \tag{23}$$

$$(Y,Gd)_3(Al,Ga)_5O_{12}:Ce \tag{24}$$

Moreover, for example, a part or all of Y may be substituted with Tb, Lu, or the like. Specifically, $Tb_3Al_5O_{12}:Ce$, $Lu_3Al_5O_{12}:Ce$, or the like, may be used. Further, a fluorescent material other than those described above, which has similar properties, performance, and effects can also be used.

<<Method of Manufacturing Light Emitting Device>>

A method of manufacturing the light emitting device according to the first embodiment of the present invention will be described below. In the present embodiment, a single light emitting device is illustrated, but the base member is processed as an aggregate until divided into individual units in the final step, and thus the external side surfaces of the base member are created by the dividing.

Figure 1B:
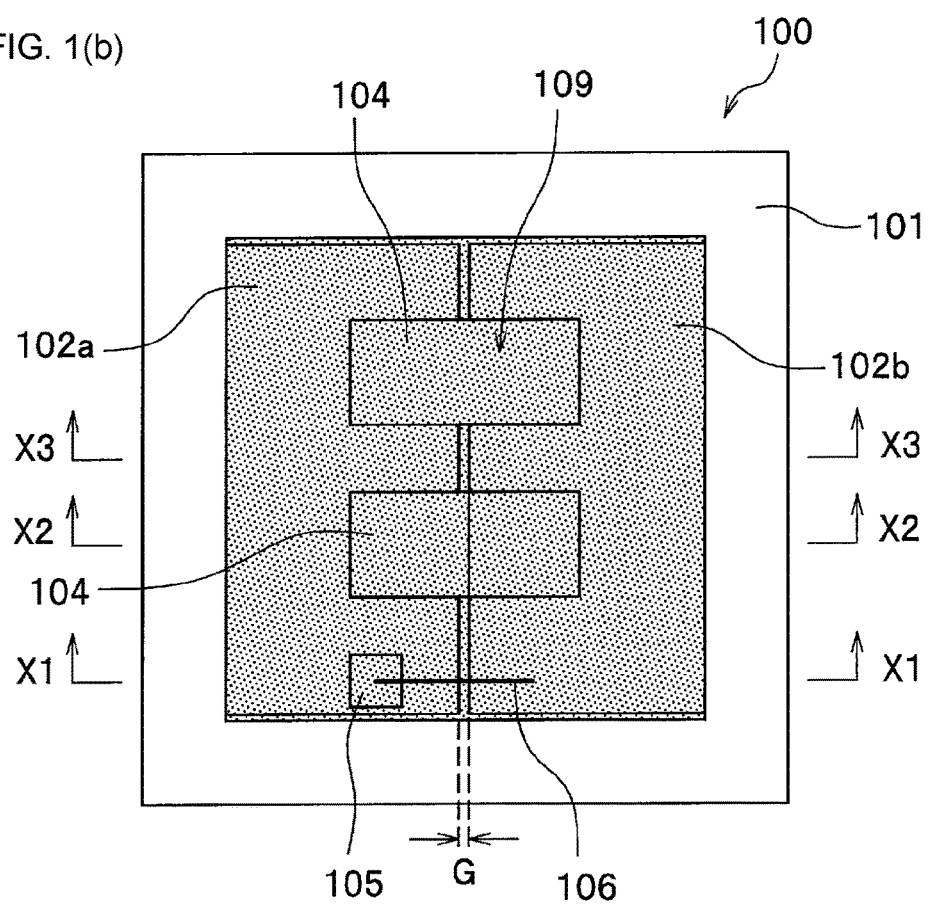
FIG. 1(b) is a plan, part transmissive view, viewed from the light emitting surface side of the light emitting device shown in FIG. 1(a).
Figure 3A:
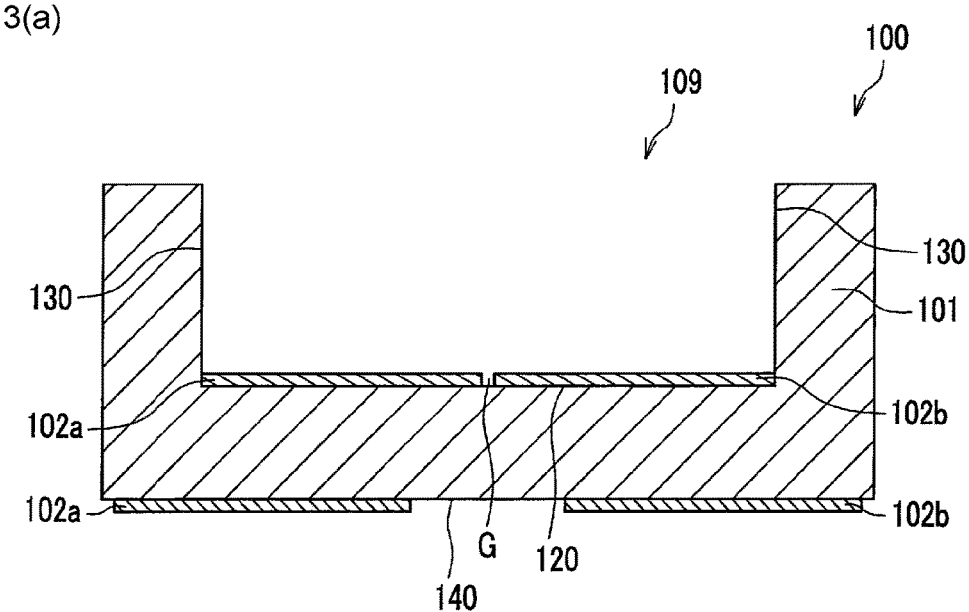
FIGS. 3(a) and 3(b) are cross sectional views illustrating manufacturing steps of a light emitting device according to the first embodiment of the present invention, and FIGS. 3(a) and 3(b) each corresponds to the cross-sectional view of the light emitting device, taken along arrow line X2-X2 in FIG. 1(b).
Figure 3B:
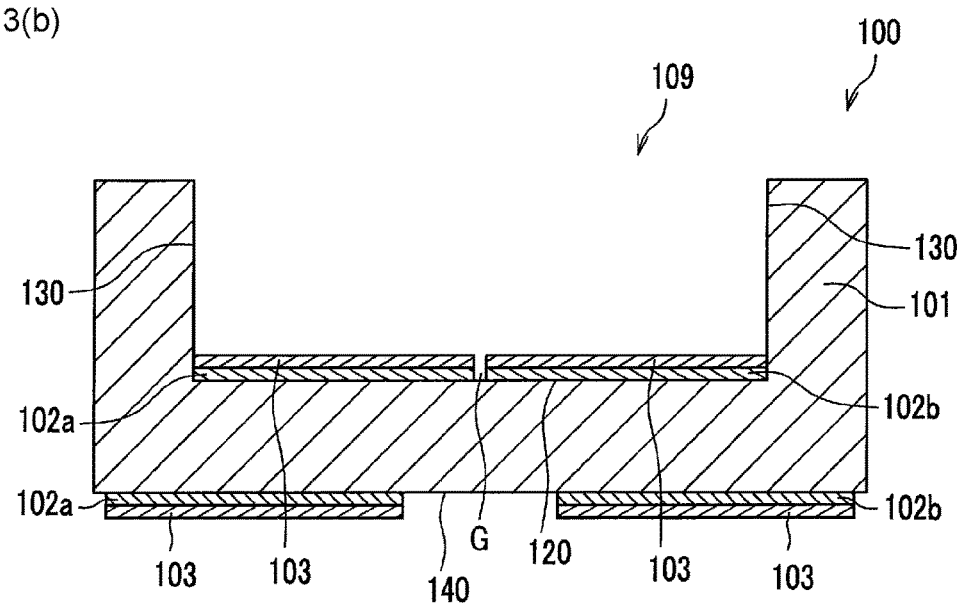

FIG. 3 through FIG. 6 are cross sectional views illustrating manufacturing steps of a light emitting device according to the first embodiment of the present invention, and FIGS. 3(a) and 3(b) each corresponds to the cross-sectional view of the light emitting device, taken along arrow line X2-X2 in FIG. 1(b). FIG. 4(a) corresponds to the cross-sectional view of the light emitting device, taken along arrow line X2-X2 in FIG. 1(b) and FIG. 4(b) corresponds to the cross-sectional view of the light emitting device, taken along arrow line X1-X1 in FIG. 1(b). FIG. 5(a) corresponds to the cross-sectional view of the light emitting device, taken along arrow line X2-X2 in FIG. 1(b) and FIG. 5(b) corresponds to the cross-sectional view of the light emitting device, taken along arrow line X3-X3 in FIG. 1(b). FIG. 6(a) corresponds to the cross-sectional view of the light emitting device, taken along arrow line X1-X1 in FIG. 1(b). FIG. 6(b) corresponds to the cross-sectional view of the light emitting device, taken along arrow line X2-X2 in FIG. 1(b). FIG. 3 to FIG. 6 show a sequence of steps of manufacturing a light emitting device 100, which are basically carried out from FIG. 3(a) to FIG. 6(b). Here, FIGS. 5(a), (b), and FIG. 6(a) illustrate a step of applying a filler and are carried out at approximately the same time.

One method of manufacturing a light emitting device 100 according to the present invention includes a step of forming electrically conductive members, a step of die-bonding, a step of applying a filler, and a step of forming a light transmissive member. In the first embodiment, a metal member 103 and a protective element 105 are disposed, so that a step of forming a metal member, a step of bonding a protective element, and a step of wire-bonding are included. Hereinafter, each step will be described below.

<Electrically Conductive Member Forming Step>

As shown in FIG. 3(a), the electrically conductive member forming step is a step of forming electrically conductive members 102a, 102b on a base member 101. In the case where the electrically conductive members 102a, 102b are to be formed on the back surface 140 of the base member 101, they are formed in this step. That is, this step is a step to dispose the electrically conductive members 102a, 102b on the base member 101.

The electrically conductive members 102a, 102b can be obtained by, for example, in the case where a base member 101 made of ceramic, a conductive paste which contains fine particles of high-melt point metal such as tungsten or molybdenum is applied in a predetermined pattern in the stage of ceramics green sheet before firing, then fired. Alternatively, the electrically conductive members 102a, 102b can be formed on a ceramics plate which is already fired, by using a technique of, for example such as vacuum vapor deposition, sputtering, or plating.

The recess 109 of the base member can be formed by, for example, forming a through hole of various size in each corresponding ceramics green sheet and stack them. In the case of the side surfaces 130 of the recess, the electrically conductive members 102a, 102b can be formed on the side surfaces 130 in the same manner as on the bottom surface 120.

In the case where a base member 101 made of a glass epoxy resin is used, the electrically conductive members 102a, 102b may be formed by attaching a copper plate to a prepreg which is obtained by semi-hardening a glass cloth containing an epoxy resin or an epoxy resin, then, patterning the metal member such as copper into a predetermined shape using a photolithographic technique.

<Metal Member Forming Step>

As shown in FIG. 3(a), the metal member forming step is a step of forming a metal member 103, which allows bonding, on the electrically conductive members 102a, 102b formed on the base member 101. In the case where the metal member 103 is also formed on the electrically conductive members 102a, 102b which are on the back surface 140 of the base member 101, they are formed in this step. That is, in this step, the metal member 103 is disposed on the electrically conductive members 102a, 102b.

For disposing the metal member 103, a technique such as a plating technique, a sputtering technique, a vapor deposition technique, or a technique of bonding a thin film, can be used. When a plating technique is employed, a technique such as electrolytic plating or non electrolytic plating can be used. For example, the most simplified technique is that after electrically connecting the corresponding portions which are on the electrically conductive members 102a, 102b, carrying out an electrolytic plating. In the case where a non electrolytic plating technique, a sputtering technique, or a vapor deposition technique is employed, deposition of only on the electrically conductive members 102a, 102b can be obtained by using a photolithographic technique. Also, after disposing the metal member 103 on the electrically conductive members 102a, 102b which are not formed in a pattern, patterning can be carried out on the electrically conductive members 102a, 102b and the metal member 103 to obtain a predetermined shape. In the case where wire-bonding is carried out on the metal member 103 or where the electrodes of the light emitting element 104 are directly connected, the metal material is needed to be such that wire-bonding or flip-chip mounting can be applied thereon. But if those are not performed on the electrically conductive members 102a, 102b, the kinds of the metal is not needed to be specifically limited.

<Die-Bonding Step>

As shown in FIG. 4(a), the die-bonding step is a step in which a light emitting element 104 is mounted and bonded on the base member 101 (on the electrically conductive members 102a, 102b in the case where the metal member 103 is not formed) after forming the metal member 103.

The die-bonding step includes light emitting element mounting step in which a light emitting element 104 is mounted on the base member 101 and heating step in which after the light emitting element 104 is mounted, the light emitting element 104 is bonded by heating.

(Light Emitting Element Mounting Step)

The light emitting element mounting step is a step in which on the base member 101, through a bonding member 111, a light emitting element 104 is mounted. The bonding member 111 contains, for example, rosin (pine resin) or a thermosetting resin, and further, when needed, a solvent for viscosity control, various additives, an activator such as an organic acid may be contained. Moreover, a metal (for example in a powder form) may be contained.

The light emitting element 104 is bonded with the electrically conductive members 102a, 102b (metal member 103) on the base member 101 through the bonding member 111. A flux may be applied beforehand on the back surface of the light emitting element 104.

Here, it is sufficient that the bonding member 111 is disposed between the electrically conductive members 102a, 102b and the light emitting element 104 through the metal member 103. Therefore, of the portions on the electrically conductive members 102a, 102b, the bonding member 111 may be disposed in a region where the light emitting element 104 to be mounted, or the bonding member 111 may be disposed at the light emitting element 104 side. Or the bonding member 111 may be disposed on the both of them. Now, bonding method of the light emitting element 104 will be described below.

FIG. 4(a) illustrates a state in which a resin composition (bonding member) 111 in liquid or paste form is disposed on the electrically conductive members 102a, 102b. In the case where a bonding member 111 in liquid or paste form is disposed on the electrically conductive members 102a, 102b, technique can be appropriately selected from a potting technique, a printing technique, a transferring technique, or the like, according to the viscosity. Then, to the portion where the bonding member 111 is disposed, the light emitting element 104 is mounted. The electrodes are formed on the joining surface of the light emitting element 104, and the electrodes and the electrically conductive members 102a, 102b are respectively electrically connected. In the case where a bonding member in solid form is used, after disposing the bonding member 111 in solid form, the light emitting element 104 can be mounted on the electrically conductive members 102a, 102b in the same manner as in the case where the bonding member 111 in liquid or paste form is used. It may be such that the bonding member 111 in solid or paste form is temporarily melted by heating etc. so that the light emitting element 104 is fixed to a desired position on the electrically conductive members 102a, 102b.

The amount of the resin composition is preferably adjusted so that after the light emitting element 104 is bonded, the bonding area of the resin composition is approximately the same as or greater than the bonding area of the light emitting element 104. In the case where a plurality of the light emitting elements are mounted by using a resin composition in liquid or paste form, in order to prevent the light emitting elements from moving from the positions due to the surface tension, each of the light emitting elements 104 is preferably bonded through individually provided bonding member 111. The thickness of the bonding member is adjusted because the suitable thickness of the bonding member differs depending on the kinds of the bonding members, or in view of the case where the bonding member expands in lateral direction by pressed at the time of mounting the light emitting element, or the case where the bonding member follows uneven contour of the base member.

(Heating Step)

The heating step is a step in which after the light emitting element 104 is positioned, the bonding member 111 is heated and the light emitting element 104 is bonded on the base member 101.

Figure 10A:
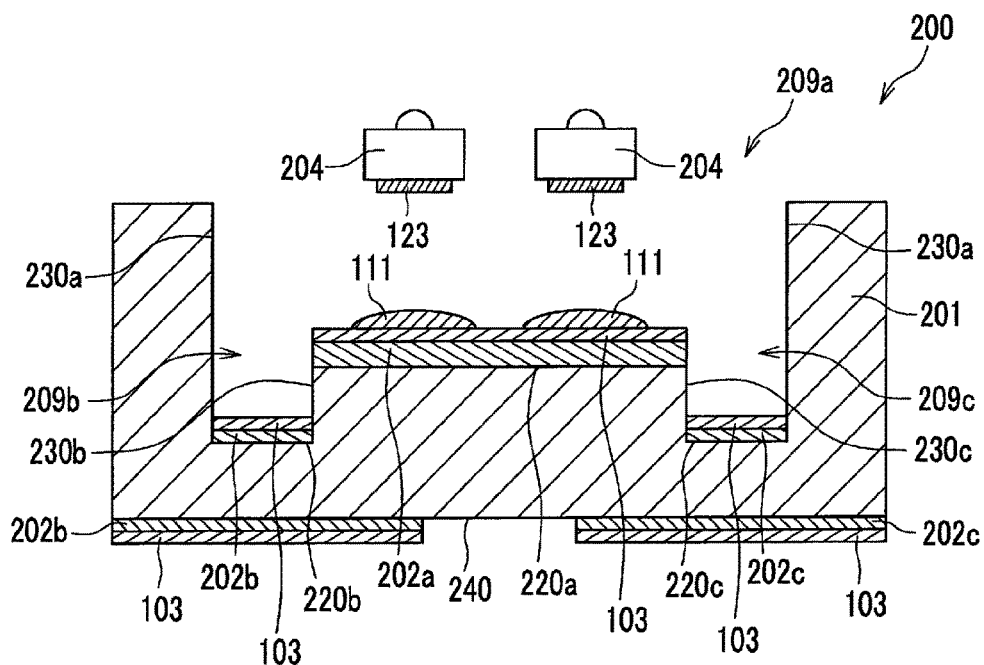
FIGS. 10(a) and 10(b) are cross sectional views illustrating manufacturing steps of a light emitting device according to the second embodiment of the present invention, and FIGS. 10(a) and 10(b) each corresponds to the cross-sectional view of the light emitting device, taken along arrow line Y-Y in FIG. 7(b).

As shown in FIG. 10(a), in the case where a FU element is used for the light emitting element, the bonding member 111 may be an insulating member, and heating in the heating step is carried out at a temperature higher than the temperature at which at least a part of the bonding member 111 is volatilized. In the case where the bonding member 111 contains a thermosetting resin, heating to a temperature higher than the curing temperature is preferable. With this, the light emitting element 104 can be bonded and fixed by the thermosetting resin.

Also, for example, in the case where a resin composition containing rosin and a low-melting-point metal are used as the bonding member 111, and where the low-melting-point metal is positioned on the electrically conductive members 102a, 102b (on the metal member 103), heating to a temperature higher than the melting of the low-melting-point metal is preferable.

Here, particularly in the case where the bonding member 111 contains rosin and the metal is disposed at the light emitting element side, for example, in the case where a metal film is formed on the sapphire plane of a gallium nitride-based semiconductor element which uses a sapphire substrate, or in the case where a metal film is formed on the silicone plane of a gallium nitride-based semiconductor element which uses a silicone substrate, due to the action of the rosin composition in the bonding member by heat and the phenomenon of interdif fusion in the metal, metallic binding between the electrically conductive members and the metal film can be formed while removing the insulating member. With this, the light emitting element can be fixed more firmly and also electric continuity can be obtained.

In the heating step, following the heating, a washing step can be further carried out. For example, in the case where a resin composition is used for the bonding member 111, after eliminating a part of the resin composition by volatilization during the heating, residual resin composition may be removed by further carrying washing or the like (residual bonding member washing step). Specifically, in the case where the resin composition contains rosin, washing is preferably carried out after heating. For the washing solution, a glycol ether system organic solvent or the like is preferably used.

<Protective Element Bonding Step>

As shown in FIG. 4(a), in the protective element joining step, after forming the metal member 103 (after forming the electrically conductive members 102a, 102b, in the case where the metal member 103 is not formed) on the base member 101, a protective element 105 is positioned and bonded on the base member 101. That is, in the protective element bonding step, the protective element 105 is disposed on the electrically conductive member 102a through the metal member 103 and bonded.

<Wire-Bonding Step>

As shown in FIG. 4(b), in the wire-bonding step, an electrode terminal at the upper portion of the protective element 105 and a portion of the electrically conductive member 102b which serves as an electrode are connected with a wire 106. The technique for connecting the wires 106 is not specifically limited and any techniques common in the art can be used.

<Filler-Applying Step>

Figure 5A:
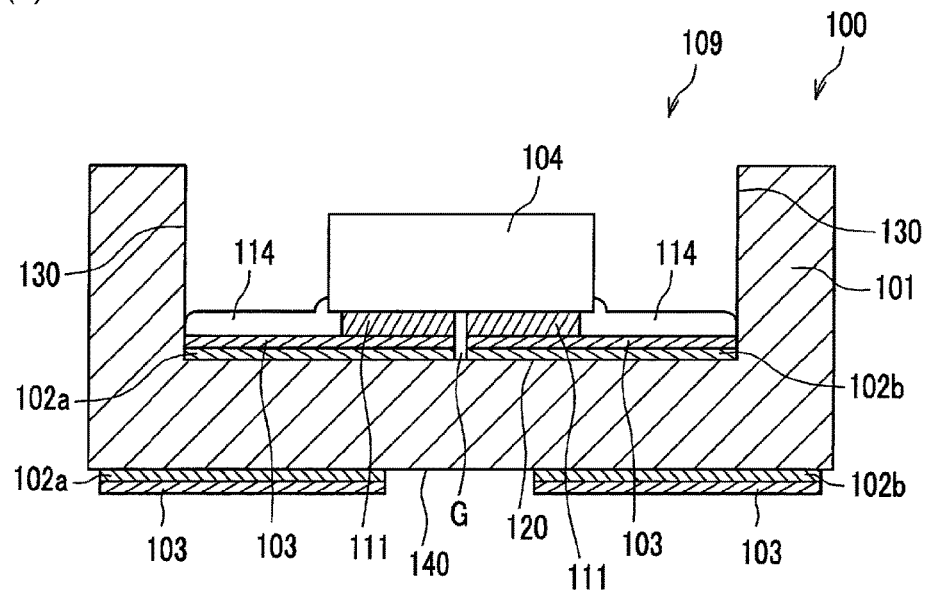
FIGS. 5(a) and 5(b) are cross sectional views illustrating manufacturing steps of a light emitting device according to the first embodiment of the present invention.

As shown in FIG. 5(a), in the filler-applying step, among the surfaces of the metal member 103 on the electrically conductive members 102a, 102b, the portions where the light emitting element 104 is not disposed are covered with the filler 114 by using an electrolytic plating technique, an electrodeposition coating technique, or an electrostatic coating technique. With this step, after mounting the light emitting element 104 using the bonding member 111, the exposed surfaces of the metal member 103 on the base member 101 (on the electrically conductive members 102a, 102b, in the case where the metal member 103 is not formed) are covered with the filler 114. At this time, at least a portion of the side surfaces and the upper surface of the transparent substrate 10 are exposed, and the side surfaces of the semiconductor layer 11 are covered with the filler 114.

Figure 5B:
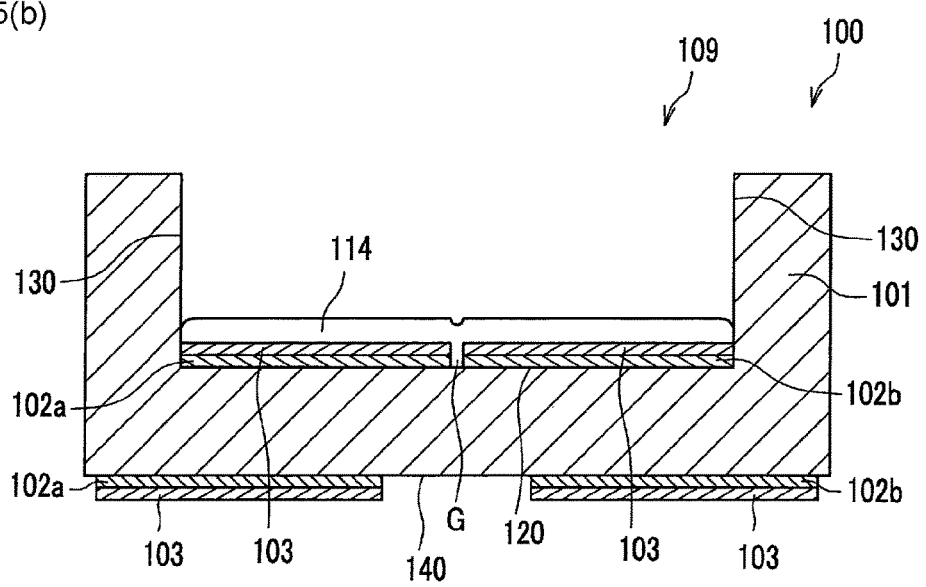
Figure 6A:
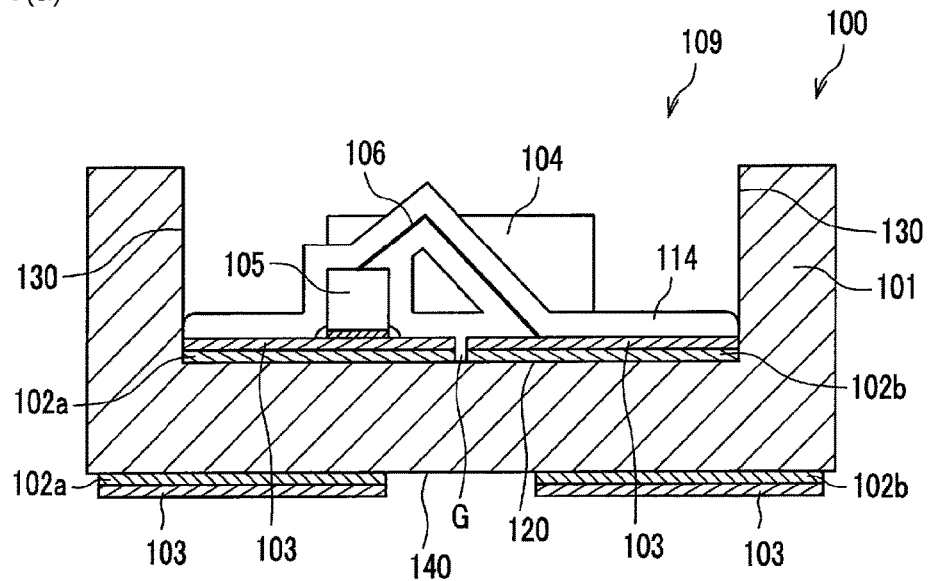
FIGS. 6(a) and 6(b) are cross sectional views illustrating manufacturing steps of a light emitting device according to the first embodiment of the present invention.
Figure 6B:
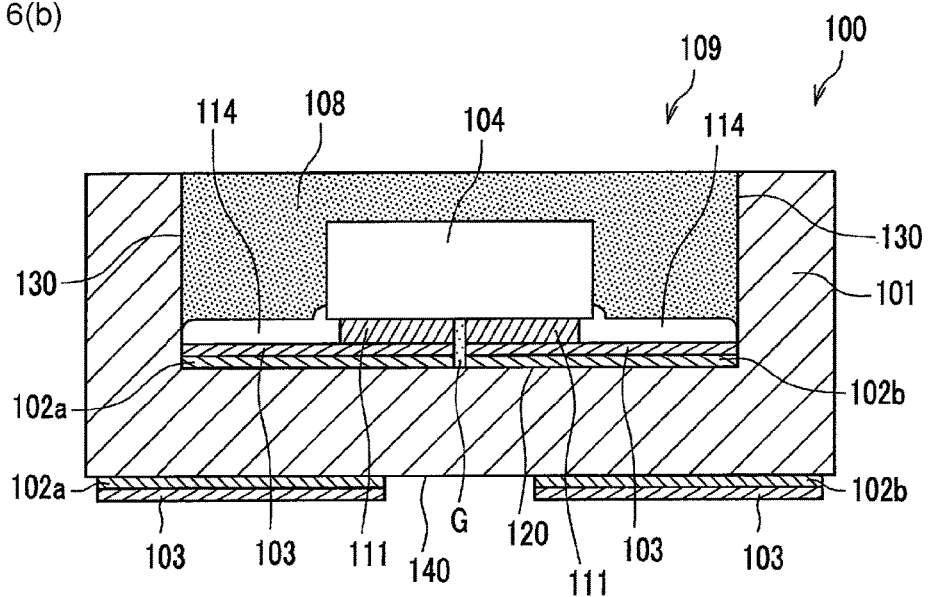

Also, as shown in FIG. 5(b), in the filler-applying step, it is preferable to also cover the groove G between the electrodes (between the electrically conductive members 102a, 102b), and further, as shown in FIG. 6(a), it is preferable to also cover the protective element 105 and the wires 106. For applying the filler 114, a deposition technique such as an electrolytic plating technique, an electrostatic coating technique, or an electrodeposition coating technique can be used.

The filler-applying step includes, for example, a step of positioning a light emitting device 100 in a solution which contains filler and a step of depositing the filler on the light emitting device 100 by using electrophoresis in the solution. In such a technique of depositing filler, in a solution, an electrode which to be arranged opposite to the light emitting device 100 is placed, and a voltage is applied to the electrode. Thus, using electrophoresis to drive electrically charged filler particles in the solution to deposit the filler 114 on the portions where the metal member 103 is exposed at the electrically conductive members 102a, 102b. The thickness of the deposited filler 114 can be appropriately adjusted by conditions and time of deposition, and is preferably at least 5·m. Further preferably the thickness is 10·m or more. By using a material having a high reflectance, a light-reflective layer is formed by the deposited filler 114. After a step of forming the filler 114 by using electrodeposition as described above, a member other than the filler 114 may be formed by using electrodeposition.

For the electrolytic solution for electrodeposition, a mixed liquid in which the filler is dispersed is used. The material of the electrolytic solution is not specifically limited as long as it allows the electrically charged filler moves in the solution by electrostatic force. For example, acid or alkali capable of dissolving the filler, for example, nitric acid containing alkaline-earth metal ion (such as $Mg^{2+}$) can be contained in the electrolytic solution. In the electrolytic solution, a metallic alkoxide may be contained. More specifically, an organic material containing an element selected from Al, Sn, Si, Ti, Y, Pb, or an alkaline-earth metal element, as its constituent element. For the material contained in the electrolytic solution, other than as described above, a mixed solution in which filler is dispersed in a sol made with a metal alcholate or a metallic alkoxide and an organic solution mixed at a predetermined ratio, may be used as the electrolytic solution. Other than above, the electrolytic solution may be a mixed solution in which, acetone as an organic solvent, and aluminum sol and filler as an organic metal material, are contained in a solution whose base solution is isopropyl alcohol. In the present embodiment, the base member is in a state of aggregate until divided in the final step, the filler 114 coating can be applied at once on a plurality of the light emitting devices and thus leads to excellent mass productivity.

<Light Transmissive Member Disposing Step>

As shown in FIG. 6(*b*), in the light transmissive member disposing step, a light transmissive member 108 is disposed on the base member 101 to cover the light emitting element 104 with the light transmissive member 108. That is, the light transmissive member 108 for covering the light emitting element 104, the protective element 105, the wires 106, and the like, is applied in the step such that, a melted resin is injected in the recess 109 of the base member 101, then, cured by applying heat or optical irradiation.

An embodiment of the present invention is described above, but the present invention is not limited thereto, various changes may be made without departing from the scope of the invention. That is, the light emitting device and the method of manufacturing the light emitting device described above are intended as illustrative of a light emitting device and a method of manufacturing the light emitting device to give a concrete form to technical ideas of the present invention, and the scope of the present invention is not limited to the light emitting device and the method of manufacturing the light emitting device described above. Furthermore, it should be appreciated that the members shown in claims attached hereto are not specifically limited to members in the embodiments. Particularly, the sizes, materials, shapes and the arrangement relationships of the members described the preferred embodiments are given as an example and not as a limitation to the scope of the invention.

For example, in the description above, a light emitting device which uses a FD element is mainly illustrates, but in the present invention, a light emitting device which uses a FU element may also be made. The number of the light emitting elements mounted on the light emitting device is appropriately adjusted and a light emitting device may include a plurality of three or more light emitting elements. Hereinafter, as a typical variant example, a light emitting device which uses a FU element and a method of manufacturing the light emitting device will be described as a second embodiment.

Second Embodiment

Figure 13:
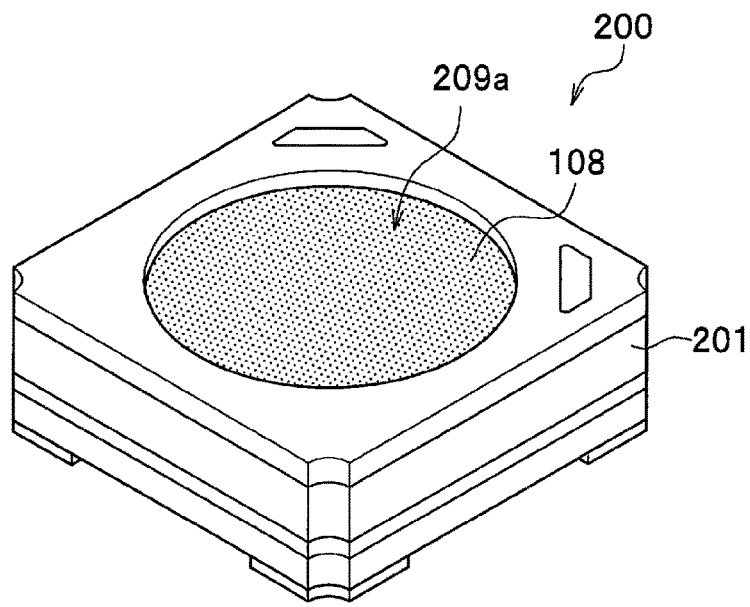
FIG. 13 is a schematic perspective view of a light source device according to a second embodiment of the present invention.

A light emitting device which uses a FU element will be described in a second embodiment. FIG. 13 shows a perspective view of an example of a light emitting device according to the present embodiment. First, a general construction of a light emitting device will be described with description of each component, then, the material or the like of each member will be described. In what follows, the different points from the above embodiment of the light emitting device 100 will be mainly described.

(General Construction)

Figure 7A:
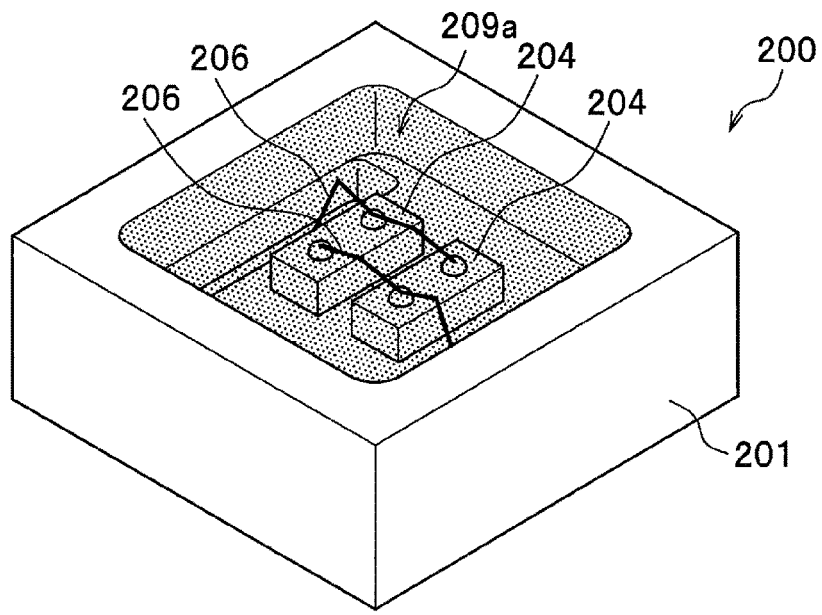
FIG. 7(a) is a perspective, part transmissive view of an example of a light emitting device according to a second embodiment of the present invention.

As shown in FIG. 7 and FIG. 8, a light emitting device 200 is a device in which at least one light emitting element 204 (two in the figures) are mounted, and mainly includes a base member 201, electrically conductive members 202*a*, 202*b*, 202*c* disposed on the base member 201, light emitting element 204 mounted on the respective portions of the electrically conductive members 202*a*, 202*b*, 202*c*, a wire 206 which connects a portion of the electrically conductive member 202*b*, which serves as an electrode, with an electrode terminal of the light emitting element 204, an insulating filler 114 which covers a metal member 103, which does not have the light emitting element 204 mounted thereon, and a lower surface of the wire 206, and a light transmissive member 108 which covers the light emitting element 204 and the filler 114. Further, in this case, a light blocking member 207 is disposed.

(Base Member)

As shown in FIG. 8(*a*), the base member 201 has a recess 209*a* which opens upward, and further has recesses 209*b*, 209*c* in the recess 209*a*, and with the recess 209*a*, the bottom surface 220*a* and the side surface 230*a* are formed. Further, with the recesses 209*b*, 209*c*, the bottom surfaces 220*b*, 220*c* and the side surfaces 230*b*, 230*c* are formed respectively, and between the bottom surfaces 220*b* and 220*c*, a step is formed. Then, on the bottom surface 220*a* of the recess 209*a*, the electrically conductive member 202*a*, on the bottom surface 220*b* of the recess 209*b*, the electrically conductive member 202*b*, and on the bottom surface 220*c* of the recess 209*c*, the electrically conductive member 202*c*, are respectively disposed.

(Electrically Conductive Member)

As shown in FIG. 8(*a*), the electrically electrically conductive members 202*b*, 202*c* are also disposed on the back surface 240 of the base member 201 so that in the base member, they are respectively electrically connected to the electrically conductive members 202*b*, 202*c* (respectively to be an electrically single member) of the bottom surfaces 220*b*, 220*c* of the recesses 209*b*, 209*c*.

(Metal Member)

As shown in FIG. 8(*a*), on the base member 201, that is, on the electrically conductive members 202*a*, 202*b*, 202*c* of the bottom surfaces 220*a*, 220*b*, 220*c* of the recesses 209*a*, 209*b*, 209*c*, the metal member 103 is disposed respectively. Also, as shown in FIG. 8(*a*), the surface of the electrically conductive members 202*a*, 202*b* disposed on the back surface 240 of the base member 201 may also be covered with the metal member 103. The metal member 103 is not disposed on the electrically conductive members 202*b*, 202*c* which are embedded in the base member 201. The metal member 103 may be disposed integrally to the electrically conductive members 202*b*, 202*c*, or the metal member 103 may be omitted.

(Light Emitting Element)

Figure 8B:
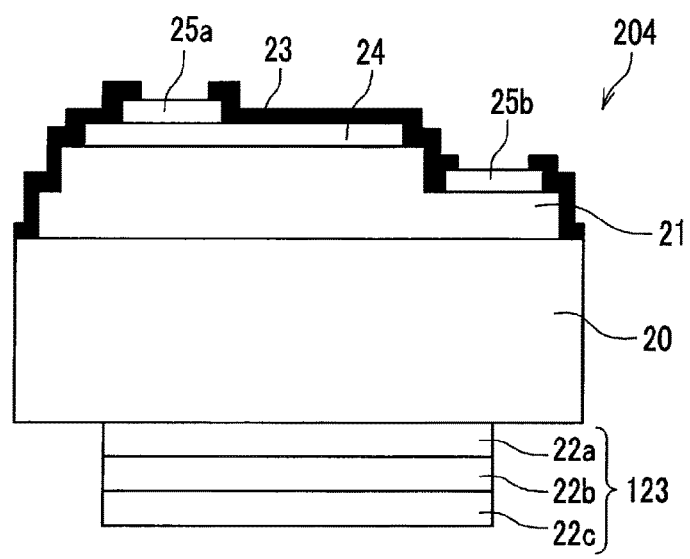
FIG. 8(b) is a schematic diagram of a light emitting element of the light emitting device shown in FIG. 7.

The light emitting element 204 is, as shown in FIGS. 8(a), 8(b), a FU element which has electrodes on its upper surface, and the lower surface of the light emitting element 204, a joining layer 123 is formed. The joining layer 123 formed on the light emitting layer 204 is connected to the bonding member 111 which is at a surface of the electrically conductive member 202a, the metal member 103, and the bonding member 111 disposed in this order on the bottom surface 220a of the recess 209a. Though, the bonding member 111 is not shown in the figures illustrating a light emitting device 200 of the second embodiment.

As shown in FIG. 8(b), the light emitting element 204 has, a base member 20 and a semiconductor layer 21 stacked on the base member 20. Further, on the back surface of the base member 20, an Ag/Pt/AuSn film (stacked in this order, from the left) with a pattern may be disposed. Also, at one side of the semiconductor layer 21, an n-electrode (n-pad electrode) 25b which is an electrode terminal is disposed, and at the other side, a p-pad electrode 25a which is an electrode terminal is disposed through the electrode 24. The pad electrodes 25a, 25b are disposed on the same side of the semiconductor layer 21, and are electrically connected to respective portions of the electrically conductive members 202b, 202c which serve as electrodes by wires 206 (see FIG. 7(b)). Then, the portions of the semiconductor layer 21 of the light emitting element 204 are covered with the insulating protective film (insulating film) 23, except for the portions for connecting to each of the pad electrodes 25a, 25b with the respective wires 206. The light emitting element 204, which is a FD element shown in FIG. 8(b), is further simplified in other figures.

In the embodiment, the width of the joining layer (the reflective layer 22a, the barrier layer 22b, and the adhesive layer 22c) is smaller than the width of the light emitting element 204, that is, the width of the substrate 20. As described above, when the width of the joining layer is smaller than the width of the substrate 20, the joining layer is not cut in the step of dividing a wafer into individual light emitting elements, and therefore, occurrence of detachment of the joining layer in the dividing step can be avoided. The joining layer 123 is, in the case where a FU element is used for the light emitting element, may be formed with a multilayer structure including a reflective layer 22a and a barrier layer 22b in addition to the adhesive layer 22c which bonds the light emitting element 204 to the base member 201.

The reflective layer 22a is a layer for reflecting light emitted by the light emitting element 204 into the substrate 20 and the semiconductor layer 21. With this arrangement, light can be extracted to outside from end surfaces of the light emitting element 204 other than that has the reflective layer 22a formed thereon. Specifically, a material such as Ag, Al, Rh, Pt, or Pd is preferably used. For example, with a use of Ag or an Ag alloy, an element having high reflectance and good light extraction can be obtained.

The barrier layer 22b is a layer for preventing diffusion of other materials, particularly the material of adhesive layer 22c. Specifically, a material having a high melt point such as W, Mo, or such as Pt, Ni, Rh, Au is preferably used.

The adhesive layer 22c is for adhering the light emitting element 204 to the base member 201. Examples of the material thereof include an alloy of In, Pb—Pd system, Au—Ga system, alloy system of Au with Ge, Si, In, Zn, or Sn, alloy system of Al with Zn, Ge, Mg, Si, or IN, alloy system of Cu with Ge or In, Ag—Ge system, and Cu—In system. Preferable example thereof include a eutectic alloy film such as an alloy whose main components are Au and Sn, an alloy whose main components are Au and Si, and an alloy whose main components are Au and Ge. Among those, AuSn is specifically preferable.

(Filler)

As shown in FIG. 8(a), of the surfaces of the metal member 103 on the electrically conductive members 202a, 202b, 202c respectively disposed on the respective bottom surfaces 220a, 220b, 220c of the recesses 209a, 209b, 209c, the portions where a light emitting element 204 is not mounted are covered with the filler 114. Further, the filler 114 covers the entire surface, such as the areas peripheral to the light emitting elements and the side surfaces of the joining layer 123 under the light emitting elements, as well as the lower surface of the wires 206. That is, of the portions of the electrically conductive members 202a, 202b, 202c, other than the regions where the light emitting elements 204 are mounted, are covered with the filler 114.

(Light Transmissive Member)

As shown in FIG. 8(a), the inner portion of the recess 209a of the base member 201 is enclosed with the light transmissive member 108. Although the light transmissive member 108 is not disposed on the portions where the light blocking member 207 is embedded, in the case where the light blocking member is not disposed, the light transmissive member 108 is disposed on those portions (in the recesses 209b, 209c). The light transmissive member 108 may be disposed as needed.

(Light Blocking Member)

The light blocking member 207 is preferably a member capable of reflecting light, and embedded in the recesses 209b, 209c of the base member 201 to cover the exposed portions of the base member 201 which are exposed at the side surfaces 230a, 230b, 230c of the recesses 209b, 209c. The exposed portions (side surfaces 230a, 230b, 230c) of the base member 201 may become a source of optical transmission loss which causes optical loss while allowing light to pass therethrough. Therefore, disposing the light blocking member 207 having light reflective function on those portions enables to prevent the loss due to transmission and absorption of light. As described above, the side walls of the base member 201 and at least a portion of the filler 114 are preferably covered with the light blocking member 207. With this arrangement, light from the light emitting elements 204 is reflected by the light blocking member 207, and thus the light extracting efficiency can be improved. The light blocking member 207 is not limited to that described in the present embodiment, and may be used in the light emitting devices according to the first embodiment.

As shown in FIG. 8(a), in the inner portion of the recesses 209b and 209c of the base member 201, the light blocking member 207 is embedded. The light blocking member 207 is preferably disposed so that the recesses 209b, 209c are entirely embedded, and is further preferably disposed so that the exposed portions of the side surfaces 230a are entirely covered.

The light blocking member 207 is a member capable of efficiently reflecting light emitted from the light emitting element 204 and preferably made of an insulating material that absorbs little light and has high resistance against light and heat. Examples of such material include a silicone resin, an epoxy resin, and a urea resin. In addition to these materials, a coloring agent, a light diffusing agent, a light reflecting material, a filler, a fluorescent material or the like may also be contained as needed. The light blocking member 207 can be made of a single member, or made with two or more of plurality of layers.

With the light emitting device 200 described above, while the light emitting device 200 is in operation, among light from the light emitting element 204 propagating in all directions, light propagating upward is extracted to outside above the light emitting device 200. Light propagating downwardly or laterally is reflected at the bottom surfaces 220a, 220b, 220c or at the side surfaces 230a, 230b, 230c of the recesses 209a, 209b, 209c of the base member 201, or at the light blocking members 207, and extracted to outside above the light emitting device 200. At this time, because the filler 114 is applied on the metal members 103 on the electrically conductive members 202a, 202b, 202c and the conductive portion (conductive body) of the wires 206 and the like, the absorption of the light by those portions can be suppressed and also light can be reflected by the filler 114. Thus, light from the light emitting element 204 can be extracted efficiently.

<<Method of Manufacturing Light Emitting Device>>

Next, a method of manufacturing a light emitting device according to the second embodiment of the present invention will be described below with reference to the accompanying drawings. In the present embodiment, a single light emitting device is illustrated, but the base member is processed as an aggregate until divided into individual units in the final step, and thus the external side surfaces of the base member are created by the dividing.

Figure 7B:
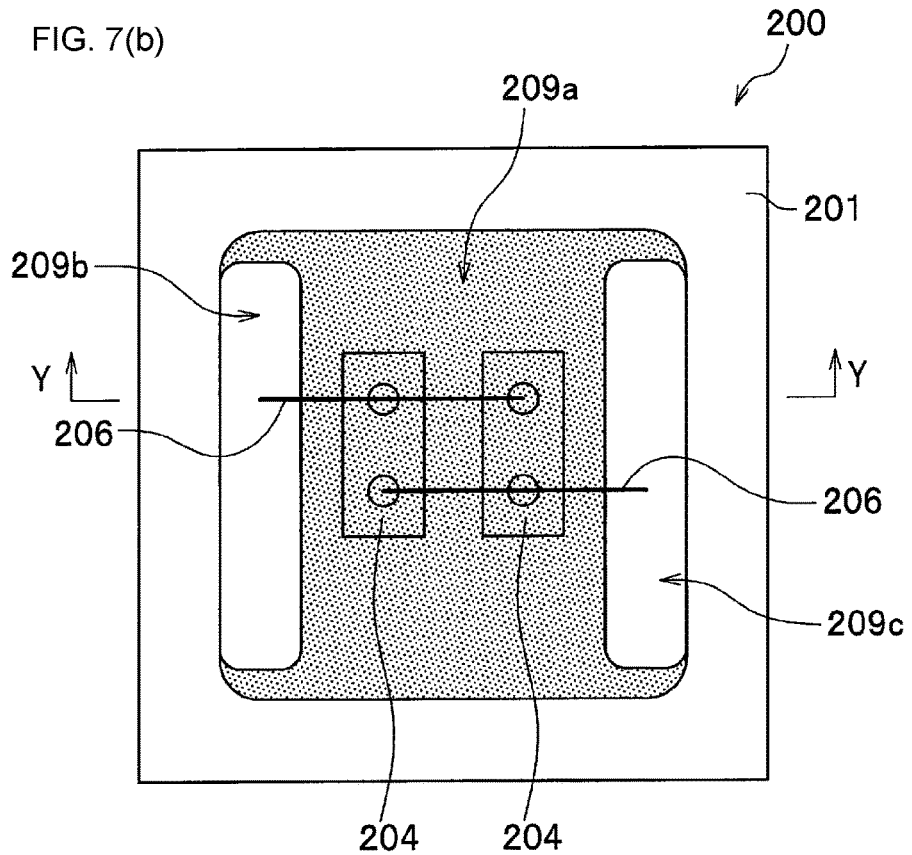
FIG. 7(b) is a plan, part transmissive view, viewed from the light emitting surface side of the light emitting device shown in FIG. 7(a).

FIGS. 9 to 12 are cross sectional views illustrating steps of manufacturing a light emitting device 200, and correspond to the cross-sectional view of the light emitting device, taken along arrow line Y-Y in FIG. 7(b). FIG. 9 to FIG. 12 illustrate a step sequence of manufacturing a light emitting device 200, and basically, the manufacturing is carried out in sequence from FIG. 9(a) to FIG. 12.

One method of manufacturing a light emitting device 200 according to the present invention includes an electrically conductive member forming step, a die-bonding step, a filler-applying step, and a light transmissive member forming step. In the second embodiment, a FU element is used, so that a wire-bonding step is included. Also, in the second embodiment, a light-blocking member 207 is disposed, so that a light-blocking member forming step is included. Hereinafter, each step will be described below.

<Electrically Conductive Member Forming Step>

Figure 9A:
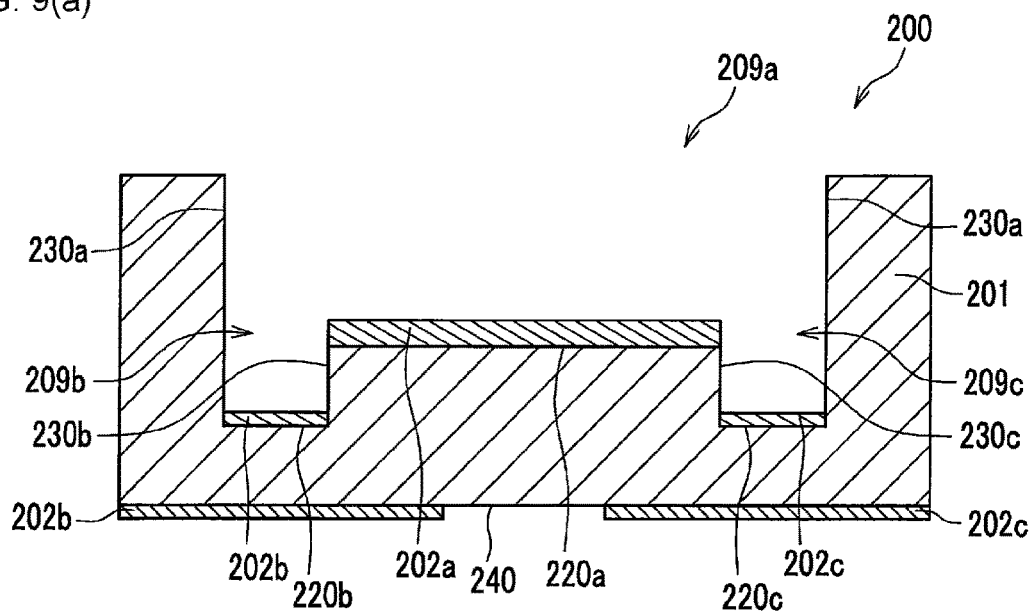
FIGS. 9(a) and 9(b) are cross sectional views illustrating manufacturing steps of a light emitting device according to the second embodiment of the present invention, and FIGS. 9(a) and 9(b) each corresponds to the cross-sectional view of the light emitting device, taken along arrow line Y-Y in FIG. 7(b).
Figure 9B:
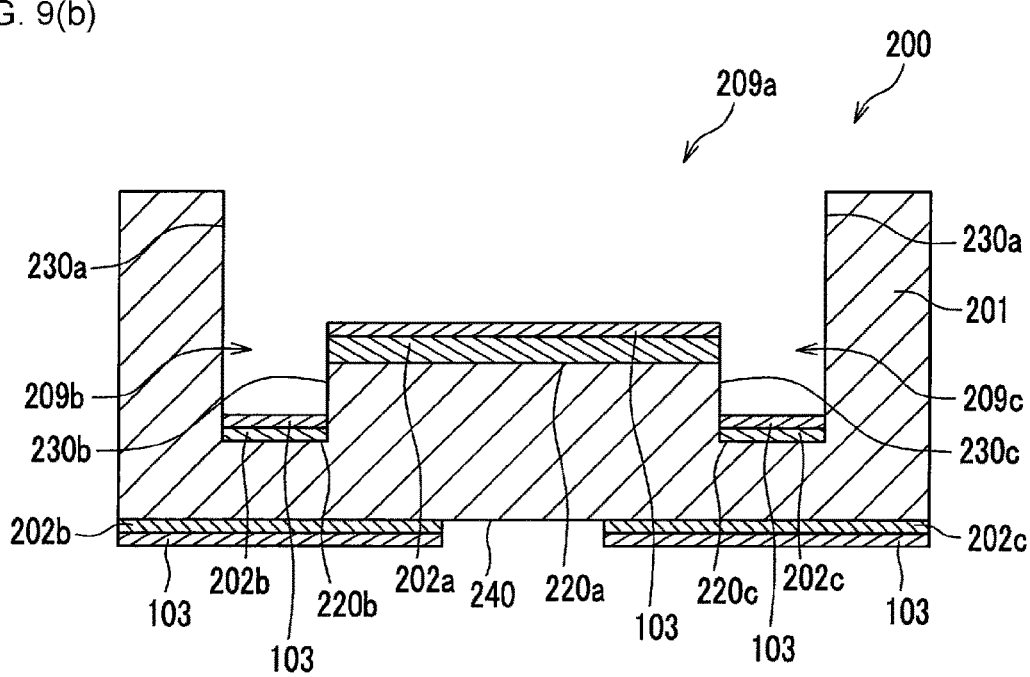

As shown in FIG. 9(a), the electrically conductive member forming step is a step of forming the electrically conductive members 202a, 202b, 202c on the base member 201. In the case where the electrically conductive members 202b, 202c are formed on the back surface 240 of the base member 201, they are formed in this step. That is, in this step, the electrically conductive members 202a, 202b, 202c are disposed on the base member 201. Those others than as described above are carried out as in the same manner as that in the first embodiment.

<Metal Member Forming Step>

As shown in FIG. 9(a), the metal member forming step is a step of forming the metal member 103, which allows bonding, on the electrically conductive members 202a, 202b, 202c formed on the base member 201. In the case where the electrically conductive members 202b, 202c are also formed on the back surface 240 of the base member 201, they are formed in this step. That is, in this step, the metal member 103 is disposed on the surfaces of the electrically conductive members 202a, 202b, 202c. Those others than as described above are carried out as in the same manner as that in the first embodiment.

<Die-Bonding Step>

As shown in FIG. 10(a), the die-bonding step is a step of mounting a light emitting element 204, in the die-bonding step, a light emitting element 104 is mounted and bonded on the base member 201 (on the electrically conductive members 202a) having the metal member 103 formed thereon. That is, in this step, the light emitting element 204 is mounted and bonded through the bonding member 111 on the bottom surface 220a of the recess 209a of the base member 201. Those others than as described above are carried out as in the same manner as that in the first embodiment.

<Wire-Bonding Step>

Figure 10B:
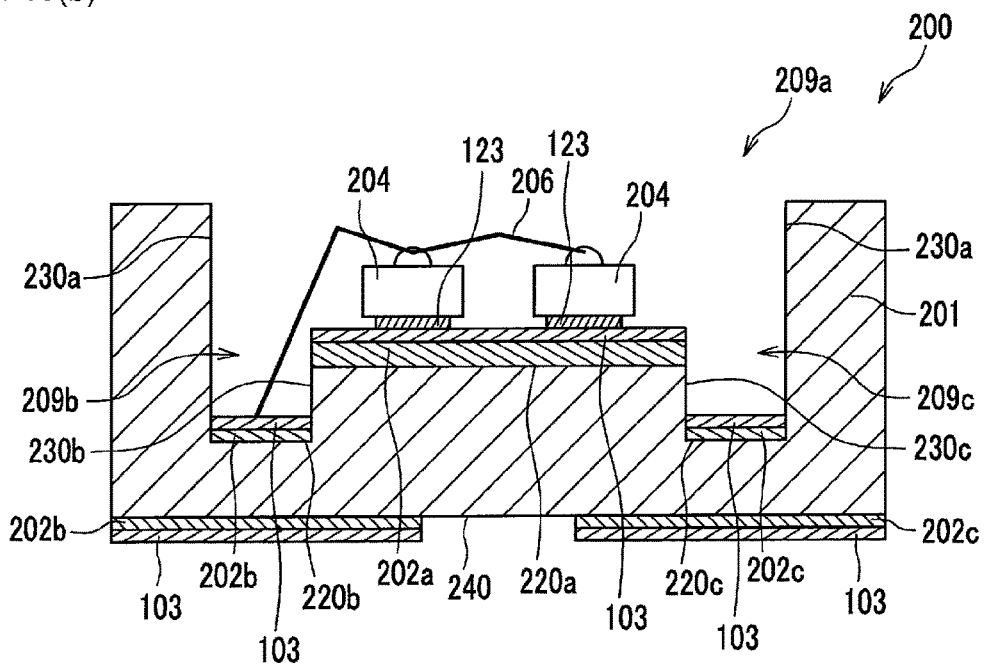

As shown in FIG. 10(b), the wire-bonding step includes, using a wire 206, electrically connecting a portion on the electrically conductive member 202b which serves as an electrode and an electrode terminal (pad electrode) at an upper portion of the light emitting element 204. In the same manner, the step includes, using a wire 206, electrically connecting an electrode terminal (pad electrode) at an upper portion of the light emitting element 204 and a portion on the electrically conductive member 202c which serves as an electrode (not shown). Those others than as described above are carried out as in the same manner as that in the first embodiment.

<Filler-Applying Step>

Figure 11A:
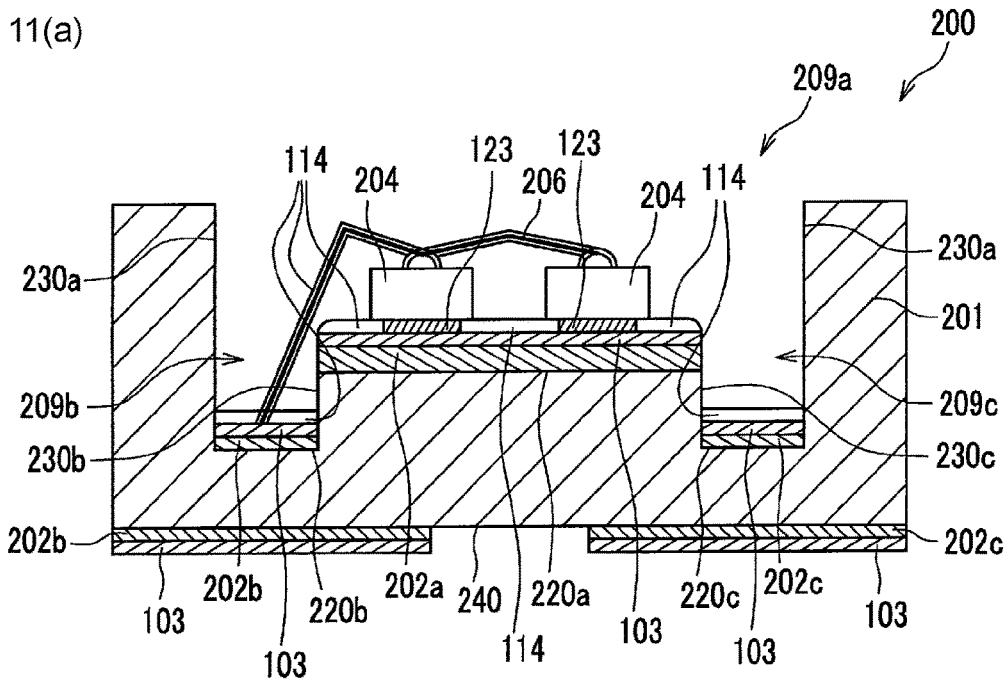
FIGS. 11(a) and 11(b) are cross sectional views illustrating manufacturing steps of a light emitting device according to the second embodiment of the present invention, and FIGS. 11(a) and 11(b) each corresponds to the cross-sectional view of the light emitting device, taken along arrow line Y-Y in FIG. 7(b).

As shown in FIG. 11(a), the filler applying step includes, among the surfaces of the metal member 103 on the electrically conductive members 202a, 202b, 202c, applying a filler 114 to cover the portions where the light emitting element 204 is not disposed, by using an electrolytic plating technique, an electrodeposition coating technique, or an electrostatic coating technique. In this step, after the light emitting elements 204 are bonded, the surfaces of the metal member 103 respectively formed on the electrically conductive members 202a, 202b, 202c, and electrically conductive portions of other members are covered with the filler 114. Also, the surfaces such as the electrically conductive portions of the light emitting elements 204 and the lower surface of the wires 206 are preferably covered with the filler 114. Those others than as described above are carried out as in the same manner as that in the first embodiment.

<Light-Blocking Member Forming Step>

Figure 11B:
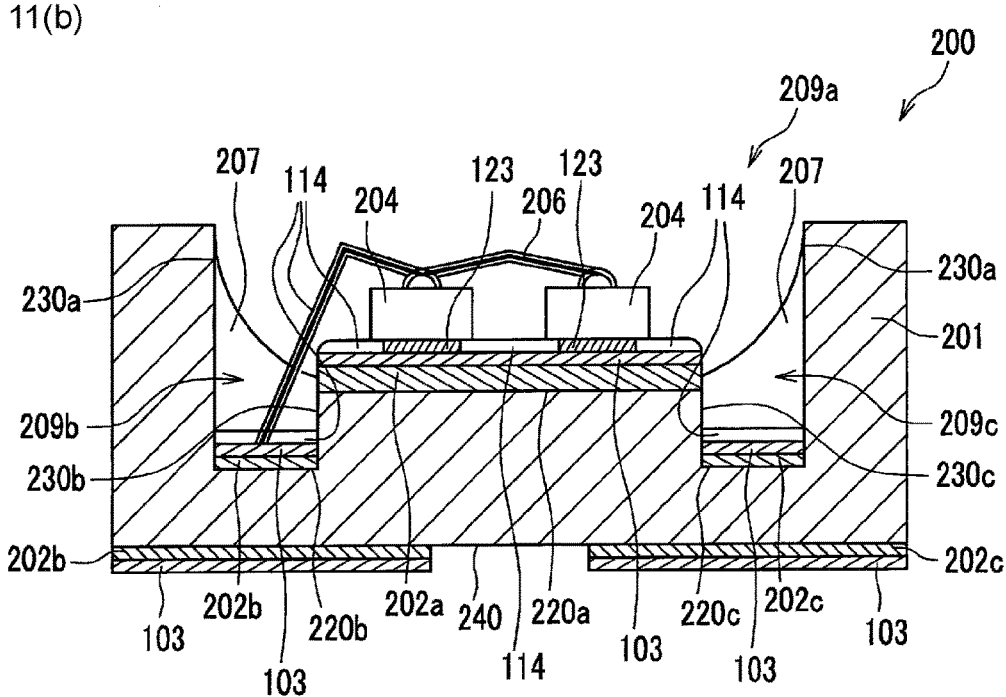

As shown in FIG. 11(b), a light-blocking member forming step includes forming a light blocking member 207 in the recess 209b, 209c of the base member 201 to cover the filler 114. This step is for covering the exposed portions of the base member 201 which are exposed on the side surfaces 230a, 230b, 230c of the recesses 209b, 209c with the light blocking member 207. Moreover, the light blocking member may be formed to cover entire exposed portions of the side surface 230a of the recess 209. Covering those regions with the light blocking member 207 enables, as described above, to prevent optical loss caused by passing of light from the exposed portions of the base member 201. The light blocking member 207 may be omitted according to the configuration or combination of other members. A resin is preferably used for such a light blocking member 207, and may be formed by using a potting technique, a printing technique, or the like.

<Light Transmissive Member Forming Step>

Figure 12:
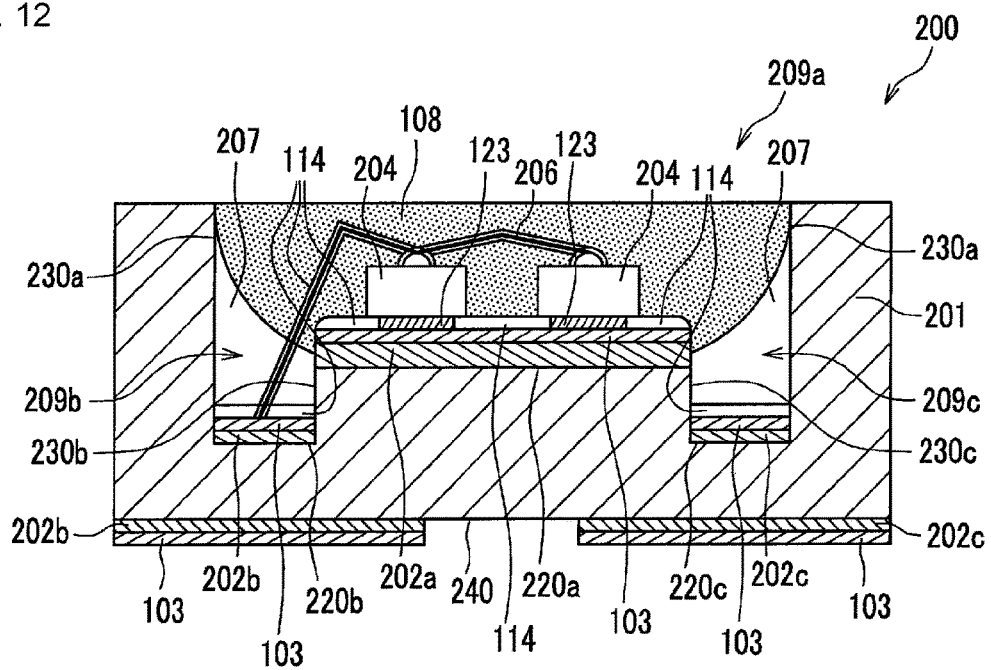
FIG. 12 is a cross sectional view illustrating a manufacturing step of a light emitting device according to the second embodiment of the present invention, and corresponds to the cross-sectional view of the light emitting device, taken along arrow line Y-Y in FIG. 7(b).

As shown in FIG. 12, in the light transmissive member forming step includes forming a light transmissive member 108 on the base member 201 and covering the light emitting elements 204 with the light transmissive member 108. That is, in this step, the light transmissive member 108 for covering the light emitting elements 204, wires 206, or the like, is formed in the recess 209a of the base member 201 and cured. The light transmissive member forming step is performed in the same manner as that described in the first embodiment except that, in the case where a light blocking member (for example, a resin capable of reflecting light of an emission wavelength) 207 is formed, the light transmissive member 108 is formed in the recess 209a of the base member 201 after the light blocking member 207 is formed.

Third Embodiment

A light emitting device which uses a FD element will be described in a third embodiment. First, a general construction of a light emitting device will be described with description of each component, then, the material or the like of each member will be described. In what follows, the different points from the above embodiment of the light emitting device 100 will be mainly described.

<General Construction>

Figure 14A:
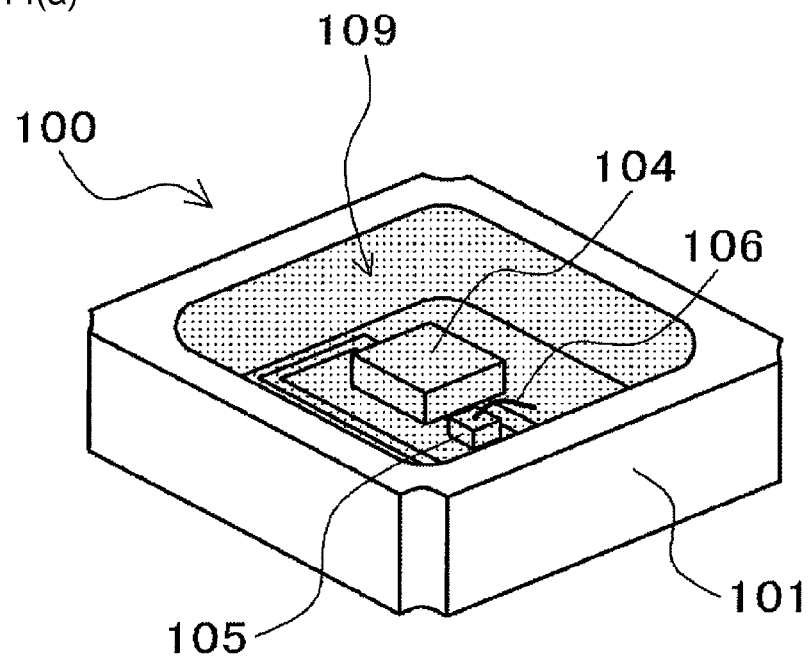
FIG. 14(a) is a perspective, part transmissive view of an example of a light emitting device according to a third embodiment of the present invention.
Figure 14B:
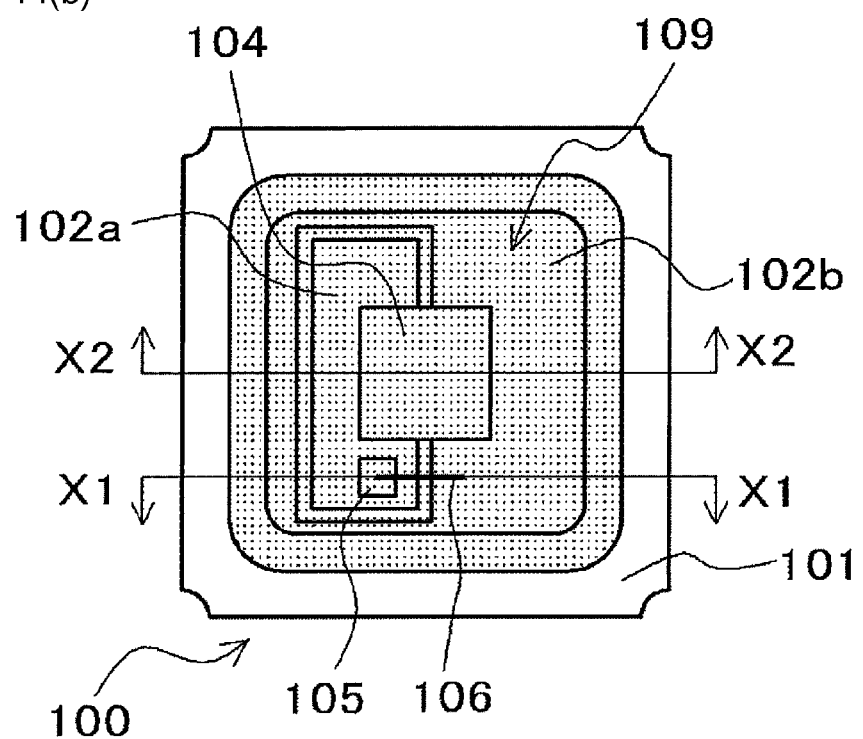
FIG. 14(b) is a plan, part transmissive view, viewed from the light emitting surface side of the light emitting device shown in FIG. 14(a).

As shown in FIG. 14 and FIG. 15, the light emitting device 100 includes a light emitting element 104 having a semiconductor layer 11 and a transparent substrate 10, a reflective member 114 applied so that at least a portion of a side surface and the upper surface of the transparent substrate 10 are exposed and a side surface of the semiconductor layer 11 is covered therewith, and the light transmissive member 108 which covers the portions of the transparent substrate 10 exposed from the reflective member 114.

In the present embodiment, as shown in FIG. 14 and FIG. 15, the light emitting device 100 has at least one light emitting element 104 (one is shown in the figures), and mainly equipped with a base member 101 having a recess 109, electrically conductive members 102a, 102b disposed on the bottom surface of the recess 109, the electrically conductive member 102b disposed on the side surfaces of the recess 109, a light emitting element 104 mounted on the bottom surface of the recess 109, a reflective member (in the embodiment, an insulating filler 114 is used) covering at least a portion of the surfaces of the electrically conductive members 102a, 102b which do not have the light emitting element mounted thereon, and a light transmissive member 108 covering the light emitting element 104. Further, in this case, a protective element 105 and a wire 106 are disposed.

(Base Member)

Figure 15A:
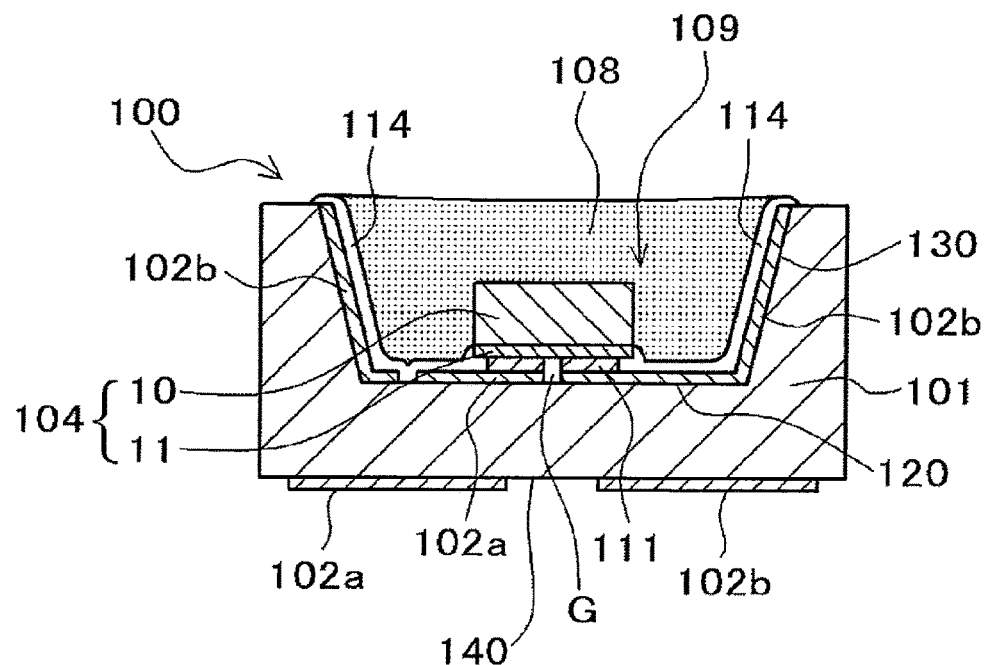
FIG. 15(a) is a cross-sectional view of the light emitting device, taken along arrow line X2-X2 in FIG. 14(b)

As shown in FIG. 15(a), the base member 101 has a recess 109 which opens upward, and the bottom surface 120 and the side surface 130 are formed by the recess 109. The electrically conductive members 102a, 102b are disposed on the bottom surface 120 of the recess 109, and the electrically conductive member 102b is disposed on the side surfaces of the recess 109.

Also, the light emitting element 104, the conductive wire 106, and the like, are disposed in the recess 109. Accordingly, the recess 109 is needed to have a size which allows directly mounting the light emitting element by using a die-bonding equipment or the like, and which allows establishing of electrical connection with the light emitting element by using such as wire-bonding, but the shape of the recess 109 is not specifically limited. Examples of the shape the opening of the recess include, when viewed from the opening side, an approximately quadrangle shape and a circular shape. Also, the angle of the side surfaces 130 is not specifically limited. For example, the side surfaces may be tapered to a wider dimension toward the opening, may have a paraboloidal surface, or may be configured approximately perpendicular to the bottom surface 120.

(Electrically Conductive Member)

As shown in FIG. 15(a), the electrically conductive member disposed on the side surfaces (side walls) 130 of the recess 109 may be such that, one of the electrically conductive members 102a, 102b is extended to the side surfaces (side walls) 130 in the recess 109, or other electrically conductive member is disposed. That is, the electrically conductive members 102a and 102b disposed on the bottom surface 120 are generally to function as electrodes, but the electrically conductive member disposed on the side surface 130 may not necessarily serves as an electrode.

The electrically conductive member 102a is disposed in an island shape on the bottom surface 120 of the base member 101, and the electrically conductive member 102b is disposed so that the peripheral portion of the electrically conductive member 120a and the side surfaces 130 are covered in continuous manner. That is, in the light emitting device according to the present embodiment, the electrically conductive member 102b disposed on the side surfaces 102b have negative polarity.

According to the light emitting device of the present invention, the electrically conductive member is disposed on the side surfaces 130 of the recess 109, so that using a technique such as electrodeposition coating, the filler 114 can be disposed on the side surfaces of the recess 109 uniformly and with a high density. Also, disposing the electrically conductive member on the side surfaces enables to prevent light from leaking out from the side surfaces of the recess.

(Filler)

Moreover, the filler 114 is also disposed on the surface of the electrically conductive members 102b disposed on the side surfaces 130 of the recess 109. The exposed portions of the semiconductor layer 11 of the light emitting element 104 and the side surfaces of the bonding member 111, and the groove (G) of the slit in the conductive portion are covered with the filler 114.

Figure 15B:
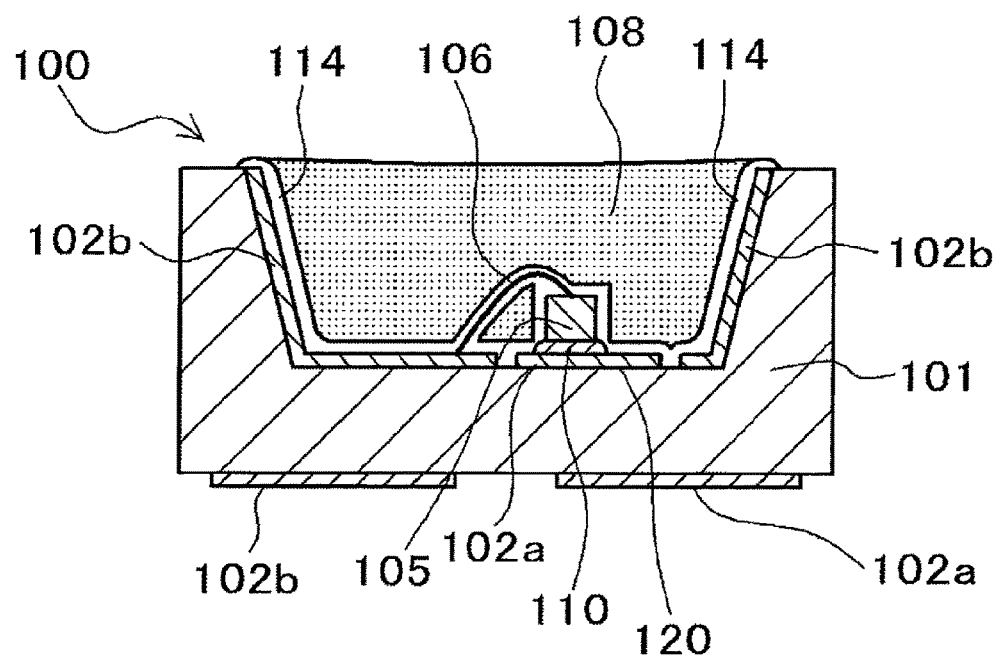
FIG. 15(b) is a schematic diagram of a light emitting element of the light emitting device, taken along arrow line X1-X1 in FIG. 14(b).

As shown in FIG. 15(a), in the case where the electrically conductive member 102b is disposed to the top edge portion of the side surfaces 130 of the recess 109, with using electrodeposition coating technique which to be described later, the filler 114 can be disposed to cover the electrically conductive members 102b which are exposed at the upper surface of the base member. Moreover, when the light transmissive member 108 is filled, the light transmissive member is impregnated in the filler 114 locates at the upper surface of the base material. The filler 114 and the light transmissive member 108 bulging out on the upper surface as described can be left as they are, or the upper surface of the base member 101 can be polished so that the light transmissive member 108 and the filler 114 are not bulging out from the uppermost surface of the base member 101. Also, as shown in FIG. 15(b), as described in the first embodiment, the protective element 105 is also covered with the filler 114.

<<Method of Manufacturing Light Emitting Device>>

Next, a method of manufacturing the light emitting device according to a third embodiment of the present invention will be described. One method of manufacturing a light emitting device 100 according to the present invention includes an electrically conductive member forming step, a die-bonding step, a filler applying step, and a light transmissive member forming step. In the first embodiment, the metal member 103 and the protective element 105 are disposed, so that a metal member forming step, a protective element joying step, and a wire-bonding step are included.

In what follows, the different points from the method of manufacturing of first embodiment will be mainly described.

In this embodiment, a electrically conductive member is disposed on the bottom surface and the side surfaces of the recess and the light emitting element 104 is mounted on the bottom surface of the recess. In the metal member forming step, a technique such as plating technique, sputtering technique, vapor deposition technique, or a technique of bonding a thin film, can be used. Also, in the filler-applying step, among the surfaces of the electrically conductive members 102a, 102b, the portions which do not have the light emitting element 104 mounted, including the side surfaces 130 of the recess 109, are covered with the filler 114. Those others than as described above are carried out as in the same manner as that in the first embodiment, description thereof will be omitted below.

Figure 30:
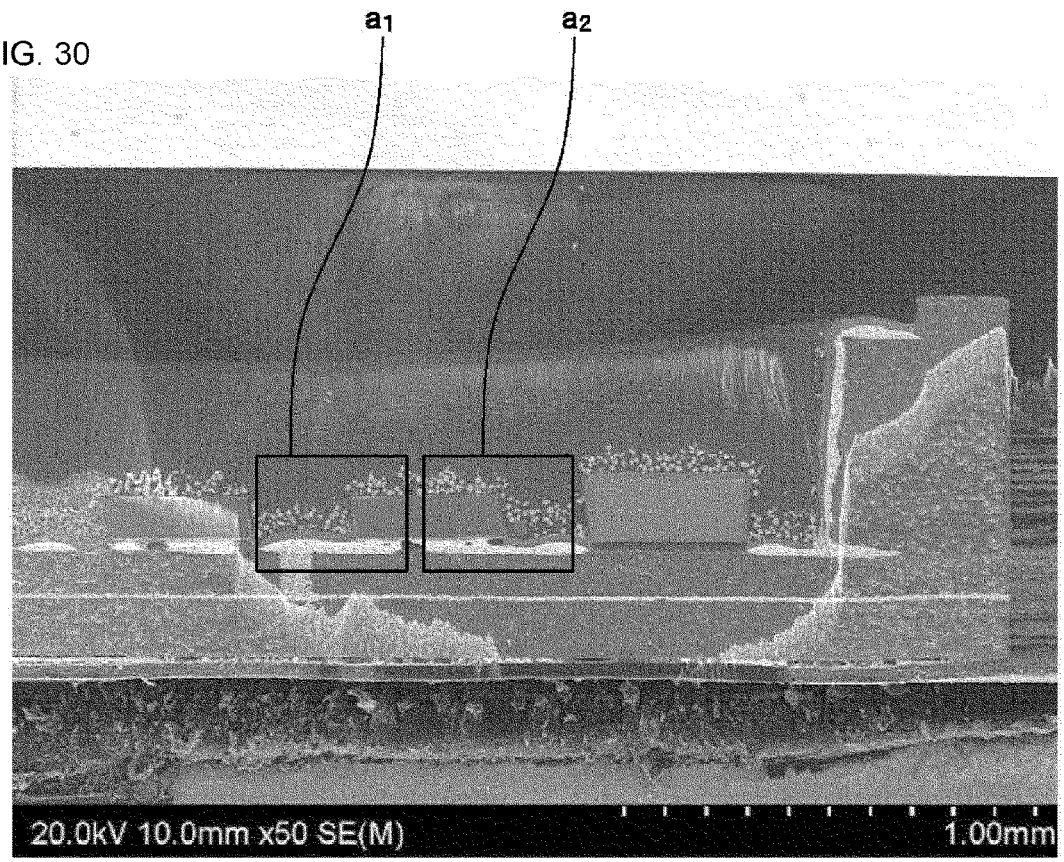
FIG. 30 is a SEM image according to a third embodiment.
Figure 31A:
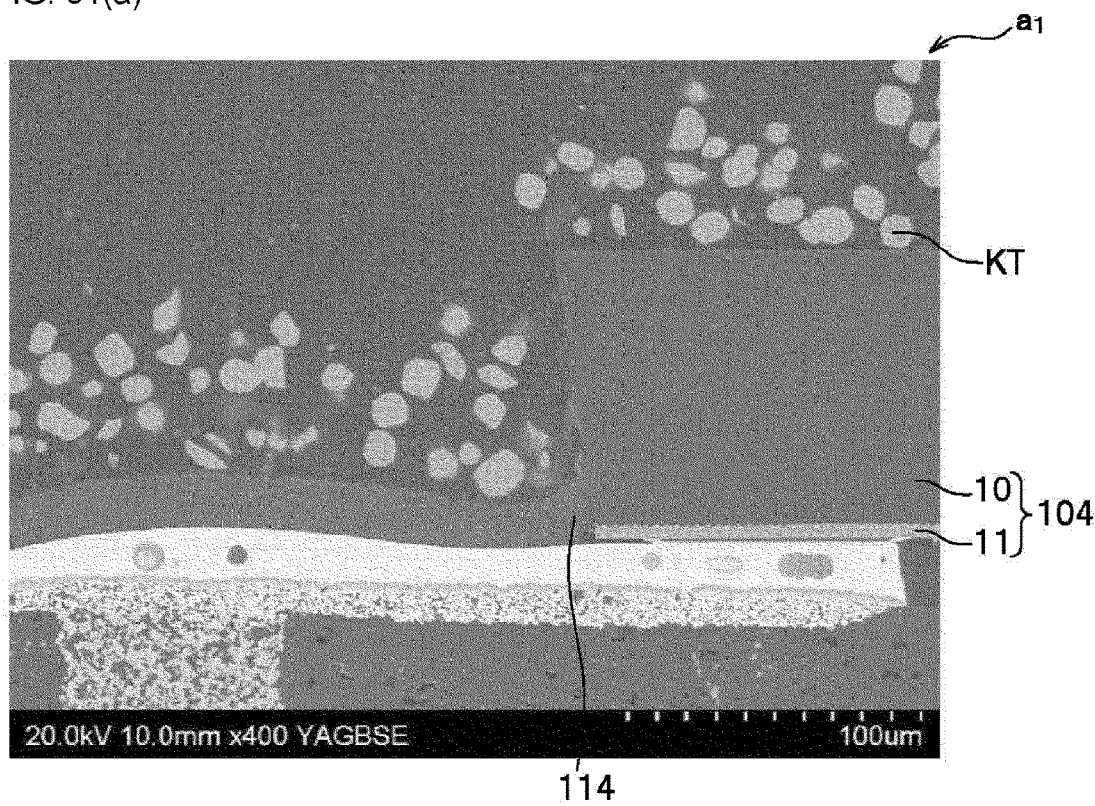
FIGS. 31(a) and 31(b) are each partially enlarged image near a side surface of the light emitting device shown in FIG. 30.
Figure 31B:
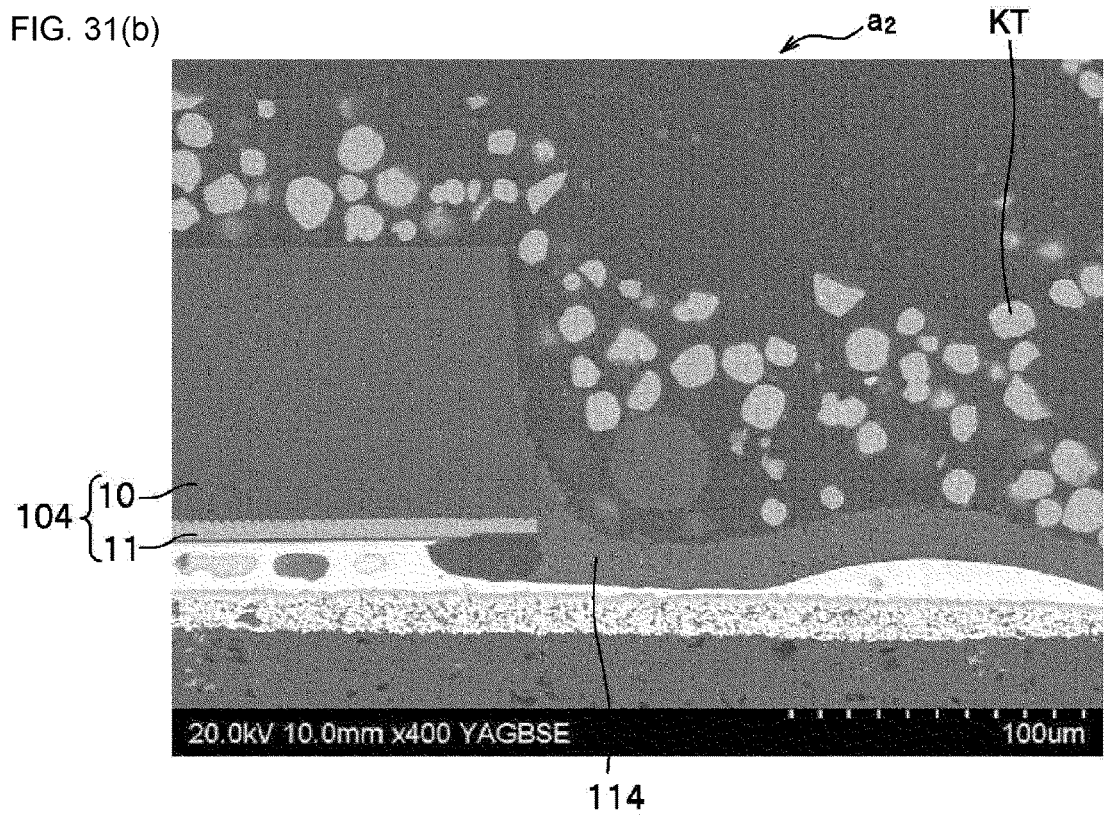

Next, SEM images of the light emitting device 100 of the third embodiment will be shown in FIG. 30, FIG. 31. FIGS. 31(a), 31(b) are partially-enlarged views of the areas indicated as a1, a2 in FIG. 30, respectively. Here, FIG. 30 is a secondary electron image and FIG. 31 is a reflection electron image. As shown in FIG. 30, FIG. 31, at least a portion of the side surfaces and the upper surface of the transparent substrate 10 are exposed, and the side surfaces of the semiconductor layer 11 are covered with the reflective member (filler) 114. In the image, "KT" indicates a fluorescent material.

Fourth Embodiment

Figure 18A:
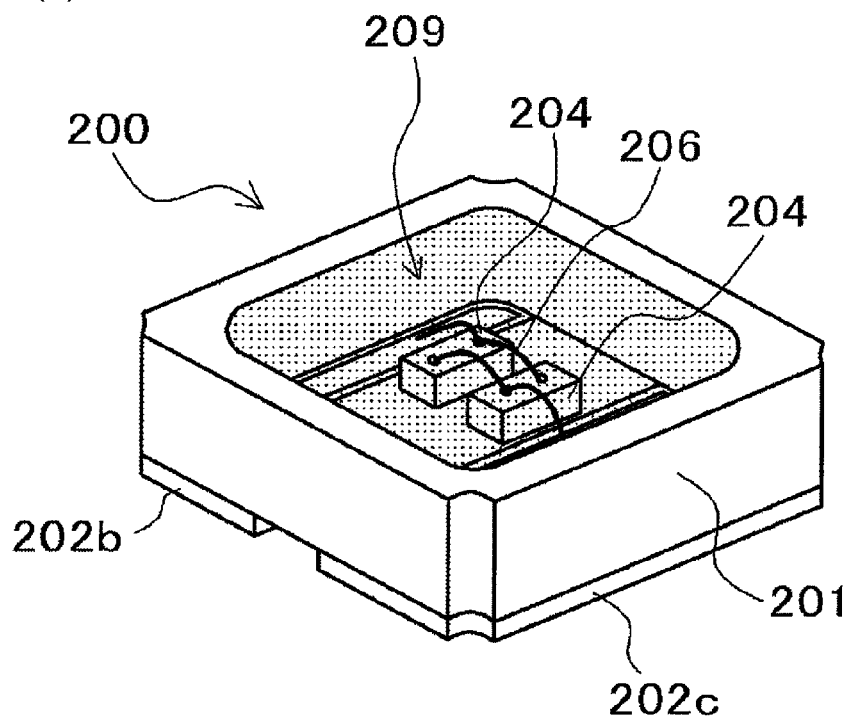
FIG. 18(a) is a perspective, part transmissive view of an example of a light emitting device according to a fourth embodiment of the present invention.

A light emitting device which uses a FU element will be described in a fourth embodiment. FIG. 18(a) shows a perspective view of an example of a light emitting device according to the present embodiment. First, a general construction of a light emitting device will be described with description of each component, then, the material or the like of each member will be described. In what follows, the different points from the above embodiment of the light emitting device 200 will be mainly described. Though, the metal member 103 and the bonding member 111 are not shown in the figures illustrating a light emitting device 200 of the fourth embodiment.

<General Construction>

Figure 18B:
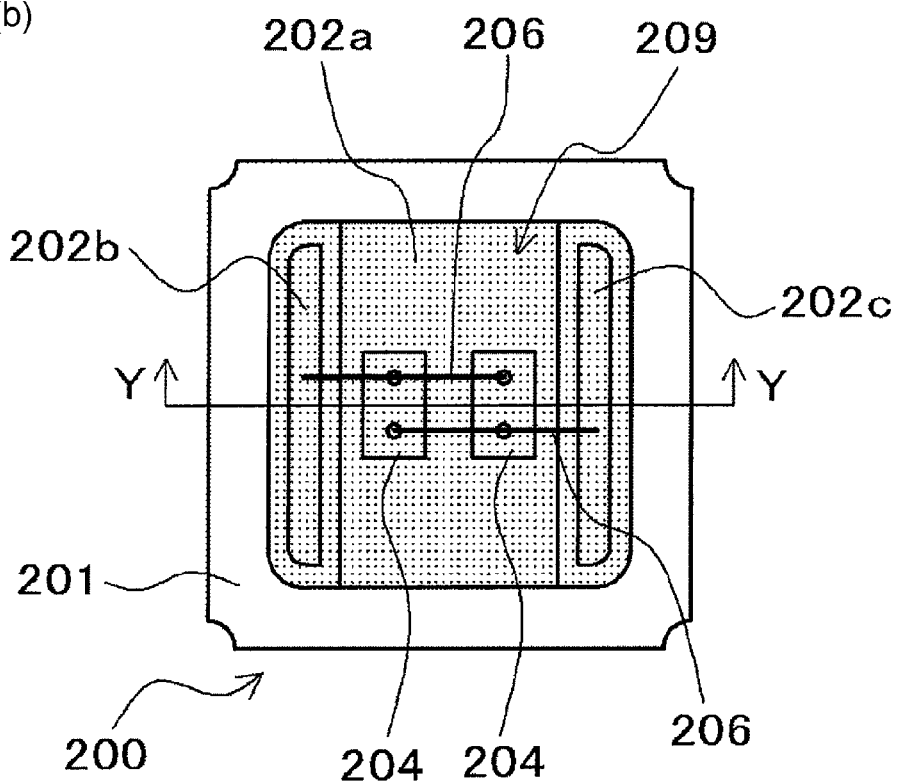
FIG. 18(b) is a plan, part transmissive view, viewed from the light emitting surface side of the light emitting device shown in FIG. 18(a).
Figure 19:
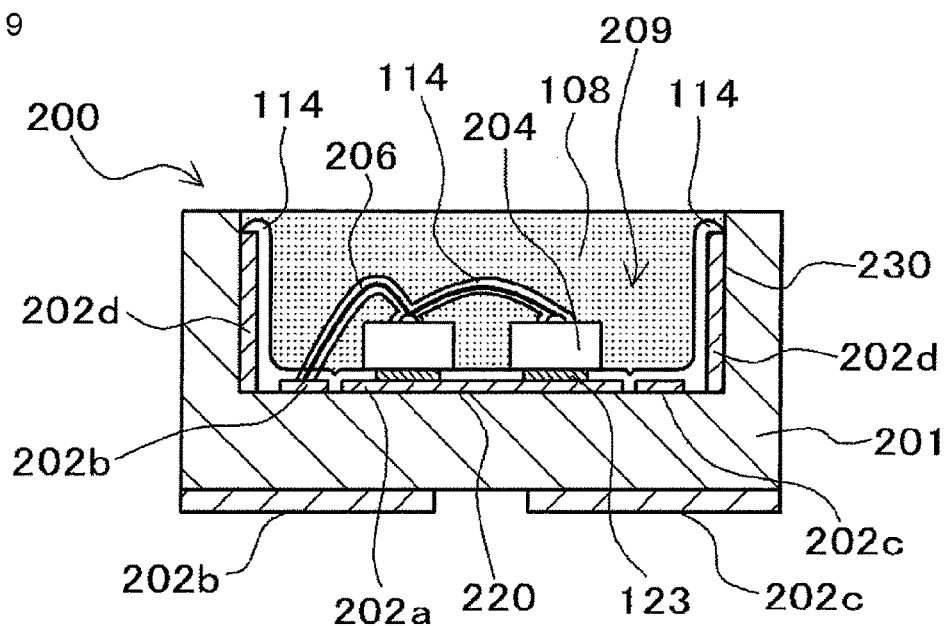
FIG. 19 is a cross-sectional view of the light emitting device, taken along arrow line Y-Y in FIG. 18(b).

As shown in FIG. 18 and FIG. 19, a light emitting device 200 is a device in which at least one light emitting element 204 (two in the figures) are mounted, and mainly includes a base member 201, electrically conductive members 202a, 202b, 202c which are disposed on the base member 201, light emitting elements 204 mounted on the respective portions of the electrically conductive members 202a, 202b, 202c, a wire 206 which connects a portion of the electrically conductive member 202, which serves as an electrode, with an electrode terminal of the light emitting element 204, insulating filler 114 which covers the electrically conductive members which do not have the light emitting element 204 mounted thereon, and a lower surface of the wire 206, and a light transmissive member 108 which covers the light emitting element 204 and the filler 114.

(Base Member)

As shown in FIG. 19, the base member 201 has a recess 209 which opens upward, and the bottom surface 220 and the side surface 230 are formed by the recess 209. The electrically conductive member 202a, the electrically conductive member 202b, and the electrically conductive member 202c are disposed on the bottom surface 220 of the recess 209. Also, the electrically conductive member 202d is disposed on the side surfaces 230 of the recess 209.

(Electrically Conductive Member)

As shown in FIG. 19, the electrically electrically conductive members 202a, 202b are also disposed on the back surface of the base member 201 so as to be respectively electrically connected to the electrically conductive members 202a, 202b (respectively to be an electrically single member) in the base member 202. Moreover, the electrically conductive member 202c does not serve as an electrode, and is spaced apart from the bottom surface 220 and covers the side surfaces of the recess 209.

(Filler)

As shown in FIG. 19, among the surfaces of the metal member on the electrically conductive members 202a, 202b, 202c disposed on the bottom surface 220 of the recess 209, the portions which do not have the light emitting element 204 mounted thereon are covered with the filler 114. Moreover, the electrically conductive member 202d disposed on the side surfaces 230 of the recess 209 is also covered with the filler 114. Further, the filler 114 covers the entire surface of the wire 206, and also covers the peripheral region of the light emitting elements 204 and also the side surfaces of the joining layer 123 under the light emitting elements 204. That is, of the portions of the electrically conductive members 202a, 202b, 202c, other than the regions where the light emitting elements 204 are mounted, are covered with the filler 114.

<<Method of Manufacturing Light Emitting Device>>

Next, a method of manufacturing the light emitting device according to a fourth embodiment of the present invention will be described. One method of manufacturing a light emitting device 200 according to the present invention includes a step of forming electrically conductive members, a step of die-bonding, a step of applying filler coating, and a step of forming a light transmissive member. In the fourth embodiment, a FU element is used, so that a wire-bonding step is included. In what follows, the different points from the method of manufacturing of the second embodiment will be mainly described.

In the step of forming a electrically conductive member, the electrically conductive members 202a, 202b, 202c, and 202 d are formed on the base member 201. In the step of forming a metal member, the metal member is formed on the electrically conductive members 202a, 202b, and 202c on the base member 201. In the case where the metal member is also formed on the electrically conductive members 202a, 202b which are on the back surface 240 of the base member 201, they are formed in this step. In the die-bonding step, the light emitting element 204 is mounted through the bonding member 111 on the metal member on the bottom surface 220 of the recess 209 of the base member 201. In the step of wire-bonding, a portion on the electrically conductive member 202a which serves as an electrode and an electrode terminal (pad electrode) at an upper portion of the light emitting element 204 are electrically connected by a wire 206. In the same manner, in this step, the electrode terminal (pad electrode) on the light emitting element 204 and a portion on the electrically conductive members 202b, 202c which serve as electrodes are respectively electrically connected by wires 206.

In the step of applying filler coating, among the surfaces on the electrically conductive members 202a, 202b, 202c, 202d, the portions which do not have the light emitting element 204 mounted thereon are covered with the filler 114. According to this step, after the light emitting element 204 were bonded, the surfaces of the electrically conductive members 202a, 202b, 202c, 202d, and the conductive portions of other members are covered with the filler 114. Also, the surfaces such as the conductive portions of the light emitting elements 204 and the surface of the wire 206 are preferably covered with the filler 114. Also, it may be such that, the surfaces of the electrically conductive members are covered with the metal member and the filler 114 covering is applied thereon. Those others than as described above are carried out as in the same manner as that in the first embodiment and the second embodiment, description thereof will be omitted below.

Other Variant Examples of Third, and Fourth Embodiments

As an example of other variant examples of the third and the fourth embodiments, a construction will be described below, in which, the upper end portion of the recess of the base member has a region on which a electrically conductive member is not disposed. For example, in the third embodiment and the fourth embodiment, examples in which the electrically conductive member is disposed on the entire side surfaces of the recesses 109, 209 are described, but the electrically conductive member may not be disposed on a portion of the side surfaces of the side surfaces 130, 230 of the recesses.

Particularly, on the side surfaces of the recess, a portion abutting on the top edge surface of the recesses 109, 209 preferably has a region on which the electrically conductive member is not disposed. With this arrangement, at the time of such as electrodeposition coating, deposition of the filler on the upper surface of the base members 101, 201 can be prevented, so that it can be prevented from becoming a cause of irregularity in height. In the case where the filler is disposed on the upper surface of the base member 101, 201, at the time of filling the light transmissive member 108 in the recess, the light transmissive member may be impregnated in the filler, which may result in the resin bulging out on the upper surface of the base member. Particularly, a resin which has tack properties such as a silicone resin may cause troubles in which, for example, the light emitting devices stick together, or foreign substances may be attached on the resin bulged on the upper surface of the base member during the manufacturing steps. Therefore, it is preferable that the resin is not disposed on the upper surface of the base member.

Further, it is preferable that at the top edge surface side of the recess, a step is formed at the side surface of the recess 130, 230 and the side surface of the step has a region where the electrically conductive member is not formed. Next, an example will be described in which a step is disposed in the third embodiment.

In the light emitting device 100 of FIG. 16, at the top edge surface side of the recess 109, a step 150 is formed on the side surfaces 130 of the recess 109, and the side surfaces 160 of the step 150 have a region where the electrically conductive member 102b is not formed. As described above, the electrically conductive member is formed on the bottom surface 170 of the steps while a region where the electrically conductive member is not formed is formed at the upper end portions of the recess 109. Thus, the filler covering can be applied also near the upper end portion of the recess 109. The filler for covering the electrically conductive member is disposed on the step 150, and thus the filler 114 and the light transmissive member 108 can be prevented from bulging out from the upper surface of the base member 101.

At this time, the shortest distance between the bottom surface 170 of the step and the surface of the light transmissive member 180 is preferably ⅕ or less with respect to the height of the recess 109. If the distance between the bottom surface 170 of the step and the top edge surface of the recess 109 is large, the region where the electrically conductive member is not formed increases. Here, the filler 114 is not formed on the region where the electrically conductive member is not formed, so that the light irradiated on the side surface 160 of the step is absorbed in the base member 101. Particularly, an electrically conductive member having a low reflectance such as tungsten is typically used for the interface between the electrically conductive member and the base member in terms of adhesion, so that leaked light into the base member reflects diffusely in the base member and absorbed in the electrically conductive member which has a low reflectance.

For this reason, the side surface 160 of the step is arranged so that as little as light is irradiated thereon. Light propagates in the light transmissive member 180, so that in the recess 109, from the portion where the light emitting element 104 is mounted to the portion on the side surface 160 of the step is formed narrower to narrow the pathway of light. With this arrangement, even if the amount of filled light transmissive member is increased, leakage of light can be reduced to minimum. Here, as shown in FIG. 16, the shortest distance K1 between the bottom surface 170 of the step and the surface of the light transmissive member 180 is ⅕ or less with respect to the height K3 of the recess 109. With this arrangement, little light is allowed to propagate to outside. Here, over the bottom surface 170 of the step, a distance K2 which is the thickness of the electrically conductive member 102b (in some cases, further with a metal member) plus the thickness of deposition of the filler 114 is set. The smaller the K1-K2, the less light propagates to the outside, so that is preferable, and K1=K2 is more preferable. Further, K2 is preferably set so that it is not higher than the upper surface. Also, the surface of the light transmissive member 108 preferably has a recessed shape. With the recessed shape, the upper surface of the resin will not become higher than the upper surface of the base member 101 or 201, so that problems such as sticking of the light emitting devices with each other can be avoided.

Figure 17A:
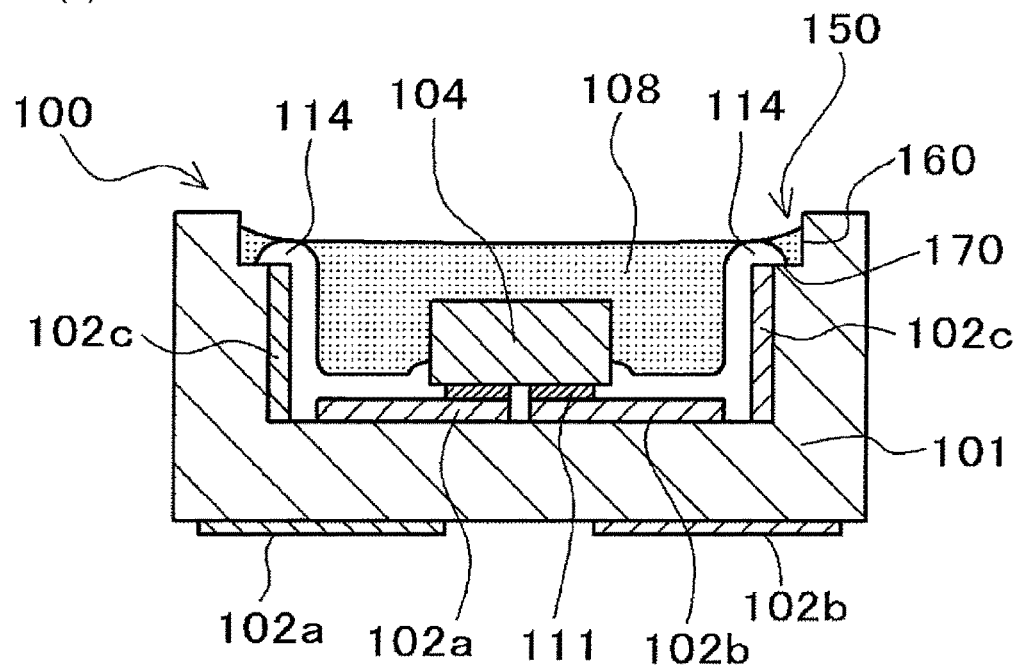
FIGS. 17(a) and 17(b) are cross-sectional views of yet another example of a light emitting device according to a fourth embodiment of the present invention.
Figure 17B:
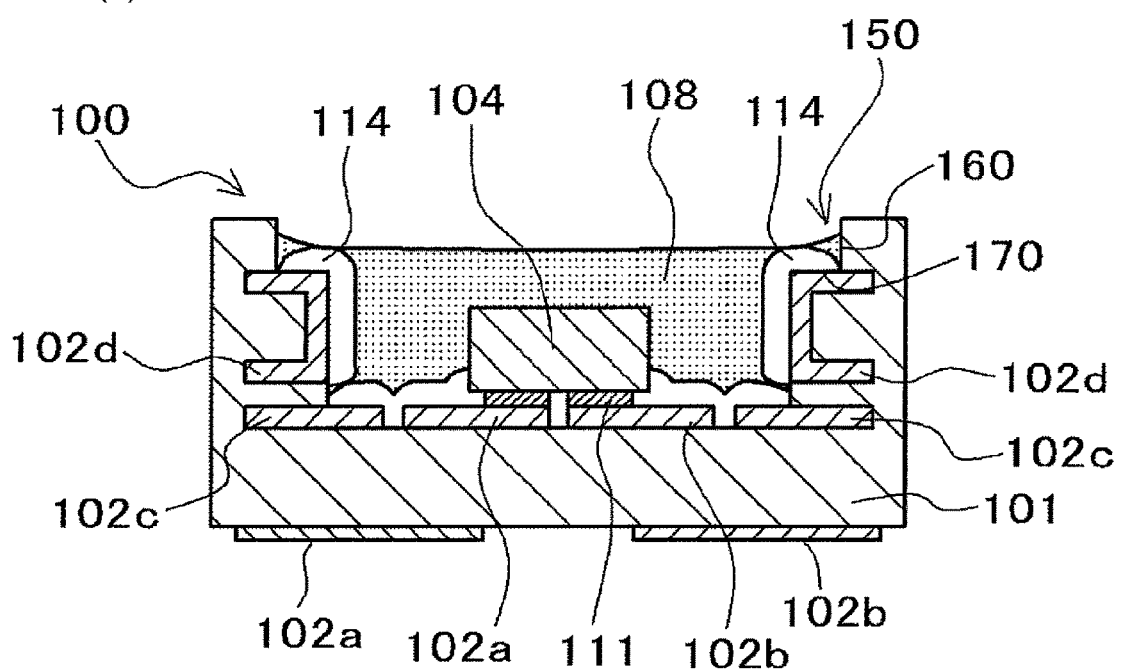

In FIG. 17(*a*), the shape of the electrically conductive member of the light emitting device shown in FIG. 16 is changed, and other portions are the same as in FIG. 16. In the light emitting device 100, an electrically conductive member is disposed on a portion of the bottom surface of the step 150. In other words, the bottom surface of the step has a region where the upper surface of the electrically conductive member is exposed, and a region where the electrically conductive member is not exposed. In addition, through the bonding member 111, the light emitting element 104 is mounted in a bridged manner on the electrically conductive members 102a and 102b formed on the bottom surface of the recess. Further, on the side surfaces of the recess, the electrically conductive member 102c is formed so as to be spaced apart from the electrically conductive members 102a, 102b at the bottom surface. The electrically conductive member on the side surfaces may be formed by using any technique, for example, by using a metalization technique.

Also in FIG. 17(*a*), the shape of the electrically conductive members of the light emitting device shown in FIG. 16 is changed, and other portions are the same as in FIG. 16. In the light emitting device 100, an electrically conductive member is not formed below the electrically conductive member 102d formed on the side surfaces, so that electrical insulation with respect to the electrically conductive members formed on the bottom surface of the recess can be maintained. For example, a base material made of a co-fired ceramics may be used.

Other Variant Examples

For example, the base members 101, 201 having a recess 109 or recesses 209, 209a, 209b, 209c are illustrated, but in other variant examples, a planar base member which does not have the recess 109 or recesses 209, 209a, 209b, 209c may be used. In such case, the light transmissive member 108 is sufficient to be deposited on the upper surface of the planar base member. Further, in this case, a configuration in which the light transmissive member 108 is not disposed may be employed.

In the first and the third embodiment, a protective element 105 is provided, but in the second and the fourth embodiments, a construction having a protective element may have employed, and further, in the first to the fourth embodiments, a protective element such as a Zener diode may be disposed. Further, in the first to fourth embodiments, constructions having one or two light emitting elements 104, 104 (204, 204) are disposed, but respectively, three or more of the light emitting elements may be disposed. Also, in the case where two or more of plurality of the light emitting elements are provided to a single light emitting device, each of the light emitting element may have a different emission wavelength. For example, a light emitting device may have three light emitting elements respectively emitting three primary colors of RGB.

In the light emitting device 200, the width of the joining layer 123 (reflective layer 22a, barrier layer 22b, and adhesion layer 22c) disposed at the lower surface side of the light emitting element 204 is smaller than the width of the light emitting element 204, however, the present invention is not limited thereto. For example, the width of the joining layer 123 disposed at the lower surface side of the light emitting element 204 and the width of the light emitting element 204 may be modified to the same. This facilitates covering of the side surfaces of the joining layer 123 with the filler 114.

In addition, the light emitting device 100 (200) according to the embodiments described above has a light emitting element 104 (204) capable of emitting light of visible region, but a construction having a light emitting element capable of emitting ultraviolet light or infrared light may be employed. Further, in the present embodiment, the light transmissive member 108 is filled to cover (seal) the whole recess, but the light transmissive member 108 may be applied to cover each single light emitting element 104 (204) or to cover a plurality of light emitting elements at once.

In the method of manufacturing light emitting device, for performing the present invention, a step other that those as described above may be included between or before or after each of the steps in a manner that does not adversely affect each of the steps. For example, other steps such as a step of washing base member in which the base member 101 or 201 is washed, a step of removing undesired substances such as dust, and a step of adjusting mounting position in which the mounting position of the light emitting element 104, 204 or the protective element 105 is adjusted. The variant examples described above may be used appropriately in accordance with the five and the sixth embodiments to be described later and their variant examples.

Next, as those embodiments which do not use the base member, the fifth and sixth embodiments will be described and then variant examples according to the fifth and sixth embodiments will be described. The light emitting device according to those embodiments will be indicated by reference numerals 100A to 300A. In what follows, the different points from that in the first to fourth embodiments will be mainly described.

Fifth Embodiment

Figure 20:
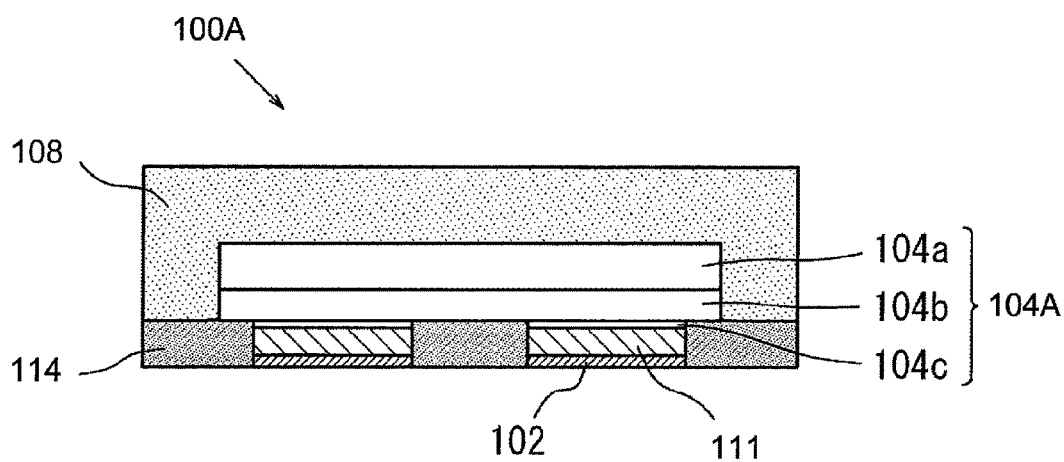
FIG. 20 is a schematic cross-sectional view showing a semiconductor device according to a fifth embodiment of the present invention.
Figure 21:
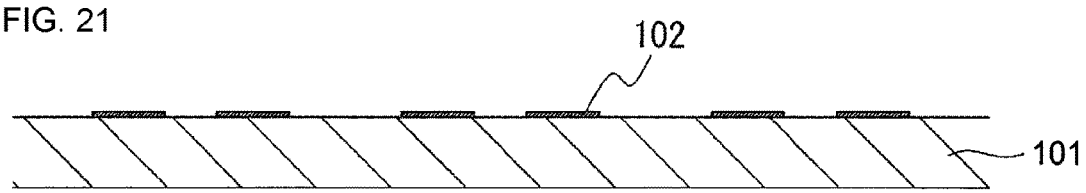
FIG. 21 is a diagram illustrating a manufacturing step of a light emitting device according to the fifth embodiment of the present invention.

FIG. 20 is a schematic cross-sectional view showing a light emitting device according to a fifth embodiment of the present invention.

<Structure of Manufacturing Light Emitting Device>

In the present embodiment, a light emitting device 100A includes a light emitting element 104A having electrodes 104c disposed on the surface of the semiconductor layer 104b, electrically conductive members 102 respectively connected to corresponding electrodes 104c of the light emitting element 104A, a reflective member 114 covering peripheral portions of the electrodes 104c of the light emitting element 104A and the electrically conductive members 102, and a light transmissive member 108 covering an upper surface which is opposite to the surface where the electrodes 104c are disposed, and the side surfaces of the light emitting element 104A.

The light emitting element 104A includes a semiconductor layer 104b formed on one main surface of a transparent substrate 104a which has a pair of main surfaces at opposite sides. Moreover, the positive electrode and negative electrode (hereinafter may be referred to as electrodes) are formed on the surface of the semiconductor layer 104b. In the light emitting device 100A of the present invention, the light emitting element 104A is disposed so that the transparent substrate 104a side, which is opposite side to the electrodes forming surface. More specifically, in the light emitting element 100A shown in FIG. 20, the upper surface of the transparent substrate 104a serves as the upper surface of the light emitting element 104A. On the lower surface of the transparent substrate 104a, the semiconductor layer 104b which includes a first semiconductor layer, an active layer, and a second semiconductor surface in this order is stacked. The negative electrode or the positive electrode is disposed on the first semiconductor layer or the second semiconductor layer, respectively. The electrodes 104c of the light emitting element 100A are preferably formed with a metal with high reflectivity, and for example, the electrodes containing Ag or Al are suitable. With this arrangement, light from the light emitting element 104A can be reflected at the electrodes 104c and extracted from the transparent substrate side 104a.

The electrically conductive members 102 are, for example, formed by using plating, and adhered respectively to the positive electrode or negative electrode of the light emitting element 104A through an electrically conductive die-bonding member 111. The electrically conductive members 102 are respectively connected to the light emitting element 104A and serve as the electrode terminals of the light emitting device 100A. The lower surface of the electrically conductive members 102 are exposed outside and constitute a portion of the outer surface of the light emitting device 100A.

The reflective member 114 has insulating property and covers at least the sides surfaces of the conductive portions such as the electrically conductive members 102 and die-bonding members 111. In the present embodiment, the reflective member 114 further covers the side surfaces of the electrodes 104c of the light emitting element 104A. Further, the reflective member 114 is extendedly disposed at the lower portion so as to be exposed at the side surfaces of the light emitting device 100A.

The light transmissive member 108 is disposed on the light emitting element 104A and the reflective member 114 which is disposed on the peripheral area of the light emitting element 104A. The light transmissive member 108 may contain a fluorescent material or the like. In the present embodiment, the light transmissive member 108 covers the upper surface and side surfaces of the transparent substrate 104a and the side surfaces of the semiconductor layer 104b of the light emitting element 104A. The interface between the light transmissive member 108 and the reflective member 114 is disposed approximately the same height as or higher than the interface between the electrodes 104c and the semiconductor layers 104b.

As described above, in the light emitting device 100A according to the present embodiment, the side surfaces of the electrically conductive members 102 and the die-bonding members 111 are covered with the reflective member 114. With such arrangements, optical loss due to light from the light emitting element 104a entering the electrically conductive members 102 and die-bonding members 111 can be reduced. As shown in FIG. 20, it is preferable that approximately entire surface of the lower surface of the light transmissive member 108 is covered with the reflective member 114. The light propagating downwardly from the light emitting element 104A is reflected by the reflective members 114 having high reflectance or the electrodes 104c, thus light can be extracted efficiently. Also, generally, in a light source using a light emitting element and a wavelength converting member, the light emitting element is mounted on a package made of a ceramics or a resin, and then, a wavelength converting member is disposed. But disposing the light emitting device according to the present invention to various packages enables selecting of the color prior to mounting to such packages, so that yield after mounting increases.

<<Method of Manufacturing Light Emitting Device>>

A method of manufacturing a light emitting device according to the present invention will be described below. FIGS. 21 through 24 are schematic cross-sectional views showing steps of manufacturing a light emitting device according to the present embodiment. A method of manufacturing a light emitting device according to the present embodiment mainly includes a step (first step) of bonding electrodes 104c of a plurality of light emitting elements 104A on a support substrate 101 and a step (second step) of disposing a reflective member 114 on the support substrate 101 to a height so that at least peripheral portions of the electrodes 104c of the light emitting elements 104A are covered, by using an electrolytic plating technique, an electrodeposition coating technique, or an electrostatic coating technique. Further, the present embodiment includes a step (third step) of forming a light trannsmissive member 108 on the reflective member 114 to cover an upper surface and side surfaces of the light emitting elements 104A, and a step (fourth step) of removing the support substrate 101 and dividing the reflective member 114 and the light transmissive member 108 to individually separating the light emitting elements 104A.

<First Step>

First, the support substrate 101 is prepared. The support substrate 101 is a plate-shaped or a sheet-shaped member and serves to hold the light emitting device in the steps of manufacturing light emitting device according to the present embodiment. The support substrate 101 is removed prior to individually dividing the light emitting devices, so that it is not included in the light emitting device.

The support substrate 101 is preferably a substrate which has electrical conductivity. For the support substrate 101, a single layer or stacked layers of metal or alloy can be used. The support substrate 101 may be formed with a stacked layer of resin and metal. Examples of the metal used for the support substrate 101 include SUS and Cu.

On the support substrate 101, a photosensitive resist is attached as a protective film. Over that, a photomask having a predetermined pattern is directly or indirectly arranged, and ultraviolet light is used to expose. Then, photo processing is performed to form a resist having a plurality of openings which are spaced apart from each other. In a case where the protective film (resist) is formed by using photolithography, the protective film (resist) may either be of positive type or negative type.

Then in the openings of the resist, a electrically conductive members 102 are selectively disposed. The electrically conductive members 102 are preferably formed with a thickness of 0.1 to 500 μm. The electrically conductive members 102 are preferably formed by using an electrolytic technique. The materials, stacked structure, conditions or the like of plating can be appropriately adjusted by using a known technique in the art. After the electrically conductive members 102 are formed, the resist, which is a protective film, is removed. Thus, the electrically conductive members 102 which are spaced apart from each other are formed.

Next, on the respective electrically conductive members 102, the light emitting elements 104A are respectively bonded by using a die-bonding member 111. Examples of the die-bonding member include a solder material such as Au—Sn, a metal bump such as Au. The die-bonding member 111 may be formed interposing between the electrically conductive members 102 and the corresponding light emitting element 104A. For this, the die-bonding member 111 may be disposed: (A) on the electrically conductive member 102 side; (B) on the electrode 104c side of the light emitting element 104A; or (C) on the both the electrically conductive members 102 and the electrode 104c of the light emitting element 104A.

The bonding member 111 in a form of paste or a sold (a sheet, a brick, or powder) can be used, and which can be appropriately selected according to the composition of the die-bonding member 111, the shape of the electrically conductive members 102, or the like.

Here, a bonding method will be described in the case of the portion where the die-bonding member 111 is to be formed is at the electrically conductive member 102 side as in the above-described (A) and a paste solder material is used as the die-bonding member 111. First, on the electrically conductive members 102, a paste solder material 111 is disposed. The technique of disposing the solder material 111 may be appropriately selected from dispensing, printing, plating, electrocoating, electrostatic coating, etc. Then, the electrodes 104c of the light emitting element 104A are adhered to the portions where the solder material 111 is disposed. Thereafter, the temperature is raised to where the solder material 111 melts and maintained for a given length of time, then lowered to the room temperature. Then, flux or the like, remaining around the solder material 111 is removed by washing.

<Second Step>

Figure 22A:
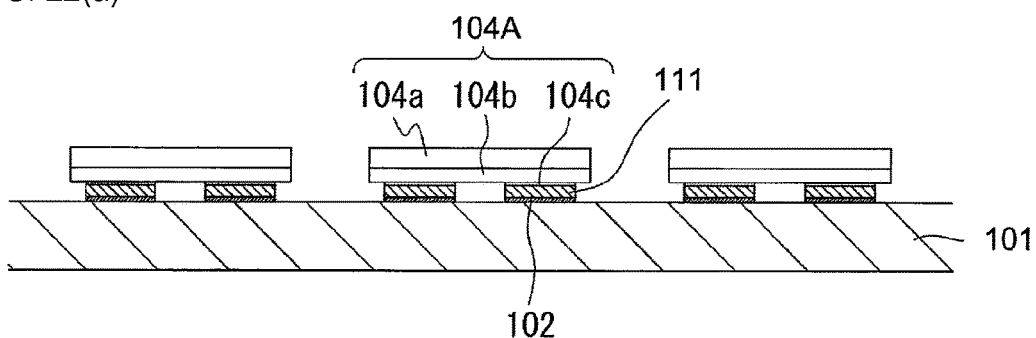
FIGS. 22(a) and 22(b) are diagrams illustrating a manufacturing step of a light emitting device according to the fifth embodiment of the present invention.
Figure 22B:
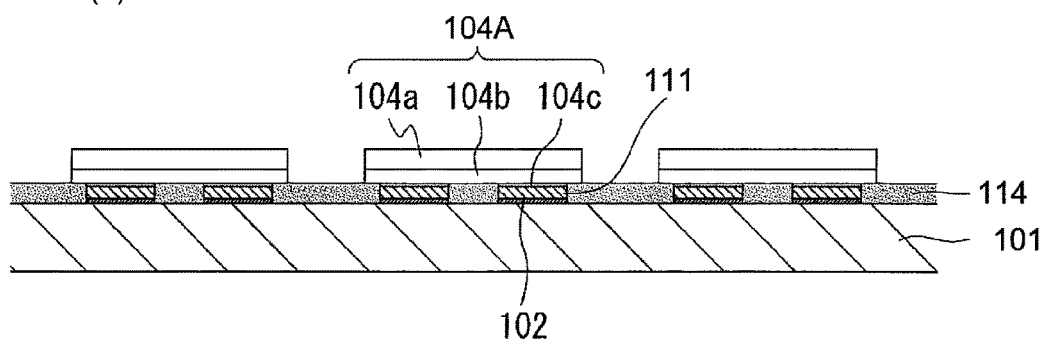

Next, an insulating reflective member 114 is disposed to cover the electrically conductive members 102 exposed in the first step and the conductive portion of the die-bonding member 111 etc. FIG. 22(b) shows a completed state of the second step.

By covering the exposed portions of the electrically conductive members 102 and the conductive portion of the die-bonding member 111 etc. with the reflective member 114, optical loss caused by entering light to those portions can be reduced. Therefore, in the second step, the reflective member 114 is preferably formed to cover the region of at least 40% of the area of the whole area of the electrically conductive members exposed. Further, among the exposed regions of the conductive portions in this stage, approximately the entire area is preferably covered with the reflective member 114. Here, the term "exposed region" refers to a region which is visible from outside except for a region on the surface of the light emitting element 104A where insulating protective film is applied. The reflective member 114 is preferably formed on the support substrate 101 to a height that covers the periphery of the electrodes 104c of the light emitting element 104A. In the present embodiment, the reflective member 114 is formed to a height that covers the side surfaces of the semiconductor layer 104b of the light emitting element 104A.

For the technique of forming the filler 114, an electrolytic plating technique, an electrostatic coating technique, or an electrodeposition coating technique can be used. Using those techniques, for example, the reflective member 114 can be deposited efficiently and selectively with respect to the conductive portions such as the electrically conductive members 102 and the die-bonding members 102. In addition, in order to hold the reflective member 114, a binder such as a resin or an inorganic material may be added or impregnated to the reflective member 114 which is disposed. Also, the light transmissive member 108, which is used in the third step to be described later, may be impregnated in the reflective member 114.

<Third Step>

Figure 23A:
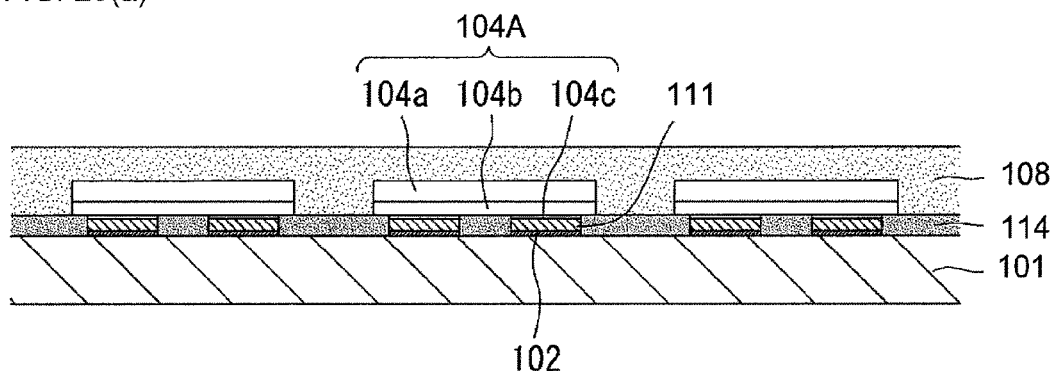
FIGS. 23(a) and 23(b) are diagrams illustrating a manufacturing step of a light emitting device according to the fifth embodiment of the present invention.

Next, the light transmissive member 108 for covering the light emitting element 104A is formed and cured. FIG. 23(a) is a diagram illustrating the light transmissive member 108 is formed on the reflective member 114 and covers the light emitting element 104A. The light transmissive member 108 is preferably formed to a height that covers the upper surface and the side surfaces of the light emitting element 104A exposed from the reflective member 114. For the technique of forming the light transmissive member 108, potting, printing, compression molding, transfer molding, thermal spraying, electrocoating, casting, spin-coating, etc., can be used. The light transmissive member 108 formed in this way can be cured by heating or optical irradiation. The light transmissive member 108 can be made of a single member, or made with two or more of a plurality of layers.

In the case where the light transmissive member 108 is cured by heating, the time of raising or lowering the temperature, and atmosphere etc. can be appropriately selected. In the case where the light transmissive member 108 is cured by optical irradiation, the irradiation time and the wavelength of the irradiating light can be appropriately selected according to the materials to be used. The light transmissive member 108 may be cured by using the both heating and optical irradiation.

Also, a coloring agent, a light diffusing agent, filler, a wavelength converting member (fluorescent member), or the like, may be contained in the light transmissive member 108. The thickness of the light transmissive member 108 may be adjusted by polishing etc., or a lens shape inclusive of a microlens array or formation of irregular surface etc., an optical function of controlling the optical alignment can be provided to the light transmissive member 108.

<Fourth Step>

Figure 23B:
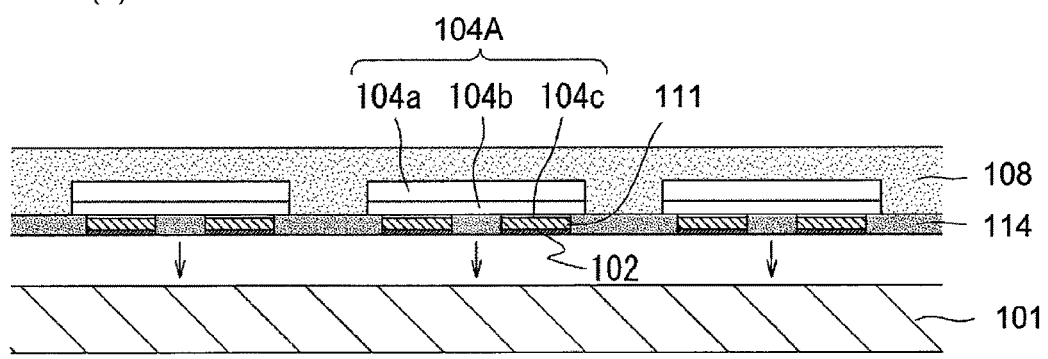

After the third step, the support substrate 101 is removed. With this, the bottom surface of the electrically conductive members 102 are exposed. FIG. 23(b) is a diagram illustrating a state in which the support substrate 101 is removed. For the technique of removing the support substrate 101, physical removing or selective removing of the support substrate 101 with a use of etching etc., can be used.

Figure 24A:
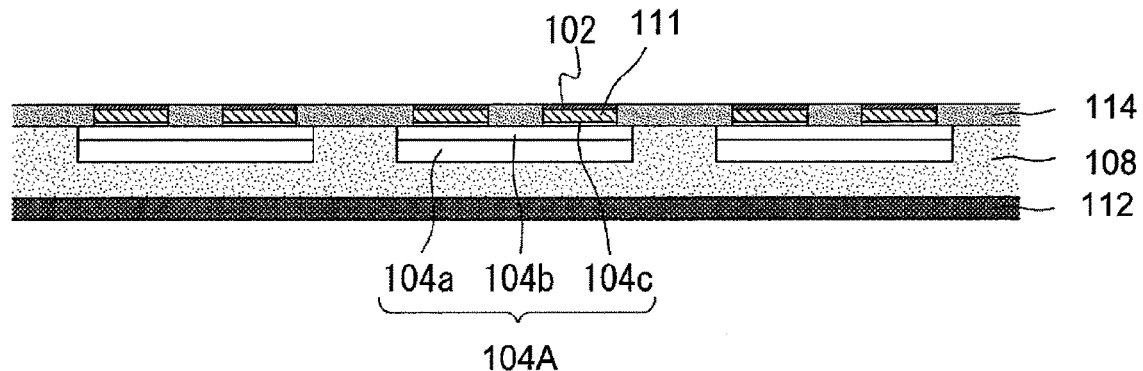
FIGS. 24(a) and 24(b) are diagrams illustrating a manufacturing step of a light emitting device according to the fifth embodiment of the present invention.
Figure 24B:
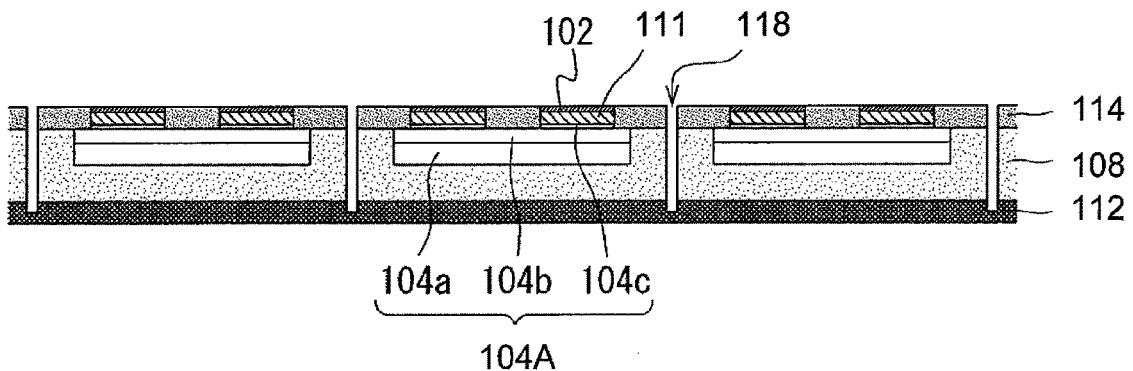

The dicing sheet 112 is attached to the obtained aggregate of the light emitting devices (FIG. 24(a)). Thereafter, at the dividing portions 118 as shown in 24(b), that is, performing cutting at a positions capable of dividing the reflective member 114 and the light transmissive member 108 between the light emitting elements 104A, to obtain individual light emitting elements 104A, thus to obtain the light emitting devices 100A as shown in FIG. 20. Various known methods can be employed for separating the individual devices, such as a dicing method using a blade and a dicing method using a laser beam. FIG. 24(b) illustrates a state where the light emitting elements 104A are individually divided, but according to the purpose, but dividing to obtain an array or an aggregate of a group of two or four light emitting elements 104A may be performed.

Hereinafter, each constructional member of the light emitting device will be described in detail. Also, descriptions of like portions as in the first to fourth embodiments will be appropriately omitted.

(Light Emitting Element)

The light emitting elements used in the present embodiment are preferably made by stacking semiconductor materials on a transparent substrate and divided into individual chips. For the materials of the substrate for stacking nitride semiconductors, for example, an insulating substrate such as sapphire or spinel, or an electrically conductive substrate such as GaN, SiC, Si, ZnO or the like can be preferably used.

For the material suitable for the positive electrode and negative electrode, any material having electric conductivity may be suitably used, for example, one of the metals among Au, Pt, Pd, Rh, Ni, W, Mo, Cr, Ti, Ag, and Al, or an alloy of those, or a combination of those, may be used. Particularly, Ag or Al, which has high reflectance is preferably contained. Forming the electrodes using a metal having high reflectance allows the light blocked by the electrodes to be reflected and extracted from the substrate side, so that the light extraction efficiency of the light emitting device can be improved, and thus preferable. Also, an insulating protective film may be formed on substantially the entire surfaces of the light emitting element except for the surfaces of the electrodes which serve as connection regions with the electrically conductive members or the die-bonding members. For the protective film, $SiO_2$, $TiO_2$, $Al_2O_3$, a polyimide can be used.

The emission wavelength of the light emitting element can be variously selected according to the materials and the content ratio of the mixed crystal of the semiconductor layer. In the case where the light emitting device includes a light transmissive member containing a fluorescent material, the semiconductor used for the light emitting layer is preferably a nitride semiconductor ($In_XAl_YGa_{1-X-Y}N$, $0 \cdot X$, $0 \cdot Y$, $X+Y \cdot 1$) capable of emitting light of short wavelength.

A light emitting element capable of emitting ultraviolet light or infrared light can also be employed as well as a light emitting element capable of emitting visible light. Further, a protective element such as a Zener diode or a light receiving element or the like can be mounted with the light emitting element.

(Electrically Conductive Member)

The electrically conductive member is attached to the positive electrode and the negative electrode of the light emitting element and serve as the electrodes of the light emitting element which are electrically connected to the respective external electrodes. On at least one electrically conductive members, the positive electrode of the light emitting element is disposed directly or through the die-bonding member etc. Also, on at least one electrically conductive members, the negative electrode of the light emitting element is disposed directly or through the die-bonding member etc.

In the case where a material easily detached from the support substrate or where the support substrate is removed by using etching, the electrically conductive members are needed to be made of a material having a selectivity to the solution and is disposed at a portion which is in contact with the support substrate. More specifically, a noble metal such as Au, Pt, Rh, Ir, and Pd or an alloy of those is preferable. Moreover, a film of another metal may be formed thereon. More specifically, Ni, Cu, Ag, Cr, W etc. can be used. The electrically conductive members preferably have a thickness of about 0.1 μm to 500 μm.

Each of the electrically conductive members has, for example, an upper surface on which the electrode of the light emitting element is disposed, and a lower surface which forms an outer surface of the light emitting device. The upper surface of the electrically conductive members has a size larger than the area capable of disposing the electrode of the light emitting element. The lower surface of the electrically conductive members is exposed to outside without being covered with the reflective member etc. The side surfaces of the electrically conductive members may be flat, or may have minute irregularity. Also, the side surfaces of the electrically conductive members may have a shape with a slant or curve at the lower surface side. With this arrangement, detachment between the reflective member and the electrically conductive members can be prevented.

(Die-Bonding Member)

A die-bonding member is preferably used for adhering the electrically conductive members with the electrodes of the light emitting element. Using a die-bonding member having electric conductivity enables to electrically connect the electrically conductive members and the light emitting element. Examples of the die-bonding member include a solder material such as Au—Sn, a metal bump such as Au. Particularly, a material having a high melt point such as Au—Sn is preferably used. The thickness of the die-bonding member is preferably about 0.5 μm to 500 μm.

(Reflective Member)

The reflective member has an insulating property, and is disposed to cover mainly the side surfaces of the electrically conductive members. In the case where the electrically conductive members are adhered to the electrodes of the light emitting element through a die-bonding member, the reflective member is preferably disposed to also cover the side surfaces of the die-bonding member. The reflective member serves to reflect the light emitted from the light emitting element or the light whose wavelength is converted by a wavelength converting member. Thus, optical loss due to the light entering the electrically conductive members can be reduced. The reflective member is preferably disposed to cover the surround of the electrodes of the light emitting element. Also at the lower surface of the light emitting device, the reflective member is disposed at a portion which does not have an electrically conductive member disposed thereon. The provision of such reflective member enables to prevent light of the light emitting element from leaking out from the lower surface of the light emitting device, so that the light extraction efficiency in an upper surface direction can be improved. The reflective member preferably has a reflectance of 50% or more with respect to the light in the wavelength range of 430 nm to 490 nm (blue light). The filler having a particle size in the range of 10 nm to 10 μm is preferably used. Further preferably the thickness is in a range of about 100 nm to 5 μm. With this arrangement, good scattering of light can be achieved.

(Light Transmissive Member)

The light transmissive member covers the upper surface and the side surfaces of the light emitting element. The interface between the light transmissive member and the reflective member is placed at the light emitting element side. The thickness from the upper surface of the light emitting element to the upper surface of the light transmissive member is preferably approximately the same as the thickness from the side surfaces of the light emitting element to the side surfaces of the light transmissive member. Thus, good optical distribution can be obtained in the near-field, and uniform emission can be obtained in various directions at the light emitting surface of the light emitting element. Alternatively, the thickness from the side surfaces of the light emitting element to the side surfaces of the light transmissive member may be smaller than the thickness from the upper surface of the light emitting element to the upper surface of the light transmissive member. Thus, good optical distribution can be obtained in the far-field, and uniform emission can be obtained in various directions at the light emitting surface of the light emitting element. The light transmissive member preferably has a thickness of at least 10 μm. Further preferably the thickness is in a range of about 30·m to 300·m.

Sixth Embodiment

Figure 25A:
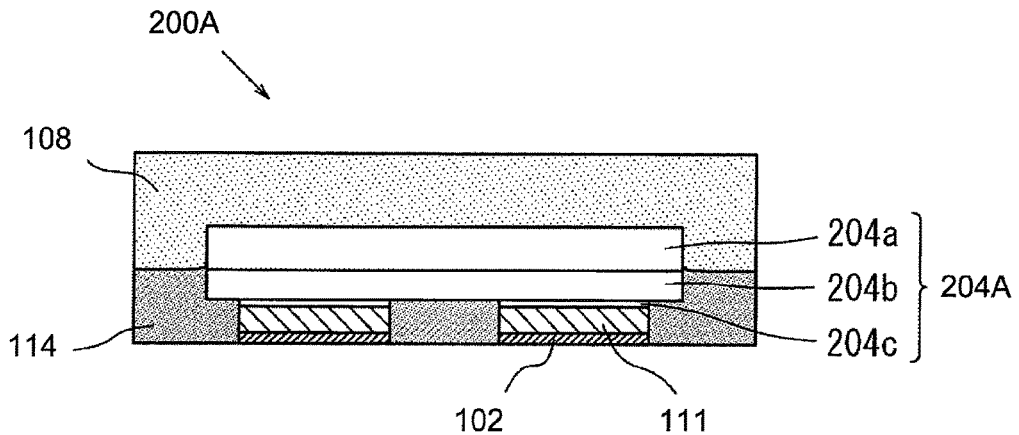
FIGS. 25(a) and 25(b) are schematic cross-sectional views showing a semiconductor device according to a sixth embodiment of the present invention.

FIG. 25(a) is a schematic cross-sectional view showing a light emitting device according to a sixth embodiment of the present invention. Repeated descriptions as in the fifth embodiment may be omitted.

In the present embodiment, the light emitting device 200A includes a light emitting element 204A having electrodes disposed on the semiconductor layer 204b, electrically conductive members 102 respectively directly or through the die-bonding member 111 connected to corresponding electrodes 204c of the light emitting element 204A, a reflective member 114 covering peripheral portions of the electrodes 204c of the light emitting element 204A and the electrically conductive members 102, and a light transmissive member 108 covering an upper surface which is opposite to the surface where the electrodes 204c are disposed, and the side surfaces of the light emitting element 204A. That is, the construction also includes a light emitting element 204A having a semiconductor layer 204b and a transparent substrate 204a, a reflective member 114 applied so that at least a portion of a side surface and the upper surface of the transparent substrate 204a are exposed and a side surface of the semiconductor layer 204A is covered therewith, and the light transmissive member 108 which covers the portions exposed from the reflective member 114.

The reflective member 114 covers at least the sides surfaces of the conductive portions such as the electrically conductive members 102 and die-bonding members 111. In the present embodiment, the reflective member 114 further covers the side surfaces of the electrodes 104c and the side surfaces of the semiconductor layer 204b of the light emitting element 104A. The light transmissive member 108 covers the upper surface and the side surfaces of the transparent substrate 204a of the light emitting element 204A. The interface between the light transmissive member 108 and the reflective member 114 is disposed approximately the same height as or higher than the interface between the semiconductor layer 204b and the transparent substrate 204a. The light propagating in the semiconductor layer 204b is emitted through the transparent substrate 204a exposed from the reflective member 114.

As described above, the light emitting device 200A according to the present embodiment has the side surfaces of the electrically conductive members 102 and the die-bonding members 111 covered with the reflective member 114, so that optical loss due to light from the light emitting element 104A entering the electrically conductive members 102 and die-bonding members 111 can be reduced. The light propagating downwardly from the light emitting element 204A is reflected by the reflective member 114 having high reflectance or the electrode 204c, thus light can be extracted efficiently. Also, in the present embodiment, the reflective member 114 is formed to a height that covers the side surfaces of the semiconductor layer 204b, so that the light propagating downwardly from the light emitting element 204A can be reduced and thus the light extraction efficiency can be enhanced.

In the above, there is described the fifth and the sixth embodiments of the invention, it is to be understood that the present invention is not limited thereto but may be variously embodied to practice within the scope of the present invention. For example, the reflective member may directly cover the side surfaces of the light emitting element, but in the case where an insulating protective film is applied on the side surfaces of the electrodes and the semiconductor layer of the light emitting element, the reflective member may indirectly cover the light emitting element through the protective film.

Figure 25B:
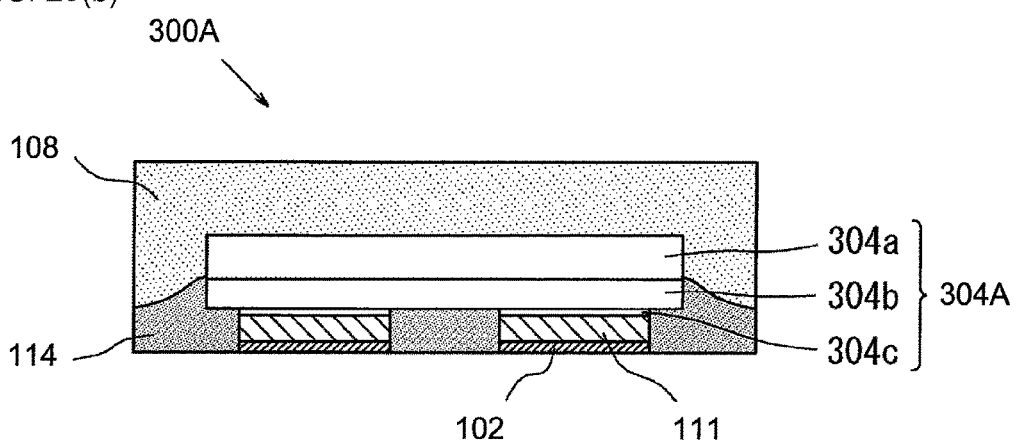

Also, as shown in FIG. 25(b), the upper surface of the reflective member 114 disposed around the light emitting element 304A may be formed as outwardly decreasing slope or curved surface. The light emitting device 300A according to the present variant example has the reflective member 114 covering at least the side surfaces of the electrically conductive members 102 and die-bonding members 111. The reflective member 114 may further cover the side surfaces of the electrodes 304c and semiconductor layer 304b of the light emitting element. The light transmissive member 108 covers the upper surface and side surfaces of the transparent substrate 304a of the light emitting element 304A. The interface between the light transmissive member 108 and the reflective member 114 is formed with a slope or curved surface which decreases with distance from the light emitting element 304A. As in the light emitting device 300A shown in the variant example described above, arranging the upper surface of the reflective member 114 in a sloped or curved shape outwardly from the light emitting device enables to facilitate extraction of light which is reflected at the light transmissive member 108 and the wavelength converting member and then goes toward the reflective member 114 side to outside.

Figure 26:
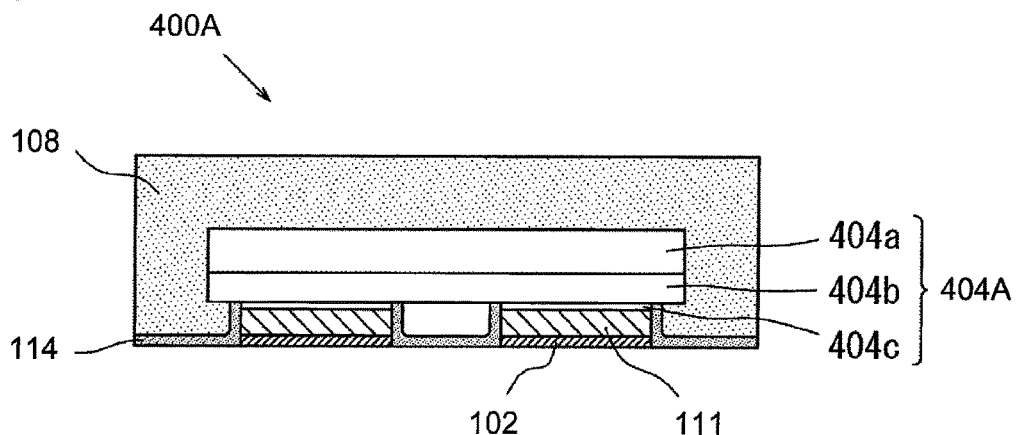
FIG. 26 is a schematic cross-sectional view showing a variant example of the semiconductor device according to fifth and sixth embodiments of the present invention.

Also, in the light emitting element, at the surface side where the electrodes are formed, the surfaces of the semiconductor layer exposed from the electrodes are preferably covered with the reflective member, but as shown in FIG. 26, at least a portion of the surfaces of the semiconductor layer 404b exposed from the electrodes 404c may be exposed from the reflective member 114. In the light emitting device 400A of the variant example, the reflective member 114 is formed as a thin film covering the side surfaces of the conductive portion such as the electrically conductive members 102, die-bonding member 111 and the electrodes 404c. Forming the reflective member 114 as a thin film as described above, light can be prevented from entering the electrically conductive members 102 and the die-bonding member 111 with the small amount of reflective member 114. At the lower surface of the light emitting device 400A, a thin film of the reflective member 114 is preferably disposed on the portion where the electrically conductive members 102 are not arranged. With this, the light from the light emitting element 404A can be prevented from leaking out from the lower surface side of the light emitting device 400A, so that the light extraction efficiency in an upper surface direction can be improved.

Further, in the specification, the members shown in claims attached hereto are not specifically limited to members in the embodiments. Unless otherwise indicated, the sizes, materials, shapes and the arrangement relationships of the members described in the embodiments are given as an example and not as a limitation to the scope of the invention. The sizes and the arrangement relationships of the members in each of drawings are occasionally shown exaggerated for ease of explanation.

Figure 27A:
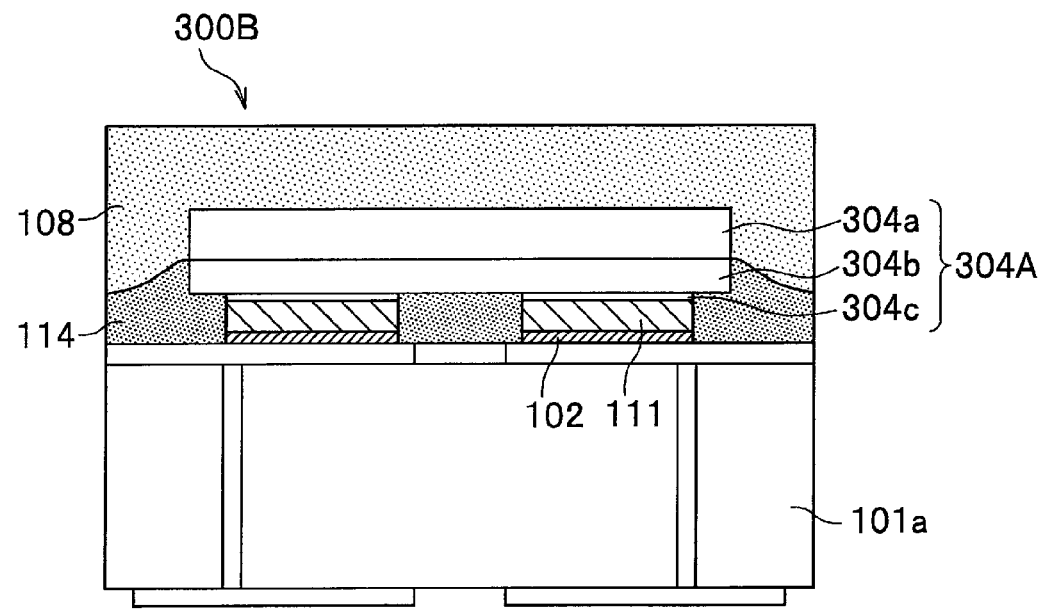
FIGS. 27(a) and 27(b) are schematic cross-sectional views each showing another variant example of the semiconductor device according to the present invention.
Figure 27B:
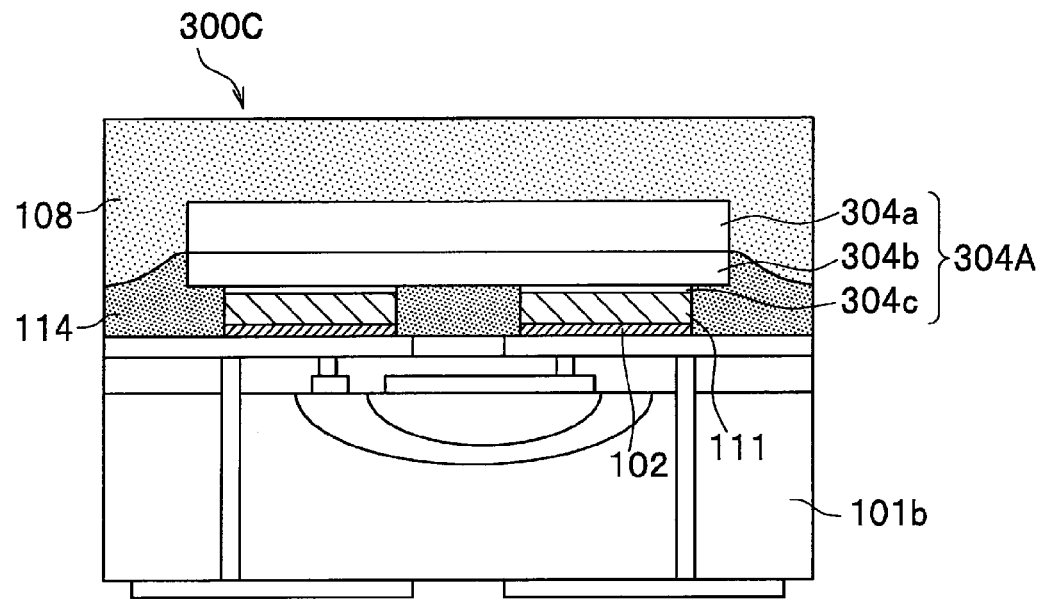
Figure 28A:
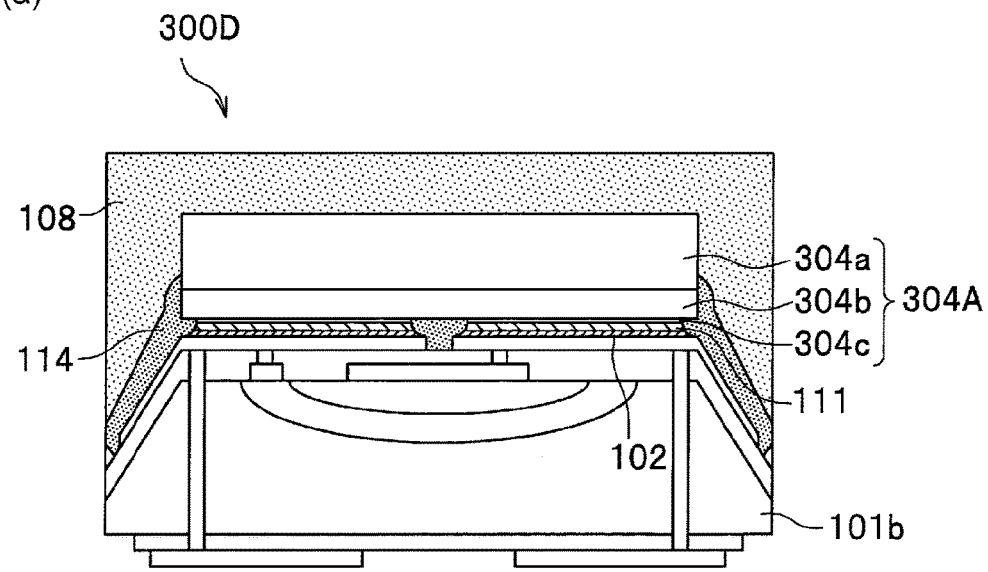
FIGS. 28(a) and 28(b) are schematic cross-sectional views each showing another variant example of the semiconductor device according to the present invention.
Figure 28B:
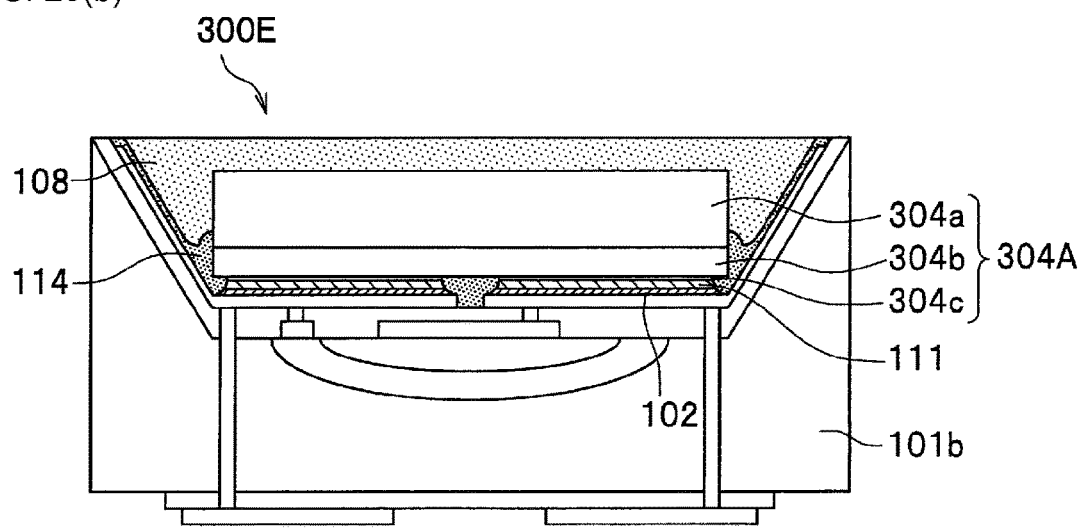

As described above, the present invention includes an embodiment in which a base member is employed, and an embodiment in which no base member is employed. Moreover, for example, in the light emitting device of the fifth and the sixth embodiments in which the base member is removed, the base member may be divided rather than removed. For example, as shown in FIGS. 27(a). 27(b), the light emitting device 300B or 300C may be formed with the substrate 101a which is the base member or the Si substrate 101b which serves as a protective element may be employed in addition to the construction of the light emitting device 300A (see FIG. 25(b)). Examples of the material used for the base member (substrate 101a, Si substrate 101b) include, other than a glass epoxy substrate, a paper phenol, a liquid crystal polymer, a polyimide resin, a BT resin, a Teflon (registered trademark), silicone, alumina, aluminum nitride, silicone nitride, and a LTCC. In addition, as of Si, the base member may have an active element or a passive element function. Further, as shown in FIGS. 28(a), 28(b), a Si substrate 101b is employed as the base member which is made into a tapered substrate by using anisotropic etching of Si. With the substrate having a trapezoidal shape as shown in FIG. 28(a), the luminous intensity distribution angle of the light emitted from the light emitting device 300D can be widened. Also, employing a reflector-shape as shown in FIG. 28(b) narrows the luminous intensity distribution angle of the light emitted from the light emitting device 300E, and thus the frontal luminosity can be enhanced, and the amount of light taken into a secondary optical system can be increased.

Figure 32A:
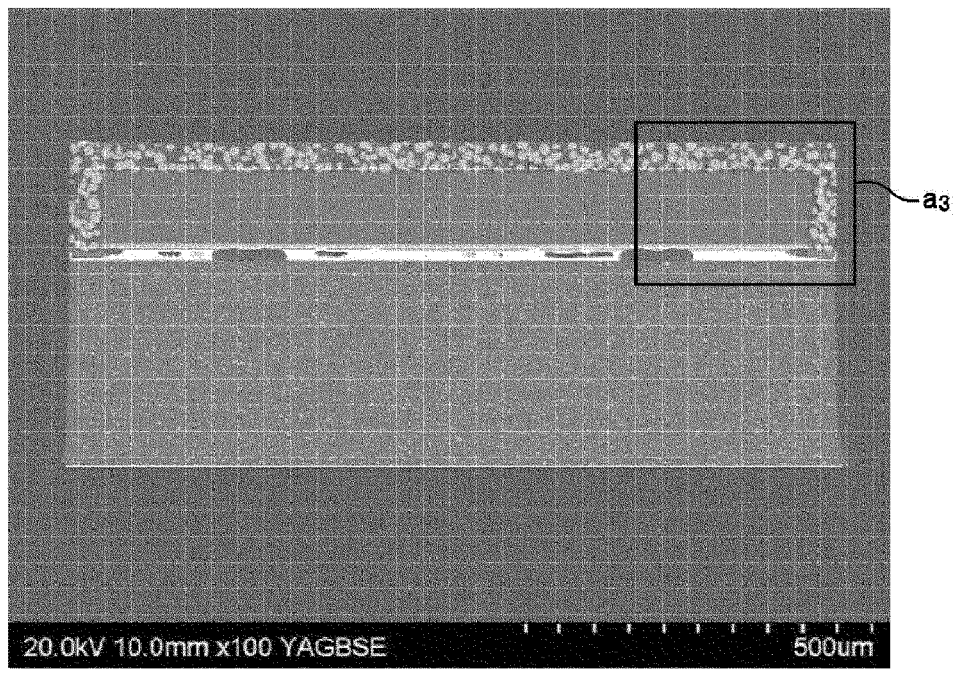
FIGS. 32(a) and 32(b) are SEM images according to other variant examples.
Figure 32B:
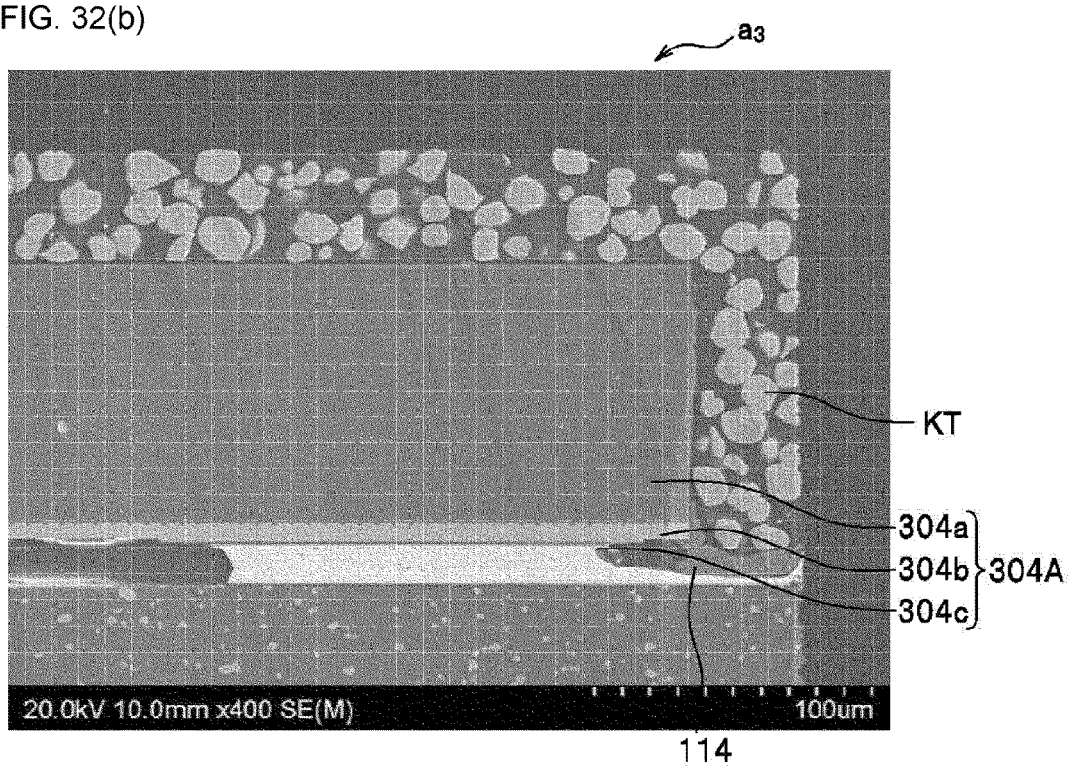

Next, SEM images of the light emitting device 300B are shown in FIG. 32. FIG. 32(b) is a partially-enlarged views of the areas indicated as "a₃" in FIG. 32(a). As shown in FIGS. 32(a), 32(b), at least a portion of the side surfaces and the upper surface of the transparent substrate 304a are exposed, and the side surfaces of the semiconductor layer 304b are covered with the reflective member (filler) 114. Here, the images shown above illustrate the states in which the reflective member 114 is not in contact with the electrode 304c and the reflective member 114 is formed around the electrodes 304c, but a state in which the reflective member 114 is in contact with the electrode 304c may also employed. In the image, "KT" indicates a fluorescent material.

INDUSTRIAL APPLICABILITY

The light emitting device according to the present invention is capable of efficiently reflecting light from the light emitting element without a use of a reflective material which may be subjected to corrosion and thus has excellent light extraction efficiency. Also, even in the case where a corrosive reflective material such as silver is employed, deterioration of the reflective material can be prevented, so that excellent light extraction efficiency can be obtained. The light emitting devices according to the present invention can be utilized in applications such as various indicators, lighting apparatus, displays, backlight light sources for liquid crystal displays, and further, image reading systems in facsimiles, copiers, scanners or the like, and projector devices.

DENOTATION OF REFERENCE NUMERALS 10, 20, 104a, 204a, 304a, 404a . . . transparent substrate
11, 21, 104b, 204b, 304b, 404b . . . semiconductor layer
13, 23 . . . protective film
14 . . . p-type electrode
16 . . . n-type electrode
22a . . . reflective layer
22b . . . barrier layer
22c . . . bonding layer
24 . . . electrode
25a, 25b . . . pad electrode
100, 200, 100A, 200A, 300A, 400A . . . light emitting device
101, 201 . . . base member (support substrate)
101a . . . substrate (base member)
101b . . . Si substrate (base member)
102, 102a, 102b, 202a, 202b, 202c, 202d, 302, 402 . . . electrically conductive member
103 . . . metal member
104, 104A, 204A, 304A, 404A . . . light emitting element
104c, 204c, 304c, 404c . . . electrode
105 . . . protective element
106, 206 . . . wire (conductive wire)
108 . . . light transmissive member
118 . . . separation part
109, 209, 209a, 209b, 209c . . . recess
110 . . . bonding member for protective element
111, 203, 303, 403 . . . bonding member (die-bonding member (solder material))
112 . . . dicing sheet
114 . . . reflective member (filler)
120, 220, 220a, 220b, 220c . . . bottom surface of recess
123 . . . joining layer
130, 230, 230a, 230b, 230c . . . side surface of recess
140, 240 . . . back surface of base member
207 . . . light blocking member
G . . . groove
KT . . . fluorescent material

The invention claimed is:

1. A light emitting device comprising:
a light emitting element comprising a semiconductor layer, a transparent substrate disposed on a top surface of the semiconductor layer, and a plurality of electrodes disposed on a bottom surface of the semiconductor layer;
a reflective member comprising an insulating filler;
a light transmissive member covering at least a top surface of the transparent substrate;
a plurality of electrically conductive members connected to respective bottom surfaces of the electrodes,
wherein the reflective member covers at least side surfaces of the electrically conductive members,
wherein bottom surfaces of the electrically conductive members are exposed from a bottom surface of the reflective member,
wherein a bottommost surface of the light emitting device comprises the bottom surfaces of the electrically conductive members and the bottom surface of the reflective member,
wherein an outermost side of the reflective member and an outermost side of the light transmissive member are located in a same vertical plane, and
wherein a portion of the light transmissive member covers at least a part of side surfaces of the transparent substrate.

2. The light emitting device according to claim 1,
wherein each of the electrically conductive members is directly connected to the bottom surface of a respective one of the electrodes.

3. The light emitting device according to claim 1,
wherein each of the electrically conductive members is connected to the bottom surface of a respective one of the electrodes via a respective die bonding member.

4. The light emitting device according to claim 3, wherein the reflective member covers side surfaces of the die bonding members.

5. The light emitting device according to claim 1, wherein the reflective member further covers side surfaces of the semiconductor layer and side surfaces of the electrodes.

6. The light emitting device according to claim 5, wherein an interface between the light transmissive member and the reflective member is located at approximately the same height or higher than an interface between the semiconductor layer and the transparent substrate.

7. The light emitting device according to claim 5,
wherein an insulating protective film is disposed on at least side surfaces of the semiconductor layer and side surfaces of the electrodes, and
wherein the reflective member covers the side surfaces of the semiconductor layer and the side surfaces of the electrodes via the insulating protective film.

8. The light emitting device according to claim 5, wherein the reflective member has a sloped surface that slopes downward and outward from the light emitting element.

9. The light emitting device according to claim 1, wherein the reflective member covers an entirety of a bottom surface of the semiconductor layer that is exposed from the electrodes.

10. The light emitting device according to claim 1, wherein the reflective member covers part of a bottom surface of the semiconductor layer that is exposed from the electrodes, and the light transmissive member covers another part of a bottom surface of the semiconductor layer that is exposed from the electrodes.

11. The light emitting device according to claim 1, wherein the reflective member is formed as a film having a portion that extends laterally along a bottom surface of the light transmissive member, and a portion that extends upward from the laterally extending portion along side surfaces of the electrically conductive members and the electrodes.

12. The light emitting device according to claim 1,
wherein each of the electrically conductive members is connected to the bottom surface of a respective one of the electrodes via a respective die bonding member, and
wherein the reflective member is formed as a film having a portion that extends laterally along a bottom surface of the light transmissive member, and a portion that extends upward from the laterally extending portion along side surfaces of the electrically conductive members, the die bonding members, and the electrodes.

13. The light emitting device according to claim 1, wherein the reflective member has a thickness of 5 μm or greater.

14. The light emitting device according to claim 1, wherein a reflectance of the reflective member is 50% or greater to light of an emission wavelength.

15. The light emitting device according to claim 1, wherein the insulating filler comprises a material selected from the group consisting of $SiO_2$, $Al_2O_3$ $Al(OH)_3$, $MgCO_3$, $TiO_2$, $ZrO_2$, $ZnO_2$, $Nb_2O_5$, $MgO$, $Mg(OH)_2$, $SrO$, $In_2O_3$, $TaO_2$, $HfO$, $SeO$, $YnO_3$, $SiN$, $AlN$, $AlON$, and $MgF_2$, and mixtures thereof.

16. The light emitting device according to claim 1, wherein the light transmissive member comprises a material selected from the group consisting of a silicone resin, an epoxy resin, and a urea resin.

* * * * *